US008262916B1

(12) United States Patent
Smalley et al.

(10) Patent No.: US 8,262,916 B1
(45) Date of Patent: Sep. 11, 2012

(54) ENHANCED METHODS FOR AT LEAST PARTIAL IN SITU RELEASE OF SACRIFICIAL MATERIAL FROM CAVITIES OR CHANNELS AND/OR SEALING OF ETCHING HOLES DURING FABRICATION OF MULTI-LAYER MICROSCALE OR MILLIMETER-SCALE COMPLEX THREE-DIMENSIONAL STRUCTURES

(75) Inventors: Dennis R. Smalley, Newhall, CA (US); Michael S. Lockard, Lake Elizabeth, CA (US); Adam L. Cohen, Valley Village, CA (US)

(73) Assignee: Microfabrica Inc., Van Nuys, CA (US)

( * ) Notice: Subject to any disclaimer, the term of this patent is extended or adjusted under 35 U.S.C. 154(b) by 253 days.

(21) Appl. No.: 12/828,274

(22) Filed: Jun. 30, 2010

Related U.S. Application Data

(60) Provisional application No. 61/222,077, filed on Jun. 30, 2009.

(51) Int. Cl.
*C23F 1/22* (2006.01)
(52) U.S. Cl. .............................. 216/2; 216/36
(58) Field of Classification Search ............. 216/2, 36
See application file for complete search history.

(56) References Cited

U.S. PATENT DOCUMENTS

| | | | |
|---|---|---|---|
| 4,058,432 A | 11/1977 | Schuster-Woldan et al. |
| 5,011,580 A | 4/1991 | Pan et al. |
| 5,190,637 A | 3/1993 | Guckel |
| 5,685,491 A | 11/1997 | Marks et al. |
| 6,027,630 A | 2/2000 | Cohen |
| 6,475,369 B1 | 11/2002 | Cohen |
| 6,572,742 B1 | 6/2003 | Cohen |
| 6,790,377 B1 | 9/2004 | Cohen |
| 7,029,829 B2 | 4/2006 | Stark et al. |
| 7,109,118 B2 | 9/2006 | Cohen et al. |
| 7,160,429 B2 | 1/2007 | Cohen et al. |
| 7,195,989 B2 | 3/2007 | Lockard et al. |

(Continued)

OTHER PUBLICATIONS

Cohen, et al., "EFAB: Batch Production of Functional, Fully-Dense Metal Parts with Micron-Scale Features", Proc. 9$^{th}$ Solid Freeform Fabrication, The University of Texas at Austin, Aug. 1998, pp. 161.

(Continued)

*Primary Examiner* — Roberts Culbert
(74) *Attorney, Agent, or Firm* — Dennis R. Smalley

(57) ABSTRACT

Embodiments of the invention are directed to multi-layer, multi-material fabrication methods (e.g. electrochemical fabrication methods) which provide improved versatility in producing complex microdevices and in particular in removing sacrificial material from passages, channels, or cavities that are complex or that include etching access ports in their final configurations that are small relative to passage, channel, or cavity lengths. Embodiments of the present invention provide for removal of sacrificial material from these passages, channels or cavities using one or more initial or preliminary removal steps that occur prior to completion of the such passages that results from the completion of the layer forming steps. In some embodiments, first sacrificial material is replaced after a secondary solid sacrificial material after the initial removal step or steps. In other embodiments, the first sacrificial material is replaced after a liquid material after the initial removal step or steps. In some embodiments, desired structure formation may occur along or separately from one or more etchant directing manifolds that can force etchant into the passages, channels, and cavities.

22 Claims, 26 Drawing Sheets

U.S. PATENT DOCUMENTS

| | | | |
|---|---|---|---|
| 7,198,704 | B2 | 4/2007 | Cohen et al. |
| 7,229,542 | B2 | 6/2007 | Bang |
| 7,235,166 | B2 | 6/2007 | Cohen et al. |
| 7,239,219 | B2 | 7/2007 | Brown et al. |
| 7,250,101 | B2 * | 7/2007 | Thompson et al. ............ 205/67 |
| 7,252,861 | B2 | 8/2007 | Smalley |
| 7,259,640 | B2 | 8/2007 | Brown et al. |
| 7,288,178 | B2 | 10/2007 | Cohen et al. |
| 7,291,254 | B2 | 11/2007 | Cohen et al. |
| 7,351,321 | B2 | 4/2008 | Cohen |
| 7,368,044 | B2 | 5/2008 | Cohen et al. |
| 7,498,714 | B2 | 3/2009 | Lockard et al. |
| 7,501,328 | B2 | 3/2009 | Lockard et al. |
| 7,527,721 | B2 * | 5/2009 | Lembrikov et al. .......... 205/170 |
| 7,611,616 | B2 | 11/2009 | Cohen et al. |
| 7,686,770 | B2 | 3/2010 | Cohen |
| 7,696,102 | B2 * | 4/2010 | Zhang ......................... 438/738 |
| 2001/0014409 | A1 | 8/2001 | Cohen |
| 2003/0221968 | A1 | 12/2003 | Cohen et al. |
| 2004/0000489 | A1 | 1/2004 | Zhang et al. |
| 2004/0004001 | A1 | 1/2004 | Cohen et al. |
| 2004/0065550 | A1 | 4/2004 | Zhang |
| 2004/0065552 | A1 | 4/2004 | Cohen |
| 2004/0065553 | A1 | 4/2004 | Cohen |
| 2004/0065555 | A1 | 4/2004 | Zhang |
| 2004/0134772 | A1 | 7/2004 | Cohen et al. |
| 2004/0146650 | A1 | 7/2004 | Lockard et al. |
| 2005/0029109 | A1 | 2/2005 | Zhang et al. |
| 2005/0067292 | A1 | 3/2005 | Thompson et al. |
| 2005/0072681 | A1 | 4/2005 | Cohen et al. |
| 2005/0230261 | A1 | 10/2005 | Cohen et al. |
| 2006/0282065 | A1 | 12/2006 | Cohen |
| 2007/0158200 | A1 | 7/2007 | Cohen et al. |
| 2007/0198038 | A1 | 8/2007 | Cohen et al. |
| 2007/0219459 | A1 | 9/2007 | Cohen |
| 2007/0265648 | A1 | 11/2007 | Cohen |
| 2008/0050524 | A1 | 2/2008 | Kumar et al. |

OTHER PUBLICATIONS

Adam L. Cohen, et al., "EFAB: Rapid, Low-Cost Desktop Micromachining of High Aspect Ratio True 3-D MEMS", Proc. 12$^{th}$ IEEE Micro Electro Mechanical Systems Workshop, IEEE, Jan. 17-21, 1999, pp. 244-251.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2$^{nd}$ International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3$^{rd}$ International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

"Microfabrication—Rapid Prototyping's Killer Application", Rapid Prototyping Report, CAD/CAM Publishing, Inc., Jun. 1999, pp. 1-5.

Dr. Steve Hill, "An E-FAB Way for Making the Micro World", Materials World is the journal of The Institute of Materials, Sep. 1999, vol. 7, No. 9, pp. 538-539.

* cited by examiner

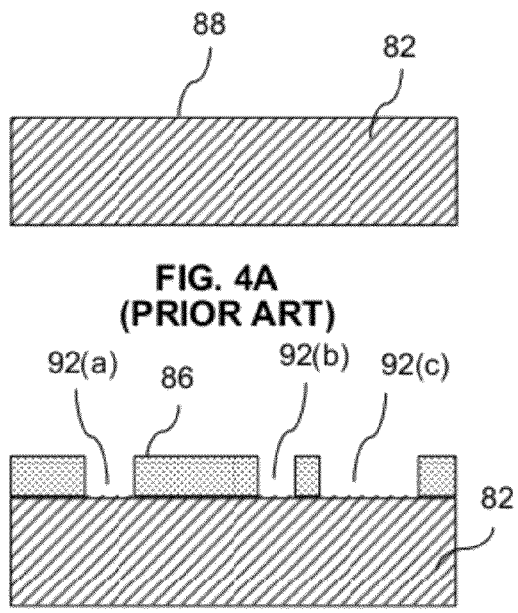
FIG. 4A (PRIOR ART)
FIG. 4C (PRIOR ART)
FIG. 4E (PRIOR ART)
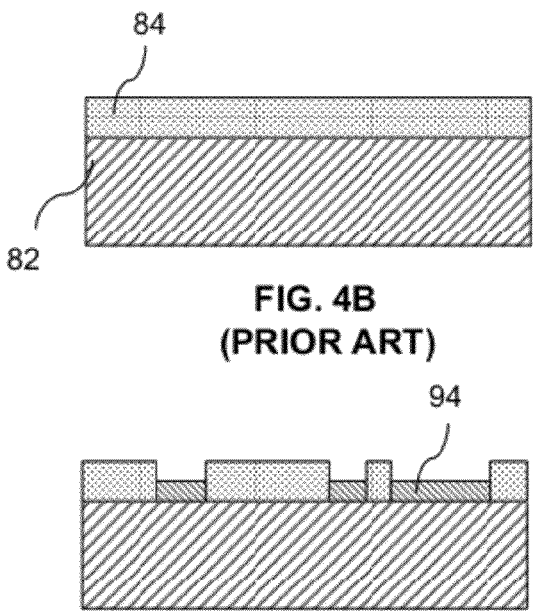
FIG. 4B (PRIOR ART)
FIG. 4D (PRIOR ART)
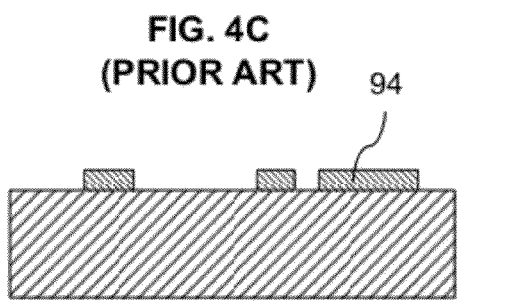
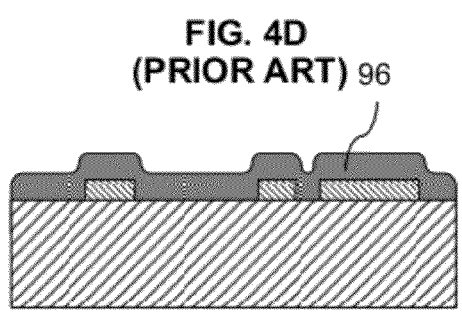
FIG. 4F (PRIOR ART)
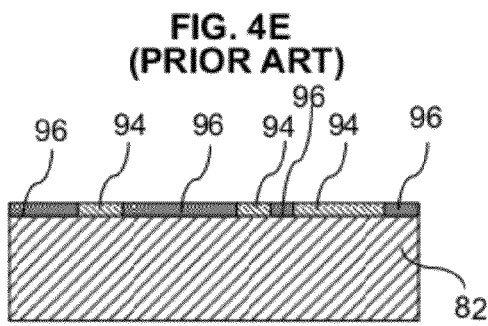
FIG. 4G (PRIOR ART)
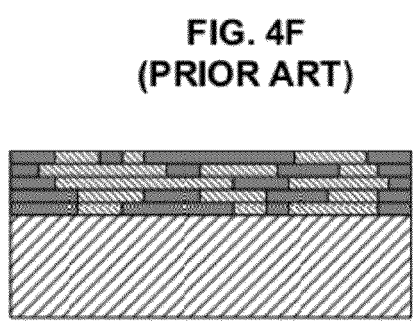
FIG. 4H (PRIOR ART)
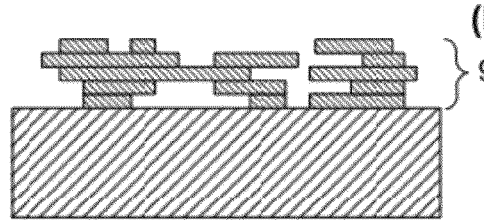
FIG. 4I (PRIOR ART)

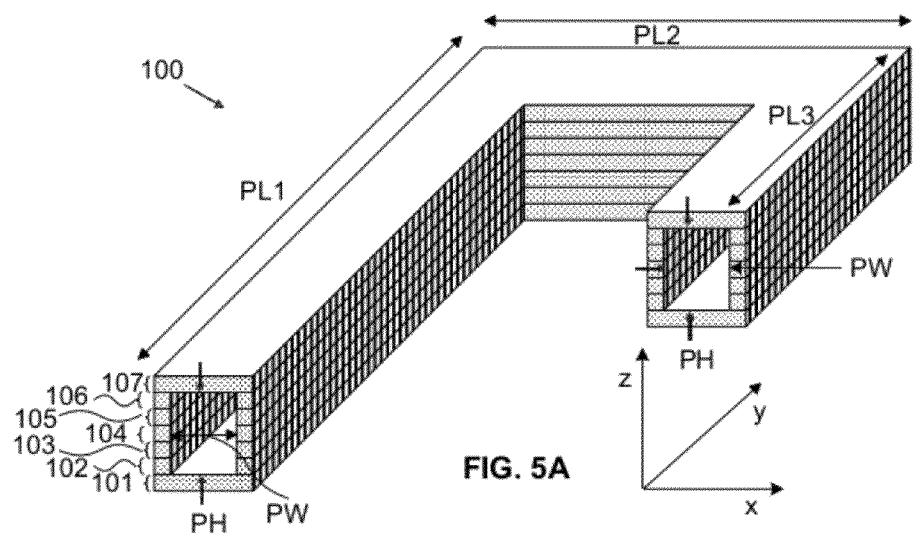
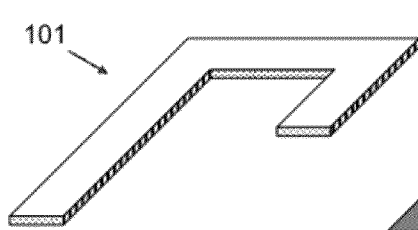
FIG. 6A-1
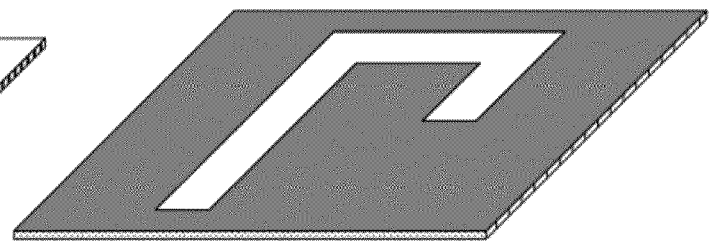
FIG. 6A-2
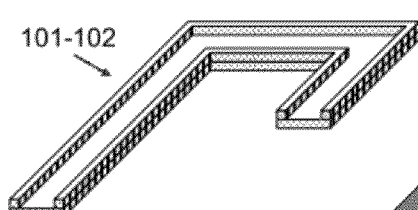
FIG. 6B-1
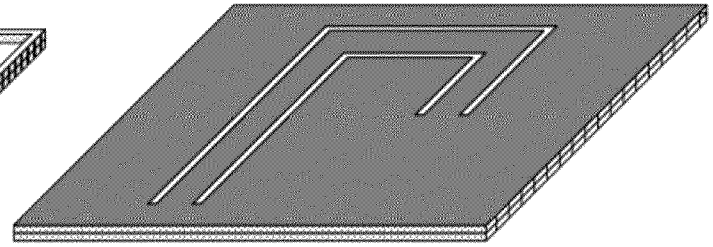
FIG. 6B-2

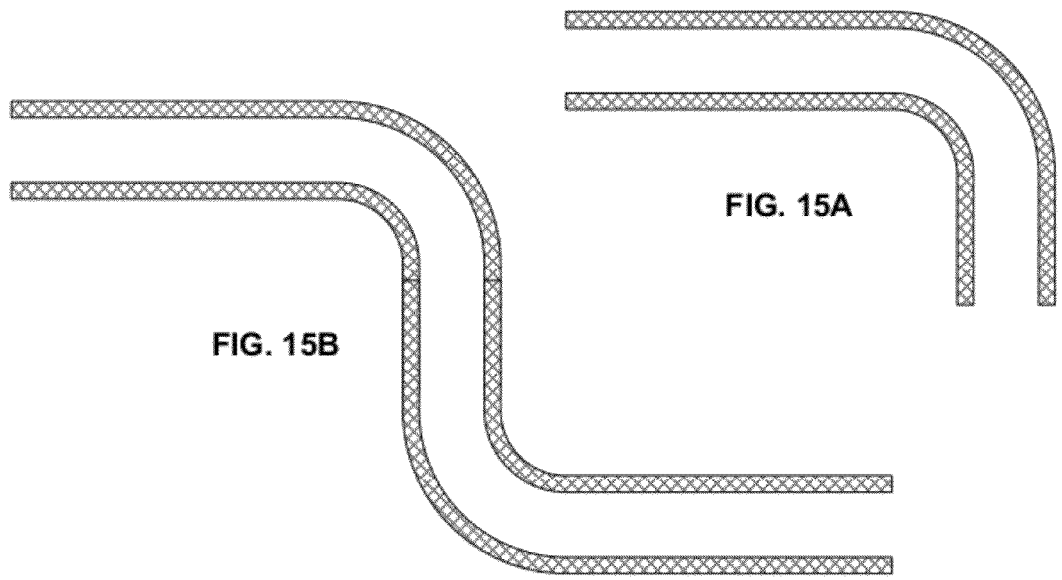
FIG. 15A
FIG. 15B
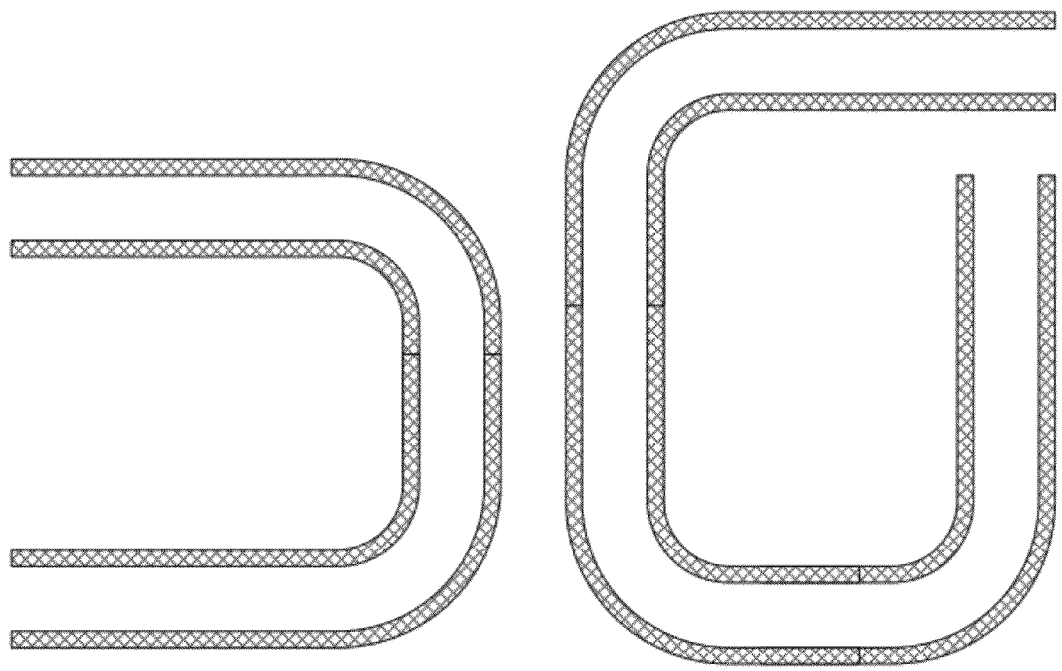
FIG. 15C
FIG. 15D

ENHANCED METHODS FOR AT LEAST PARTIAL IN SITU RELEASE OF SACRIFICIAL MATERIAL FROM CAVITIES OR CHANNELS AND/OR SEALING OF ETCHING HOLES DURING FABRICATION OF MULTI-LAYER MICROSCALE OR MILLIMETER-SCALE COMPLEX THREE-DIMENSIONAL STRUCTURES

RELATED APPLICATIONS

This application claims the benefit of U.S. Provisional Patent Application No. 61/222,077, filed Jun. 30, 2009. This application is incorporated herein by reference as if set forth in full herein.

FIELD OF THE INVENTION

The present invention relates generally to the field of multi-layer, multi-material fabrication of microscale and millimeter scale complex three-dimensional mechanical structures, parts, components, or fully or partially assembled components where each layer is formed from a plurality of deposited materials and more specifically to methods for forming such structures with passages, channels, cavities or the like which have sacrificial material removed from at least portions of such features before they are completely formed and/or which have openings that were used for multi-material etching of sacrificial material sealed by structural material during layer-by-layer fabrication of the structures. In some embodiments, fabrication may involve the electrochemical deposition of materials.

BACKGROUND OF THE INVENTION

Electrochemical Fabrication

An electrochemical fabrication technique for forming three-dimensional structures from a plurality of adhered layers is being commercially pursued by Microfabrica® Inc. (formerly MEMGen Corporation) of Van Nuys, Calif. under the name EFAB®.

Various electrochemical fabrication techniques were described in U.S. Pat. No. 6,027,630, issued on Feb. 22, 2000 to Adam Cohen. Some embodiments of this electrochemical fabrication technique allows the selective deposition of a material using a mask that includes a patterned conformable material on a support structure that is independent of the substrate onto which plating will occur. When desiring to perform an electrodeposition using the mask, the conformable portion of the mask is brought into contact with a substrate, but not adhered or bonded to the substrate, while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single selective deposits of material or may be used in a process to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFABTM)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

An electrochemical deposition for forming multilayer structures may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate. Typically this material is either a structural material or a sacrificial material.

2. Then, blanket depositing at least one additional material by electrodeposition so that the additional deposit covers both the regions that were previously selectively deposited onto, and the regions of the substrate that did not receive any previously applied selective depositions. Typically this material is the other of a structural material or a sacrificial material.

3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to an immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed. The removed material is a sacrificial material while the material that forms part of the desired structure is a structural material.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated (the pattern of conformable material is complementary to the pattern of material to be deposited). At least one CC mask is used for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for multiple CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of (1) the substrate, (2) a previously formed layer, or (3) a previously deposited portion of a layer on which deposition is to occur. The pressing together of the CC mask and relevant substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6, separated from mask 8, onto which material will be deposited during the process of forming a layer. CC mask plating selectively deposits material 22 onto substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C.

The CC mask plating process is distinct from a "through-mask" plating process in that in a through-mask plating process the separation of the masking material from the substrate would occur destructively. Furthermore in a through mask plating process, opening in the masking material are typically formed while the masking material is in contact with and adhered to the substrate. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the substrate on which plating is to occur (e.g. separate from a three-dimensional (3D) structure that is being formed). CC masks may be formed in a variety of ways, for example, using a photolithographic process. All masks can be generated simultaneously, e.g. prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

The '630 patent additionally teaches that the electroplating methods disclosed therein can be used to manufacture elements having complex microstructure and close tolerances between parts. An example is given with the aid of FIGS. 14A-14E of that patent. In the example, elements having parts that fit with close tolerances, e.g., having gaps between about 1-5 um, including electroplating the parts of the device in an unassembled, preferably pre-aligned, state and once fabricated. In such embodiments, the individual parts can be moved into operational relation with each other or they can simply fall together. Once together the separate parts may be retained by clips or the like.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing through mask exposures. A first layer of a primary metal is electroplated onto an exposed plating base to fill a void in a photoresist (the photoresist forming a through mask having a desired pattern of openings), the photoresist is then removed and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist over the first layer and patterning it (i.e. to form a second through mask) and then repeating the process that was used to produce the first layer to produce a second layer of desired configuration. The process is repeated until the entire structure is formed and the secondary metal is removed by etching. The photoresist is formed over the plating base or previous layer by casting and patterning of the photoresist (i.e. voids formed in the photoresist) are formed by exposure of the photoresist through a patterned mask via X-rays or UV radiation and development of the exposed or unexposed areas.

The '637 patent teaches the locating of a plating base onto a substrate in preparation for electroplating materials onto the substrate. The plating base is indicated as typically involving the use of a sputtered film of an adhesive metal, such as chromium or titanium, and then a sputtered film of the metal that is to be plated. It is also taught that the plating base may be applied over an initial layer of sacrificial material (i.e. a layer or coating of a single material) on the substrate so that the structure and substrate may be detached if desired. In such cases after formation of the structure the sacrificial material forming part of each layer of the structure may be removed along the initial sacrificial layer to free the structure. Substrate materials mentioned in the '637 patent include silicon, glass, metals, and silicon with protected semiconductor devices. A specific example of a plating base includes about 150 angstroms of titanium and about 300 angstroms of nickel, both of which are sputtered at a temperature of 160° C. In another example it is indicated that the plating base may consist of 150 angstroms of titanium and 150 angstroms of nickel where both are applied by sputtering.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

In the past various proposals have been made to help remove sacrificial materials from long, narrow, and/or complex passages within structures. Such proposals have included long etching times, use of directed jets of etching solvents, use of ultrasonic vibrations and/or the formation of structures as split entities that are bonded together after layer fabrication and released (see U.S. patent application Ser. No. 11/506,586). In some circumstances, these prior art approaches provide adequate results while in other circumstances they do not.

In the past, in situ (i.e. in the middle of the layer build up process) etching of sacrificial material from portions of multiple layers of multi-material, multi-layer blocks of deposited materials that contained partially formed structures have been proposed but not for the purpose of eventually forming hollow channels, passages or cavities. In some such proposals, voids were formed and refilled with a different structural material (see previously referenced U.S. Pat. No. 6,027,630).

SUMMARY OF THE INVENTION

It is an object of some embodiments of the invention to provide an improved method of forming multi-layer, complex three-dimensional structures having hollow passages, hollow channels, or hollow cavities and particularly where such features are much longer than the width and/or height of any post-layer formation access ports or openings that would allow effective etchant access to sacrificial material entrapped therein or where such features include complex configurations (e.g. a plurality of turns, e.g. 3-4 or more separate turns or turns that have an aggregate path change of 90°-360° or more).

It is an object of some embodiments of the invention to provide an improved method of forming multi-layer, complex three-dimensional structures having hollow passages, hollow channels, or hollow cavities which are at least partially emptied of solid material prior to layer fabrication completion and which remain free of solid material after such removal.

It is an object of some embodiments of the invention to provide for one or more etching openings in structures that have undergone partial formation as a result of completion of only a portion of the layers from which the structure will be formed wherein the one or more etching openings will be sealed with structural material as additional layers are formed and simultaneously adhered to previously formed layers.

It is an object of some embodiments of the invention to provide for the improved sealing of etching openings in complex three-dimensional structures.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not necessarily intended that all objects be addressed by any single aspect of the invention even though that may be the case with regard to some aspects.

A first aspect of the invention provides a method for fabricating a multi-layer three-dimensional structure, including: (a) forming a first layer on a substrate including deposition of at least one sacrificial material and deposition of at least one structural material wherein the deposited sacrificial material and the deposited structural material are planarized to have a common height to set a boundary level for the first layer; (b) forming additional layers adjacent to and adhered to previously formed layers, wherein the formation of each additional layer includes deposition of at least one sacrificial material and deposition of at least one structural material and wherein the sacrificial material and the structural material for each additional layer are planarized to have a common height to set a boundary level for each additional layer; and (c) after formation of the additional layers, etching at least one sacrificial material from a plurality of layers to release the three-dimensional structure from the sacrificial material, the improvement including: (a) forming the structure to include an elongated passage having structural material forming a bottom, sidewalls and an elongated upper access region defined by at least one opening through the structural material, and then (i) selectively removing a sacrificial material from of an interior of multiple layers of the elongated passage to form an at least partially cleared passage, (ii) depositing a secondary sacrificial material in the at least partially cleared passage, (iii) planarizing the secondary sacrificial material, and thereafter (b) during formation of at least one of additional layer depositing a structural material to seal the access region.

A second aspect of the invention provides a method for fabricating a multi-layer three-dimensional structure, including: (a) forming a first layer on a substrate including deposition of at least one sacrificial material and deposition of at least one structural material wherein the deposited sacrificial material and the deposited structural material are planarized to have a common height to set a boundary level for the first layer; (b) forming additional layers adjacent to and adhered to previously formed layers, wherein the formation of each additional layer includes deposition of at least one sacrificial material and deposition of at least one structural material and wherein the sacrificial material and the structural material for each additional layer are planarized to have a common height to set a boundary level for each additional layer; and (c) after formation of the additional layers, etching at least one sacrificial material from a plurality of layers to release the three-dimensional structure from the sacrificial material, the improvement including: during the process of step (b), forming the structure to have an elongated passage having a passage length, a passage height, and a passage width and being at least partially free of solidified material along a portion of the passage height and passage width along a portion of the passage length prior to the etching of step (c).

A third aspect of the invention provides In a method for fabricating a multi-layer three-dimensional structure, including: (a) forming a first layer on a substrate including deposition of at least one sacrificial material and deposition of at least one structural material wherein the deposited sacrificial material and the deposited structural material are planarized to have a common height to set a boundary level for the first layer; (b) forming additional layers adjacent to and adhered to previously formed layers, wherein the formation of each additional layer includes deposition of at least one sacrificial material and deposition of at least one structural material and wherein the sacrificial material and the structural material for each additional layer are planarized to have a common height to set a boundary level for each additional layer; and (c) after formation of the additional layers, etching at least one sacrificial material from a plurality of layers to release the three-dimensional structure from the sacrificial material, the improvement including: partially forming the structure to include an elongated passage defined by structural material forming a bottom, sidewalls and an elongated upper access region defined by at least one opening through the structural material, wherein the at least one opening of the access region is defined by a width which relative to the access region as a whole, relative to a passage height, and relative to the passage width allows the at least one opening after, an etching step, to be closed by localized build up of deposited material without completely filling an at least partially cleared elongated passage with newly deposited solidified material, then (i) selectively removing a sacrificial material from multiple layers from an interior of the elongated passage to form an at least partially cleared passage, (ii) depositing sacrificial material to close the at least one opening of the access region while not completely refilling the at least partially cleared passage with solidified material (iii) planarizing structural material and the sacrificial material closing the at least one opening of the access region; and (iv) during formation of a subsequent layer, depositing a structural material to provide a structural material seal of the at least one closed opening of the access region.

A fourth aspect of the invention provides a method for fabricating a multi-layer three-dimensional structure, including: (a) forming a first layer on a substrate including deposition of at least one sacrificial material and deposition of at least one structural material wherein the deposited sacrificial material and the deposited structural material are planarized to have a common height to set a boundary level for the first layer; (b) forming additional layers adjacent to and adhered to previously formed layers, wherein the formation of each additional layer includes deposition of at least one sacrificial material and deposition of at least one structural material and wherein the sacrificial material and the structural material for each additional layer are planarized to have a common height to set a boundary level for each additional layer; and (c) after formation of the additional layers, etching at least one sacrificial material from a plurality of layers to release the three-dimensional structure from the sacrificial material, the improvement including: partially forming the structure to include an elongated passage defined by structural material forming a bottom, sidewalls and an elongated upper access region defined by at least one opening through the structural material, wherein the at least one opening of the access region is defined by a width which relative to the access region as a whole, relative to a passage height, and relative to a passage width allows the at least one opening, after an etching step, to be closed by localized build up of deposited material without completely filling an at least partially cleared elongated passage, and then selectively removing a sacrificial material from multiple layers from an interior of the elongated passage to form an at least partially cleared passage; (i) depositing structural material to close the at least one opening of the access region while not completely refilling the at least partially cleared passage with solidified material; and (ii) planarizing the structural material deposited to close the at least one opening of access region.

In a first group of variations of the first-fourth aspects of the invention the deposition of the at least one sacrificial material and the at least one structural material includes a process selected from the group of processes consisting of: (i) selectively electrodepositing a structural material followed by blanket electrodepositing a sacrificial material; (ii) selectively electrodepositing a sacrificial material followed by blanket electodepositing a structural material; (iii) selectively electrodepositing a structural material and selectively electrodepositing a sacrificial material; (iv) blanket depositing a sacrificial material, selectively etching into the sacrificial material to form at least at least one opening, and thereafter depositing a structural material; (v) blanket depositing a structural material, selectively etching into the structural material to form at least one opening, and thereafter depositing a sacrificial material; (vi) depositing a first structural material, depositing a second structural material, and thereafter depositing a first sacrificial material (vii) depositing a first sacrificial material, depositing a second sacrificial material, and thereafter depositing a structural material (viii) depositing a structural material and depositing a sacrificial material wherein at least one of materials is deposited by an electrodeposition process; (ix) depositing a structural material and depositing a sacrificial material wherein the depositing of at least one of the materials includes an electrodeposition process; (x) depositing a structural material and depositing a sacrificial material wherein the depositing of at least one of the materials includes an electroless deposition process; (xi) depositing a structural material and depositing a sacrificial material wherein the depositing of at least one of the materials includes a chemical vapor deposition process; (xii) depositing a structural material and depositing a sacrificial material wherein the depositing of at least one of the materials includes a physical vapor deposition process; (xiii) depositing a structural material and depositing a sacrificial material wherein at least one of the materials includes a dielectric; (xiv) depositing a structural material and a sacrificial material wherein at least one of materials is deposited into openings made in a previously formed layer to simultaneously form part of a current layer and part of a previous layer.

In a second group of variations the first variation of aspects 1-4, the passage includes an upper access region after partial formation of the layers.

In a third group of variations of the first variation of aspects 1-4, the method provides the upper access region with one or more properties selected from the group consisting of: (i) a width that is less than a local passage width; (ii) a width that is less than a local passage width and located over the local center of the passage width along at least a portion of a passage length. (iii) A width that is less than a local passage width and located away from the local center of the passage width along at least a portion of a passage length. (iv) a width that is less than a local passage height as measured from the bottom of a local floor of the passage to a bottom of a layer than defines the width of the access region; (v) a width that is less than a passage height and located over the local center of a passage width along at least a portion of a passage length.

(vi) a width that is less than a passage height and located away from a local center of a passage width along at least a portion of a passage length. (vii) a width that is less than a local passage width and a local passage height as measured from the bottom of a local floor of the passage to a bottom of a layer than defines the width of the access region; (viii) a width that is less than a passage width and a passage height and located over the local center of a passage width along at least a portion of a passage length (ix) a width that is less than a passage width and a passage height and located away from a local center of a passage width along at least a portion of a passage length (x) a width less than 40 microns; (xi) a width less than 30 microns; (xii) a width less than 20 microns; (xiii) a width that is less than ⅔ a local passage width; (xiv) a width that is less than ½ a local passage width; (xv) a width that is less than ⅓ a local passage width; (xvi) a width that is less than ⅔ a local passage height; (xvii) a width that is less than ½ a local passage height; (xviii) a width that is less than ⅓ a local passage height; (xix) an end that is spaced from a passage end by greater than a passage width; (xx) an end that is spaced from a passage end by greater than twice a passage width; (xxi) an end that is spaced from a passage end by greater than a passage height; (xxii) an end that is spaced from a passage end by greater than twice a passage height; (xxiii) an end that is spaced from a passage end by greater than a sum of a passage width and a passage height; (xxiv) an end that is spaced from a passage end by greater than twice a sum of a passage width and a passage height; (xxv) each end being spaced from a passage end by greater than a passage width; (xxvi) each end being spaced from a passage end by greater than twice a passage width; (xxvii) each end being spaced from a passage end by greater than a passage height; (xxviii) each end being spaced from a passage end by greater than twice a passage height; (xxix) each end being from a passage end by greater than a sum of a passage width and a passage height; (xxx) an end that is spaced from a passage end by greater than twice a sum of a passage width and a passage height; (xxxi) an elongated slot extending more than 50% of a passage length; (xxxii) an elongated slot extending more than 70% of a passage length; (xxxiii) an elongated slot extending more than 70% of a passage length; (xxxiv) a plurality of elongated slots extending in parallel; (xxxv) a plurality of openings spaced from one another along a length of a passage length such that the plurality of openings are located over more than 50% of a passage length; (xxxvi) a plurality of openings spaced from one another along a length of a passage length such that the plurality of openings are located over more than 70% of a passage length; (xxxvii) a plurality of openings spaced from one another along a length of a passage length such that the plurality of openings are located over more than 70% of a passage length; (xxxviii) a plurality of openings each having an opening width and an opening length wherein the length is less than a local passage width; (xxxix) a plurality of openings each having an opening width and an opening length wherein the length is less than ⅔ a local passage width; (xl) a plurality of openings each having an opening width and an opening length wherein the length is less than ½ a local passage width; (xli) a plurality of openings each having an opening width and an opening length wherein the length is less than ⅓ a local passage width; (xlii) an opening width that can be closed via pinch off of an electrodeposited material without completely filling a passage width and passage height; (xlii) an opening width that can be closed via pinch off of an electrodeposited material without filling more than ⅔ of a passage width and passage height; (xliii) an opening width that can be closed via pinch off of an electrodeposited material without filling more than ½ of a passage width and passage height; (xliv) an opening width that can be closed via pinch off of an electrodeposited material without filling more than ⅓ of a passage width and passage height; (xlv) an opening width that can be closed via pinch off of an electrodeposited material without filling more than ⅕ of a passage width and passage height; (xlvi) an opening width that can be closed via pinch off of an electrodeposited material without filling more than 1/10 of a passage width and passage height; (xlvii) an opening width that can be closed via pinch off of an electrodeposited material without filling the underlying etched portion of the passage by more than more than 75%; (xlviii) an opening width that can be closed via pinch off of an electrodeposited material without filling the underlying etched portion of the passage by more than more than 50%; (xlix) an opening width that can be closed via pinch off of an electrodeposited material without filling the underlying etched portion of the passage by more than more than 25%; (I) an opening width that can be closed via pinch off of an electrodeposited material without filling the underlying etched portion of the passage by more than more than 10%; (li) an opening width that is oriented in a direction that is not parallel to a local passage width; (lii) a plurality of separated openings, together defining an elongated slot; (Hip an opening length that can be closed via pinch off of an electrodeposited material without completely filling a passage width and passage height; (liv) an opening length that can be closed via pinch off of an electrodeposited material without filling more than ⅔ of a passage width and passage height; (lv) an opening length that can be closed via pinch off of an electrodeposited material without filling more than ½ of a passage width and passage height; (lvi) an opening length that can be closed via pinch off of an electrodeposited material without filling more than ⅓ of a passage width and passage height; (lvii) an opening length that can be closed via pinch off of an electrodeposited material without filling more than ⅕ of a passage width and passage height; (lviii) an opening length that can be closed via pinch off of an electrodeposited material without filling more than 1/10 of a passage width and passage height; (lix) an opening length that can be closed via pinch off of an electrodeposited material without filling the underlying etched portion of the passage by more than more than 75%; (lx) an opening length that can be closed via pinch off of an electrodeposited material without filling the underlying etched portion of the passage by more than more than 50%; (lxi) an opening length that can be closed via pinch off of an electrodeposited material without filling the underlying etched portion of the passage by more than more than 25%; (lxii) an opening length that can be closed via pinch off of an electrodeposited material without filling the underlying etched portion of the passage by more than more than 10%; (lxiii) a width that is defined by a single layer of structural material; (lxiv) a lowest layer having a width and at least one more higher layers providing wider widths; (lxv) divided into a plurality of access regions located on different layers wherein selective etching and sealing occurs a plurality of times during the layer-by-layer fabrication of the structure; and (lxvi) divided into a plurality of access regions located on different layers and wherein selective etching and sealing occurs a plurality of times during the layer-by-layer fabrication of the structure and wherein the selective etching of at least two of the plurality of times provides a multi-level connected passage.

In a fourth group of variations of the first variation of aspects 1-4, the selectively removing of sacrificial material occurs via a mask that not only inhibits etching from regions outside the access region but also from at least one selective region within the access region.

In a fifth group of variations of the first variation of aspects 1-4, the selectively removing of sacrificial material occurs via a mask that not only inhibits etching from regions outside the access region but also from at least one selected region within the access region and during formation of a subsequent layer, structural material is deposited over the at least one selected region to ensure the at least one selected region is sealed.

In a second group of variations of aspects 1-4, the selective removing of the sacrificial material from the elongated passage includes removing a metal.

In a third group of variations of aspects 1-4, the selective removing of the sacrificial material from the elongated passage includes an etching of the sacrificial material.

In a fourth group of variations of aspects 1-4, the method wherein the passage has a passage width, a passage length, and a passage height.

In a fifth group of variations of aspects 1-4, the passage has features selected from the group consisting of: (i) the passage width and height are substantially uniform along the length of the passage (ii) the passage width varies along at least a portion of the length of the passage; (iii) the passage height varies along at least a portion of the length of the passage; (iv) the passage height is formed from a single layer of deposited structural material; (v) the passage height is formed from multiple layers of deposited structural material; (vi) the passage length is formed from a plurality of shorter passage lengths joined by cavities of greater width than nominal widths of the shorter passage lengths; (vii) the passage length is formed from a plurality of shorter passage lengths joined by cavities of greater height than nominal heights of the shorter passage lengths; (viii) the passage length is oriented in a plane parallel to planes of a plurality of layers from which the passage is formed; (ix) the passage length is oriented in a plane that is not parallel to planes of a plurality of layers from which the passage is formed; (x) the passage length defines a path involving a summed change of direction no less than 90 degrees; (xi) the passage length defines a path involving a summed change of direction no less than 180 degrees; (xii) the passage length defines a path involving a summed change of direction no less than 270 degrees; (xiii) the passage length defines a path involving a summed change of direction no less than 360 degrees; (xiv) the passage length defines a path involving a summed change of direction no less than 720 degrees; (xv) a passage length to passage width ratio greater than 20; (xvi) a passage length to passage width ratio greater than 50; (xvii) a passage length to passage width ratio greater than 100; (xviii) a passage length to passage height ratio greater than 20; (xviii) a passage length to passage height ratio greater than 50; (xix) a passage length to passage height ratio greater than 100; (xx) the passage width is less than 200 microns and the passage height is less than 200 microns; (xxi) the passage width is less than 100 microns and the passage height is less than 100 microns; (xxii) the passage width is less than 50 microns and the passage height is less than 50 microns; (xxiii) the passage length is greater than 5 millimeters; (xxiv) the passage length is greater than 10 millimeters; (xxv) the passage length is greater than 20 millimeters; (xxvi) a configuration that is rectangular in cross-section relative to a local longitudinal length of the passage; (xxvii) a configuration that is square in cross-section relative to a local longitudinal length of the passage; (xxviii) a configuration that is substantially circular in cross-section relative to the local longitudinal length of the passage; (xxix) a configuration that is substantially an oval in cross-section relative to the local longitudinal length of the passage; (xxx) a configuration that is a stair-stepped circle in cross-section relative to the local longitudinal length of the passage and wherein the passage width is the maximum lateral extent of the circle and wherein the passage height is the maximum vertical extent of the circle; (xxxi) a configuration that is substantially a diamond in cross-section relative to the local longitudinal length of the passage; (xxxii) a configuration that is a stair-stepped diamond in cross-section relative to the local longitudinal length of the passage and wherein the passage width is the maximum lateral extent of the diamond and wherein the passage height is the maximum vertical extent of the diamond; (xxxiii) a configuration that is substantially a triangle in cross-section relative to the local longitudinal length of the passage; (xxxiv) a configuration that is a stair-stepped triangle in cross-section relative to the local longitudinal length of the passage and wherein the passage width is the maximum lateral extent of the triangle and wherein the passage height is the maximum vertical extent of the triangle; (xxxv) the passage length is bounded by at least one horizontal facing end; (xxxvi) the passage length is bounded by at least two horizontal facing end; (xxxvii) the passage length is bounded by at least one vertical facing end; (xxxviii) the passage length is bounded by at least two vertical facing ends; and (xxxix) the passage length extends along a single path which branches into at least two paths for a portion of the passage length.

In a sixth group of variations of aspects 1-4, the upper access region possesses at least one property selected from the group consisting of: (i) a width that is less than a local passage width; (ii) a width that is less than a local passage width and located over the local center of the passage width along at least a portion of a passage length. (iii) A width that is less than a local passage width and located away from the local center of the passage width along at least a portion of a passage length. (iv) a width that is less than a local passage height as measured from the bottom of a local floor of the passage to a bottom of a layer than defines the width of the access region; (v) a width that is less than a passage height and located over the local center of a passage width along at least a portion of a passage length. (vi) a width that is less than a passage height and located away from a local center of a passage width along at least a portion of a passage length. (vii) a width that is less than a local passage width and a local passage height as measured from the bottom of a local floor of the passage to a bottom of a layer than defines the width of the access region; (viii) a width that is less than a passage width and a passage height and located over the local center of a passage width along at least a portion of a passage length (ix) a width that is less than a passage width and a passage height and located away from a local center of a passage width along at least a portion of a passage length (x) a width less than 40 microns; (xi) a width less than 30 microns; (xii) a width less than 20 microns; (xiii) a width that is less than ⅔ a local passage width; (xiv) a width that is less than ½ a local passage width; (xv) a width that is less than ⅓ a local passage width; (xvi) a width that is less than ⅔ a local passage height; (xvii) a width that is less than ½ a local passage height; (xviii) a width that is less than ⅓ a local passage height; (xix) an end that is spaced from a passage end by greater than a passage width; (xx) an end that is spaced from a passage end by greater than twice a passage width; (xxi) an end that is spaced from a passage end by greater than a passage height; (xxii) an end that is spaced from a passage end by greater than twice a passage height; (xxiii) an end that is spaced from a passage end by greater than a sum of a passage width and a passage height; (xxiv) an end that is spaced from a passage end by greater than twice a sum of a passage width and a passage height; (xxv) each end being spaced from a passage end by greater than a passage width; (xxvi) each end being spaced from a passage end by greater than twice a passage width;

(xxvii) each end being spaced from a passage end by greater than a passage height; (xxviii) each end being spaced from a passage end by greater than twice a passage height; (xxix) each end being spaced from a passage end by greater than a sum of a passage width and a passage height; (xxx) an end that is spaced from a passage end by greater than twice a sum of a passage width and a passage height; (xxxi) an elongated slot extending more than 50% of a passage length; (xxxii) an elongated slot extending more than 70% of a passage length; (xxxiii) an elongated slot extending more than 70% of a passage length; (xxxiv) a plurality of elongated slots extending in parallel; (xxxv) a plurality of openings spaced from one another along a length of a passage length such that the plurality of openings are located over more than 50% of a passage length; (xxxvi) a plurality of openings spaced from one another along a length of a passage length such that the plurality of openings are located over more than 70% of a passage length; (xxxvii) a plurality of openings spaced from one another along a length of a passage length such that the plurality of openings are located over more than 70% of a passage length; (xxxviii) a plurality of openings each having an opening width and an opening length wherein the length is less than a local passage width; (xxxix) a plurality of openings each having an opening width and an opening length wherein the length is less than ⅔ a local passage width; (xl) a plurality of openings each having an opening width and an opening length wherein the length is less than ½ a local passage width; (xli) a plurality of openings each having an opening width and an opening length wherein the length is less than ⅓ a local passage width; (xlii) an opening width that can be closed via pinch off of an electrodeposited material without completely filling a passage width and passage height; (xlii) an opening width that can be closed via pinch off of an electrodeposited material without filling more than ⅔ of a passage width and passage height; (xliii) an opening width that can be closed via pinch off of an electrodeposited material without filling more than ½ of a passage width and passage height; (xliv) an opening width that can be closed via pinch off of an electrodeposited material without filling more than ⅓ of a passage width and passage height; (xlv) an opening width that can be closed via pinch off of an electrodeposited material without filling more than ⅕ of a passage width and passage height; (xlvi) an opening width that can be closed via pinch off of an electrodeposited material without filling more than ¹⁄₁₀ of a passage width and passage height; (xlvii) an opening width that can be closed via pinch off of an electrodeposited material without filling the underlying etched portion of the passage by more than more than 75%; (xlviii) an opening width that can be closed via pinch off of an electrodeposited material without filling the underlying etched portion of the passage by more than more than 50%; (xlix) an opening width that can be closed via pinch off of an electrodeposited material without filling the underlying etched portion of the passage by more than more than 25%; (l) an opening width that can be closed via pinch off of an electrodeposited material without filling the underlying etched portion of the passage by more than more than 10%; (li) an opening width that is oriented in a direction that is not parallel to a local passage width; (lii) a plurality of separated openings, together defining an elongated slot; (Hip an opening length that can be closed via pinch off of an electrodeposited material without completely filling a passage width and passage height; (liv) an opening length that can be closed via pinch off of an electrodeposited material without filling more than ⅔ of a passage width and passage height; (lv) an opening length that can be closed via pinch off of an electrodeposited material without filling more than ½ of a passage width and passage height; (lvi) an opening length that can be closed via pinch off of an electrodeposited material without filling more than ⅓ of a passage width and passage height; (lvii) an opening length that can be closed via pinch off of an electrodeposited material without filling more than ⅕ of a passage width and passage height; (lviii) an opening length that can be closed via pinch off of an electrodeposited material without filling more than ¹⁄₁₀ of a passage width and passage height; (lix) an opening length that can be closed via pinch off of an electrodeposited material without filling the underlying etched portion of the passage by more than more than 75%; (lx) an opening length that can be closed via pinch off of an electrodeposited material without filling the underlying etched portion of the passage by more than more than 50%; (lxi) an opening length that can be closed via pinch off of an electrodeposited material without filling the underlying etched portion of the passage by more than more than 25%; (lxii) an opening length that can be closed via pinch off of an electrodeposited material without filling the underlying etched portion of the passage by more than more than 10%; (lxiii) a width that is defined by a single layer of structural material; (lxiv) a lowest layer having a width and at least one more higher layers providing wider widths; (lxv) divided into a plurality of access regions located on different layers wherein selective etching and sealing occurs a plurality of times during the layer-by-layer fabrication of the structure; and (lxvi) divided into a plurality of access regions located on different layers and wherein selective etching and sealing occurs a plurality of times during the layer-by-layer fabrication of the structure and wherein the selective etching of at least two of the plurality of times provides a multi-level connected passage.

In a seventh group of variations of aspects 1-4, at least one end of the passage is sealed with structural material that is removed from the passage using a process selected from the group consisting of: (1) dicing prior to release; (2) dicing after external passage release; (3) laser ablation prior to release; and (4) laser ablation prior to external passage release.

In an eighth group of variations of aspects 1-4, after filling with the secondary sacrificial material, the secondary structural material is covered with structural material by a process selected from the group consisting of: (1) mushrooming over a dielectric secondary sacrificial material; (2) electroplating over a seed layer which is formed over a dielectric secondary sacrificial material; (3) electroplating over the secondary material; (4) electroplating over the secondary material which includes copper powder; (5) sputtering; (6) electroless deposition.

In a ninth group of variations of aspects 1-4, the structure includes a plurality of structures and wherein the process provides a manifold formed from a structural material for connecting a plurality of passages of the plurality of structures and is used during release to help remove remaining sacrificial material from the passages and is then separated from the structures by a process selected from the group consisting of: (a) dicing, (b) laser cutting; and (c) etching that removes a thin region of a sacrificial material from non contacting structural material that forms the structures and the manifold.

Other aspects of the invention will be understood by those of skill in the art upon review of the teachings herein. Other aspects of the invention may involve combinations of the above noted aspects of the invention. These other aspects of the invention may provide various combinations of the aspects presented above as well as provide other configurations, structures, functional relationships, and processes that have not been specifically set forth above.

BRIEF DESCRIPTION OF THE DRAWINGS

FIGS. 4A-4F schematically depict the formation of a first layer of a structure using adhered mask plating where the blanket deposition of a second material overlays both the openings between deposition locations of a first material and the first material itself FIG. 4G depicts the completion of formation of the first layer resulting from planarizing the deposited materials to a desired level.

FIGS. 4H and 4I respectively depict the state of the process after formation of the multiple layers of the structure and after release of the structure from the sacrificial material.

FIG. 5 provides an illustration of a three-dimensional structure formed from a plurality of layers that has a configuration including an internal passage from which it may be difficult to remove sacrificial material and as such may benefit from the design modifications and/or fabrication modifications presented by some embodiments of the invention.

FIGS. 6A-1-6G3 provide perspective views of the structural features of the device of FIG. 5 as if it was formed as a single device (as opposed to in batch as is generally the case with multi-layer, multi-material electrochemical fabrication methods) along with perspective views showing the buildup of individual layers as they are formed from a combination of structural and sacrificial materials.

FIGS. 6G-4 provides a close up end view of the structural material that forms an end of the passage of FIG. 5.

FIGS. 9A-9H illustrate various steps in a process of a first exemplary embodiment of the invention wherein original sacrificial material is removed from the interior of the passage prior to completion of formation of the passage and then a secondary and more easily removed sacrificial material is made to fill the passage, and thereafter passage capping and layer formation continues as appropriate.

FIGS. 10A-10H illustrate various steps in a process of a second exemplary embodiment of the invention wherein original sacrificial material is removed from the interior of the passage prior to completion of formation of the passage and then the passage is closed by pinch off (or lateral bridging) of sacrificial material with only partial refilling of the passage with solidified sacrificial material and thereafter passage capping, continued layer formation, and release.

FIGS. 11A-11G illustrate various steps in a process of a third exemplary embodiment of the invention wherein original sacrificial material is removed from the interior of the passage prior to completion of formation of the passage and then the passage is closed by pinch off of structural material with only partial refilling of the passage with solidified material.

FIGS. 12B-1 and 12B-2 depict top views of sample passages according to some embodiments of the invention where a first side of the passage is separated from a second side by a substantially uniform spacing along the length of the passage wherein FIGS. 12B-01 depicts a straight passage while FIG. 12-B depicts a passage with a curve or bend.

FIGS. 14A, 14B-1, and 14B-2 provide side view of differently oriented example passages along with a series of lines that define layer boundary levels as the passages may be fabricated according to some embodiments of the invention.

FIGS. 15A-15D depict top cut views of a number of example passages that might be formed according to some embodiments of the invention wherein the passages have different lengths and shapes including different levels of complexity.

DETAILED DESCRIPTION OF PREFERRED EMBODIMENTS

Electrochemical Fabrication in General

Figure 1A:
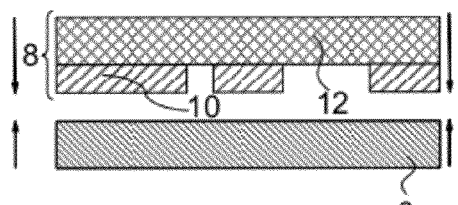
FIGS. 1A-1C schematically depict side views of various stages of a CC mask plating process, while FIGS. 1D-G schematically depict a side views of various stages of a CC mask plating process using a different type of CC mask.
Figure 1B:
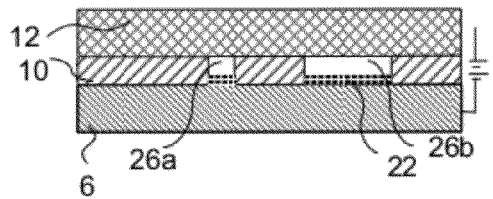
Figure 1C:
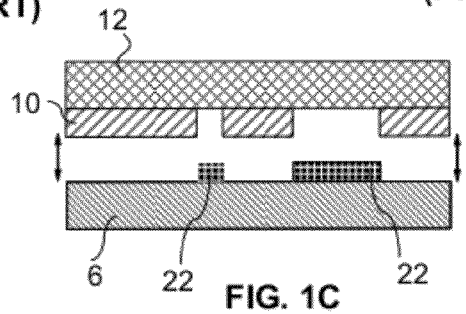
Figure 1D:
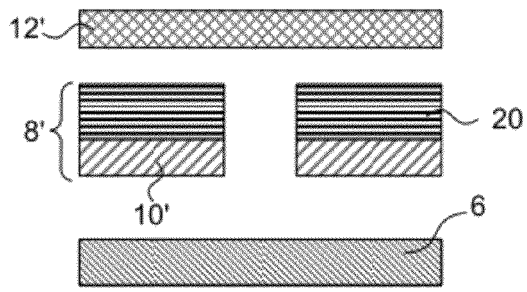
Figure 1E:
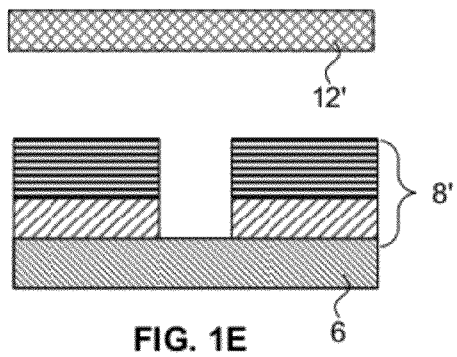
Figure 1F:
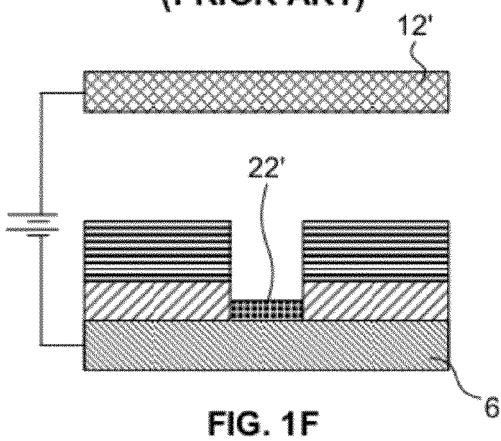
Figure 1G:
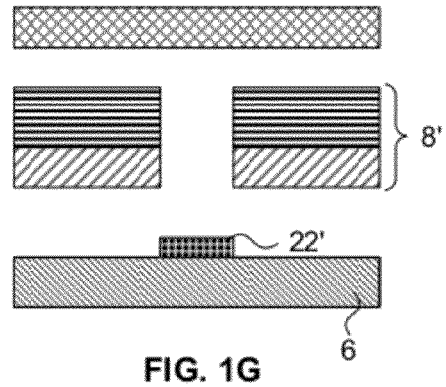
Figure 2A:
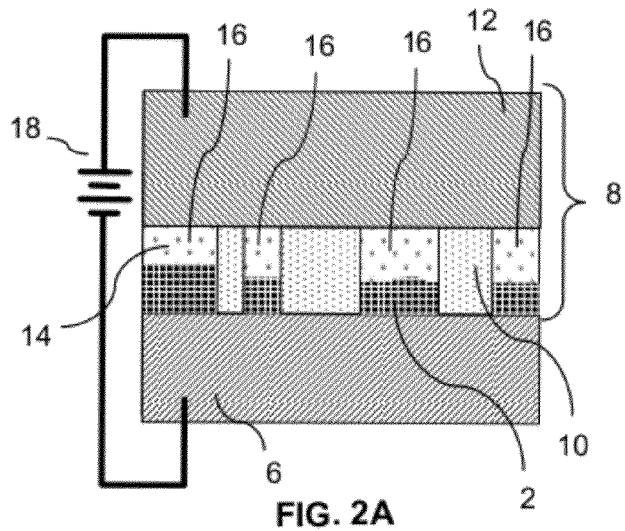
FIGS. 2A-2F schematically depict side views of various stages of an electrochemical fabrication process as applied to the formation of a particular structure where a sacrificial material is selectively deposited while a structural material is blanket deposited.
Figure 2B:
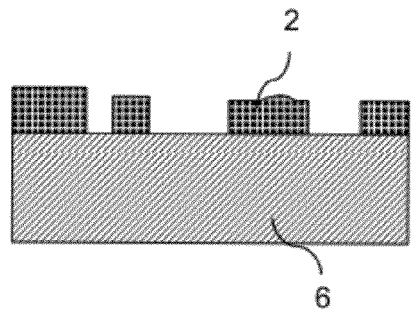
Figure 2C:
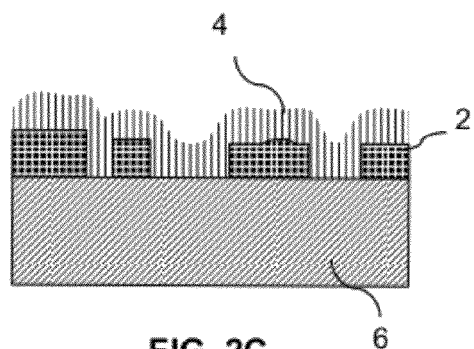
Figure 2D:
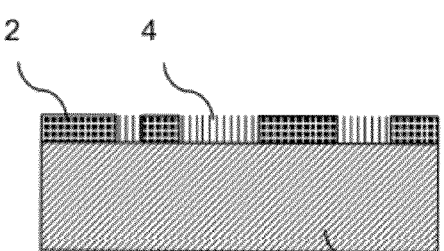
Figure 2E:
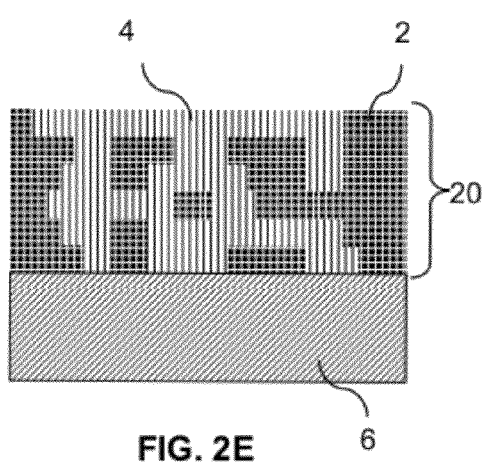
Figure 2F:
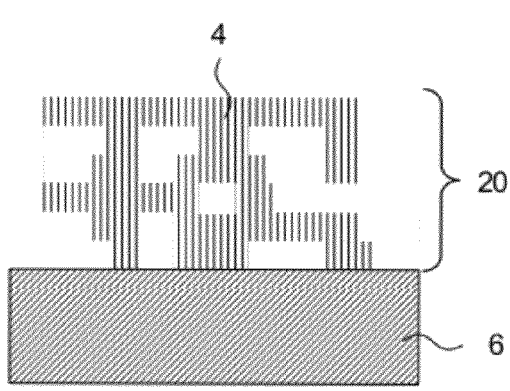
Figure 3A:
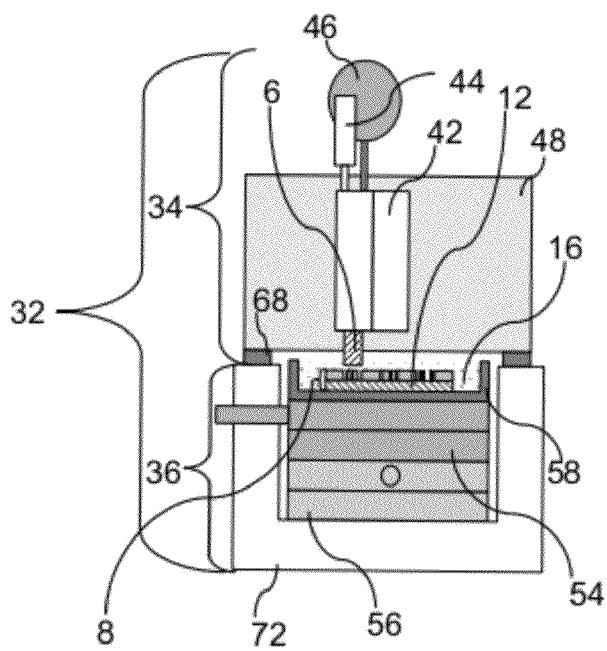
FIGS. 3A-3C schematically depict side views of various example subassemblies that may be used in manually implementing the electrochemical fabrication method depicted in FIGS. 2A-2F.
Figure 3B:
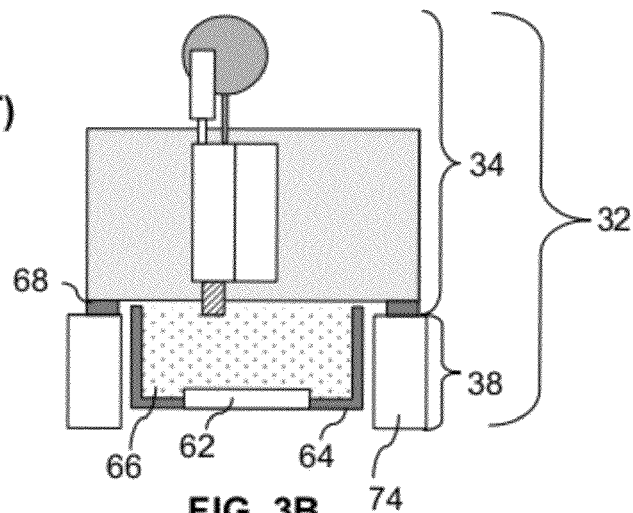
Figure 3C:
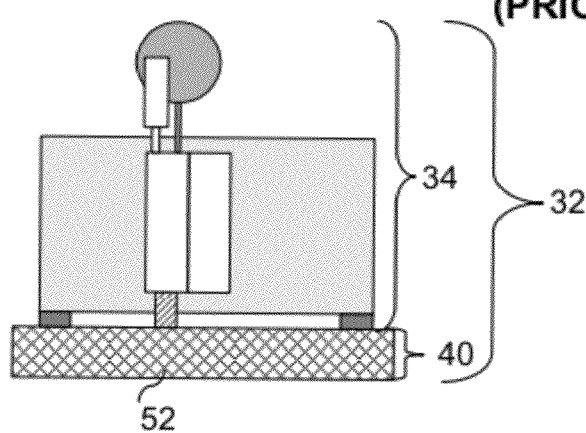

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

FIGS. 4A-4I illustrate various stages in the formation of a single layer of a multi-layer fabrication process where a second metal is deposited on a first metal as well as in openings in the first metal so that the first and second metal form part of the layer. In FIG. 4A a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(*a*)-92(*c*) extending from a surface 86 of the photoresist through the thickness of the photoresist to surface 88 of the substrate 82. In FIG. 4D a metal 94 (e.g. nickel) is shown as having been electroplated into the openings 92(*a*)-92(*c*). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

Various embodiments of various aspects of the invention are directed to formation of three-dimensional structures from materials some of which may be electrodeposited or electroless deposited. Some of these structures may be formed form a single build level formed from one or more deposited materials while others are formed from a plurality of build layers each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used. In some embodiments structures having features positioned with micron level precision and minimum features size on the order of tens of microns are to be formed. In other embodiments structures with less precise feature placement and/or larger minimum features may be formed. In still other embodiments, higher precision and smaller minimum feature sizes may be desirable. In the present application meso-scale and millimeter scale have the same meaning and refer to devices that may have one or more dimensions extending into the 0.5-20 millimeter range, or somewhat larger and with features positioned with precision in the 10-100 micron range and with minimum features sizes on the order of 100 microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted, or located in proximity to. Adhered masks are generally formed on the surface to be treated (i.e. the portion of that surface that is to be masked) and bonded to that surface such that they cannot be separated from that surface without being completely destroyed damaged beyond any point of reuse. Adhered masks may be formed in a number of ways including (1) by application of a photoresist, selective exposure of the photoresist, and then development of the photoresist, (2) selective transfer of pre-patterned masking material, and/or (3) direct formation of masks from computer controlled depositions of material.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration). Such use of selective etching and interlaced material deposition in association with multiple layers is described in U.S. patent application Ser. No. 10/434,519, by Smalley, now U.S. Pat. No. 7,252,861, and entitled "Methods of and Apparatus for Electrochemically Fabricating Structures Via Interlaced Layers or Via Selective Etching and Filling of Voids layer elements" which is hereby incorporated herein by reference as if set forth in full.

Temporary substrates on which structures may be formed may be of the sacrificial-type (i.e. destroyed or damaged during separation of deposited materials to the extent they can not be reused), non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g. replanarizing one or more selected surfaces or applying a release layer, and the like) though they may or may not be reused for a variety of reasons.

DEFINITIONS

This section of the specification is intended to set forth definitions for a number of specific terms that may be useful in describing the subject matter of the various embodiments of the invention. It is believed that the meanings of most if not all of these terms is clear from their general use in the specification but they are set forth hereinafter to remove any ambiguity that may exist. It is intended that these definitions be used in understanding the scope and limits of any claims that use these specific terms. As far as interpretation of the claims of this patent disclosure are concerned, it is intended that these definitions take presence over any contradictory definitions or allusions found in any materials which are incorporated herein by reference.

"Build" as used herein refers, as a verb, to the process of building a desired structure or plurality of structures from a plurality of applied or deposited materials which are stacked and adhered upon application or deposition or, as a noun, to the physical structure or structures formed from such a process. Depending on the context in which the term is used, such physical structures may include a desired structure embedded within a sacrificial material or may include only desired physical structures which may be separated from one another or may require dicing and/or slicing to cause separation.

"Build axis" or "build orientation" is the axis or orientation that is substantially perpendicular to substantially planar levels of deposited or applied materials that are used in building up a structure. The planar levels of deposited or applied materials may be or may not be completely planar but are substantially so in that the overall extent of their cross-sectional dimensions are significantly greater than the height of any individual deposit or application of material (e.g. 100, 500, 1000, 5000, or more times greater). The planar nature of the deposited or applied materials may come about from use of a process that leads to planar deposits or it may result from a planarization process (e.g. a process that includes mechanical abrasion, e.g. lapping, fly cutting, grinding, or the like) that is used to remove material regions of excess height. Unless explicitly noted otherwise, "vertical" as used herein refers to the build axis or nominal build axis (if the layers are not stacking with perfect registration) while "horizontal" refers to a direction within the plane of the layers (i.e. the plane that is substantially perpendicular to the build axis).

"Build layer" or "layer of structure" as used herein does not refer to a deposit of a specific material but instead refers to a region of a build located between a lower boundary level and an upper boundary level which generally defines a single cross-section of a structure being formed or structures which are being formed in parallel. Depending on the details of the actual process used to form the structure, build layers are generally formed on and adhered to previously formed build layers. In some processes the boundaries between build layers are defined by planarization operations which result in successive build layers being formed on substantially planar upper surfaces of previously formed build layers. In some embodiments, the substantially planar upper surface of the preceding build layer may be textured to improve adhesion between the layers. In other build processes, openings may exist in or be formed in the upper surface of a previous but only partially formed build layers such that the openings in the previous build layers are filled with materials deposited in association with current build layers which will cause interlacing of build layers and material deposits. Such interlacing is described in U.S. patent application Ser. No. 10/434,519 now U.S. Pat. No. 7,252,861. This referenced application is incorporated herein by reference as if set forth in full. In most embodiments, a build layer includes at least one primary structural material and at least one primary sacrificial material. However, in some embodiments, two or more primary structural materials may used without a primary sacrificial material (e.g. when one primary structural material is a dielectric and the other is a conductive material). In some embodiments, build layers are distinguishable from each other by the source of the data that is used to yield patterns of the deposits, applications, and/or etchings of material that form the respective build layers. For example, data descriptive of a structure to be formed which is derived from data extracted from different vertical levels of a data representation of the structure define different build layers of the structure. The vertical separation of successive pairs of such descriptive data may define the thickness of build layers associated with the data. As used herein, at times, "build layer" may be loosely referred simply as "layer". In many embodiments, deposition thickness of primary structural or sacrificial materials (i.e. the thickness of any particular material after it is deposited) is generally greater than the layer thickness and a net deposit thickness is set via one or more planarization processes which may include, for example, mechanical abrasion (e.g. lapping, fly cutting, polishing, and the like) and/or chemical etching (e.g. using selective or non-selective etchants). The lower boundary and upper boundary for a build layer may be set and defined in different ways. From a design point of view they may be set based on a desired vertical resolution of the structure (which may vary with height). From a data manipulation point of view, the vertical layer boundaries may be defined as the vertical levels at which data descriptive of the structure is processed or the layer thickness may be defined as the height separating successive levels of cross-sectional data that dictate how the structure will be formed. From a fabrication point of view, depending on the exact fabrication process used, the upper and lower layer boundaries may be defined in a variety of different ways. For example by planarization levels or effective planarization levels (e.g. lapping levels, fly cutting levels, chemical mechanical polishing levels, mechanical polishing levels, vertical positions of structural and/or sacrificial materials after relatively uniform etch back following a mechanical or chemical mechanical planarization process). For example, by levels at which process steps or operations are repeated. At levels at which, at least theoretically, lateral extends of structural material can be changed to define new cross-sectional features of a structure.

"Layer thickness" is the height along the build axis between a lower boundary of a build layer and an upper boundary of that build layer.

"Planarization" is a process that tends to remove materials, above a desired plane, in a substantially non-selective manner such that all deposited materials are brought to a substantially common height or desired level (e.g. within 20%, 10%, 5%, or even 1% of a desired layer boundary level). For example, lapping removes material in a substantially non-selective manner though some amount of recession one material or another may occur (e.g. copper may recess relative to nickel). Planarization may occur primarily via mechanical means, e.g. lapping, grinding, fly cutting, milling, sanding, abrasive polishing, frictionally induced melting, other machining operations, or the like (i.e. mechanical planarization). Mechanical planarization may be followed or proceeded by thermally induced planarization (e.g. melting) or chemically induced planarization (e.g. etching). Planarization may occur primarily via a chemical and/or electrical means (e.g. chemical etching, electrochemical etching, or the like). Planarization may occur via a simultaneous combination of mechanical and chemical etching (e.g. chemical mechanical polishing (CMP)).

"Structural material" as used herein refers to a material that remains part of the structure when put into use.

"Supplemental structural material" as used herein refers to a material that forms part of the structure when the structure is put to use but is not added as part of the build layers but instead is added to a plurality of layers simultaneously (e.g. via one or more coating operations that applies the material, selectively or in a blanket fashion, to a one or more surfaces of a desired build structure that has been released from a sacrificial material.

"Primary structural material" as used herein is a structural material that forms part of a given build layer and which is typically deposited or applied during the formation of that build layer and which makes up more than 20% of the structural material volume of the given build layer. In some embodiments, the primary structural material may be the same on each of a plurality of build layers or it may be different on different build layers. In some embodiments, a given primary structural material may be formed from two or more materials by the alloying or diffusion of two or more materials to form a single material.

"Secondary structural material" as used herein is a structural material that forms part of a given build layer and is typically deposited or applied during the formation of the given build layer but is not a primary structural material as it individually accounts for only a small volume of the structural material associated with the given layer. A secondary structural material will account for less than 20% of the volume of the structural material associated with the given layer. In some preferred embodiments, each secondary structural material may account for less than 10%, 5%, or even 2% of the volume of the structural material associated with the given layer. Examples of secondary structural materials may include seed layer materials, adhesion layer materials, barrier layer materials (e.g. diffusion barrier material), and the like. These secondary structural materials are typically applied to form coatings having thicknesses less than 2 microns, 1 micron, 0.5 microns, or even 0.2 microns). The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Functional structural material" as used herein is a structural material that would have been removed as a sacrificial material but for its actual or effective encapsulation by other structural materials. Effective encapsulation refers, for example, to the inability of an etchant to attack the functional structural material due to inaccessibility that results from a very small area of exposure and/or due to an elongated or tortuous exposure path. For example, large (10,000 $\mu m^3$) but thin (e.g. less than 0.5 microns) regions of sacrificial copper sandwiched between deposits of nickel may define regions of functional structural material depending on ability of a release etchant to remove the sandwiched copper.

"Sacrificial material" is material that forms part of a build layer but is not a structural material. Sacrificial material on a given build layer is separated from structural material on that build layer after formation of that build layer is completed and more generally is removed from a plurality of layers after completion of the formation of the plurality of layers during a "release" process that removes the bulk of the sacrificial material or materials. In general sacrificial material is located on a build layer during the formation of one, two, or more subsequent build layers and is thereafter removed in a manner that does not lead to a planarized surface. Materials that are applied primarily for masking purposes, i.e. to allow subsequent selective deposition or etching of a material, e.g. photoresist that is used in forming a build layer but does not form part of the build layer) or that exist as part of a build for less than one or two complete build layer formation cycles are not considered sacrificial materials as the term is used herein but instead shall be referred as masking materials or as temporary materials. These separation processes are sometimes referred to as a release process and may or may not involve the separation of structural material from a build substrate. In many embodiments, sacrificial material within a given build layer is not removed until all build layers making up the three-dimensional structure have been formed. Of course sacrificial material may be, and typically is, removed from above the upper level of a current build layer during planarization operations during the formation of the current build layer. Sacrificial material is typically removed via a chemical etching operation but in some embodiments may be removed via a melting operation or electrochemical etching operation. In typical structures, the removal of the sacrificial material (i.e. release of the structural material from the sacrificial material) does not result in planarized surfaces but instead results in surfaces that are dictated by the boundaries of structural materials located on each build layer. Sacrificial materials are typically distinct from structural materials by having different properties therefrom (e.g. chemical etchability, hardness, melting point, etc.) but in some cases, as noted previously, what would have been a sacrificial material may become a structural material by its actual or effective encapsulation by other structural materials. Similarly, structural materials may be used to form sacrificial structures that are separated from a desired structure during a release process via the sacrificial structures being only attached to sacrificial material or potentially by dissolution of the sacrificial structures themselves using a process that is insufficient to reach structural material that is intended to form part of a desired structure. It should be understood that in some embodiments, small amounts of structural material may be removed, after or during release of sacrificial material. Such small amounts of structural material may have been inadvertently formed due to imperfections in the fabrication process or may result from the proper application of the process but may result in features that are less than optimal (e.g. layers with stairs steps in regions where smooth sloped surfaces are desired. In such cases the volume of structural material removed is typically minuscule compared to the amount that is retained and thus such removal is ignored when labeling materials as sacrificial or structural. Sacrificial materials are typically removed by a dissolution process, or the like, that destroys the geometric configuration of the sacrificial material as it existed on the build layers. In many embodiments, the sacrificial material is a conductive material such as a metal. As will be discussed hereafter, masking materials though typically sacrificial in nature are not termed sacrificial materials herein unless they meet the required definition of sacrificial material.

"Supplemental sacrificial material" as used herein refers to a material that does not form part of the structure when the structure is put to use and is not added as part of the build layers but instead is added to a plurality of layers simultaneously (e.g. via one or more coating operations that applies the material, selectively or in a blanket fashion, to a one or more surfaces of a desired build structure that has been released from an initial sacrificial material. This supplemental sacrificial material will remain in place for a period of time and/or during the performance of certain post layer formation operations, e.g. to protect the structure that was released from a primary sacrificial material, but will be removed prior to putting the structure to use.

"Primary sacrificial material" as used herein is a sacrificial material that is located on a given build layer and which is typically deposited or applied during the formation of that build layer and which makes up more than 20% of the sacrificial material volume of the given build layer. In some embodiments, the primary sacrificial material may be the same on each of a plurality of build layers or may be different on different build layers. In some embodiments, a given primary sacrificial material may be formed from two or more materials by the alloying or diffusion of two or more materials to form a single material.

"Secondary sacrificial material" as used herein is a sacrificial material that is located on a given build layer and is typically deposited or applied during the formation of the build layer but is not a primary sacrificial materials as it individually accounts for only a small volume of the sacrificial material associated with the given layer. A secondary sacrificial material will account for less than 20% of the volume of the sacrificial material associated with the given layer. In some preferred embodiments, each secondary sacrificial material may account for less than 10%, 5%, or even 2% of the volume of the sacrificial material associated with the given layer. Examples of secondary structural materials may include seed layer materials, adhesion layer materials, barrier layer materials (e.g. diffusion barrier material), and the like. These secondary sacrificial materials are typically applied to form coatings having thicknesses less than 2 microns, 1 micron, 0.5 microns, or even 0.2 microns). The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Adhesion layer", "seed layer", "barrier layer", and the like refer to coatings of material that are thin in comparison to the layer thickness and thus generally form secondary structural material portions or sacrificial material portions of some layers. Such coatings may be applied uniformly over a previously formed build layer, they may be applied over a portion of a previously formed build layer and over patterned structural or sacrificial material existing on a current (i.e. partially formed) build layer so that a non-planar seed layer results, or they may be selectively applied to only certain locations on a previously formed build layer. In the event such coatings are non-selectively applied, selected portions may be removed (1) prior to depositing either a sacrificial material or structural material as part of a current layer or (2) prior to beginning formation of the next layer or they may remain in place through the layer build up process and then etched away after formation of a plurality of build layers.

"Masking material" is a material that may be used as a tool in the process of forming a build layer but does not form part of that build layer. Masking material is typically a photopolymer or photoresist material or other material that may be readily patterned. Masking material is typically a dielectric. Masking material, though typically sacrificial in nature, is not a sacrificial material as the term is used herein. Masking material is typically applied to a surface during the formation of a build layer for the purpose of allowing selective deposition, etching, or other treatment and is removed either during the process of forming that build layer or immediately after the formation of that build layer.

"Multilayer structures" are structures formed from multiple build layers of deposited or applied materials.

"Multilayer three-dimensional (or 3D or 3-D) structures" are Multilayer Structures that meet at least one of two criteria: (1) the structural material portion of at least two layers of which one has structural material portions that do not overlap structural material portions of the other.

"Complex multilayer three-dimensional (or 3D or 3-D) structures" are multilayer three-dimensional structures formed from at least three layers where a line may be defined that hypothetically extends vertically through at least some portion of the build layers of the structure will extend from structural material through sacrificial material and back through structural material or will extend from sacrificial material through structural material and back through sacrificial material (these might be termed vertically complex multilayer three-dimensional structures). Alternatively, complex multilayer three-dimensional structures may be defined as multilayer three-dimensional structures formed from at least two layers where a line may be defined that hypothetically extends horizontally through at least some portion of a build layer of the structure that will extend from structural material through sacrificial material and back through structural material or will extend from sacrificial material through structural material and back through sacrificial material (these might be termed horizontally complex multilayer three-dimensional structures). Worded another way, in complex multilayer three-dimensional structures, a vertically or horizontally extending hypothetical line will extend from one structural material or void (when the sacrificial material is removed) to the other of void or structural material and then back to structural material or void as the line is traversed along at least a portion of the line.

"Moderately complex multilayer three-dimensional (or 3D or 3-D) structures are complex multilayer 3D structures for which the alternating of void and structure or structure and void not only exists along one of a vertically or horizontally extending line but along lines extending both vertically and horizontally.

"Highly complex multilayer (or 3D or 3-D) structures are complex multilayer 3D structures for which the structure-to-void-to-structure or void-to-structure-to-void alternating occurs once along the line but occurs a plurality of times along a definable horizontally or vertically extending line.

"Up-facing feature" is an element dictated by the cross-sectional data for a given build layer "n" and a next build layer "n+1" that is to be formed from a given material that exists on the build layer "n" but does not exist on the immediately succeeding build layer "n+1". For convenience the term "up-facing feature" will apply to such features regardless of the build orientation.

"Down-facing feature" is an element dictated by the cross-sectional data for a given build layer "n" and a preceding build layer "n−1" that is to be formed from a given material that exists on build layer "n" but does not exist on the immediately preceding build layer "n−1". As with up-facing features, the term "down-facing feature" shall apply to such features regardless of the actual build orientation.

"Continuing region" is the portion of a given build layer "n" that is dictated by the cross-sectional data for the given build layer "n", a next build layer "n+1" and a preceding build layer "n−1" that is neither up-facing nor down-facing for the build layer "n".

"Minimum feature size" refers to a necessary or desirable spacing between structural material elements on a given layer that are to remain distinct in the final device configuration. If the minimum feature size is not maintained on a given layer, the fabrication process may result in structural material inadvertently bridging the two structural elements due to masking material failure or failure to appropriately fill voids with sacrificial material during formation of the given layer such that during formation of a subsequent layer structural material inadvertently fills the void. More care during fabrication can lead to a reduction in minimum feature size or a willingness to accept greater losses in productivity can result in a decrease in the minimum feature size. However, during fabrication for a given set of process parameters, inspection diligence, and yield (successful level of production) a minimum design feature size is set in one way or another. The above described minimum feature size may more appropriately be termed minimum feature size of sacrificial material regions. Conversely a minimum feature size for structure material regions (minimum width or length of structural material elements) may be specified. Depending on the fabrication method and order of deposition of structural material and sacrificial material, the two types of minimum feature sizes may be different. In practice, for example, using electrochemical fabrication methods and described herein, the minimum features size on a given layer may be roughly set to a value that approximates the layer thickness used to form the layer and it may be considered the same for both structural and sacrificial material widths and lengths. In some more rigorously implemented processes, examination regiments, and rework requirements, it may be set to an amount that is 80%, 50%, or even 30% of the layer thickness. Other values or methods of setting minimum feature sizes may be set.

"Sublayer" as used herein refers to a portion of a build layer that typically includes the full lateral extents of that build layer but only a portion of its height. A sublayer is usually a vertical portion of build layer that undergoes independent processing compared to another sublayer of that build layer.

Methods for Removing Sacrificial Material from Passages

The present invention is exemplified by a number of embodiments. Some embodiments are directed to improved methods for fabricating micro-scale or millimeter scale structures or devices with hollow channels or passages where the passages have relatively small radial dimensions and have extended or tortuous axial dimensions that would make normal removal of a passage filling sacrificial material difficult or impossible via standard wet etching processes. Other embodiments are directed to structures or devices having specific features that allow for or follow from the application of such methods. From another point of view embodiments of the invention provide for improved methods of sealing sacrificial material etching openings, passages (these are different from the hollow channels or passages that are created by some embodiments of the invention), or windows wherein the openings, passages or windows are made to exist prior to completion of formation of the layers that are used to form the structure or structures, are used in the process of removing an initial sacrificial material, and are closed prior to the completion of formation of the layers.

Some embodiments of the invention provide for modified fabrication processes to provide improved ability to obtain hollow passages (e.g. channels or cavities) and some embodiments implement such modifications via modified structure or device designs (either obtained via initial design features which take into consideration improved methods, manual modification of an existing design to provide the required features, or automatic modification via programmed computers or the like that insert desired modified design features). All method embodiments call for the removal of sacrificial material from at least portions of the passage or passages prior to completion of formation of the passage or passages. The removal occurs before the formation of a closed capping layer or capping layers that seal off the upper portion of the passage (i.e. seal off an access region or regions of the passage) thus allowing an opening or openings to exist along a substantial length of the incomplete passage which may be used as an extended material removal region or regions so as to allow extraction of the sacrificial material along an extended or complete length of the passage or passages as opposed to delaying sacrificial material extraction until the passage is completed and the only access may be via intended end openings in the final passage (e.g. at one or multiple ends of the passage or passages).

In some embodiments the removal is followed by a back filling operation that locates a secondary and more easily removable sacrificial material into the emptied portion of the passage or passages. The back filling material may be a wax-like material or other easily meltable material. In other embodiments it may be a material that may be transformed via oxidation (e.g. burning) or other stimulus to convert from a solid to a liquid or gaseous state. In such embodiments, the filled passage may be sealed in a variety of ways, for example, with a structural material either by mushrooming of an electrodeposited material to close the openings (i.e. lateral spreading of electrodeposited material over a non-conductive material as the height of the electrodeposited material is increased), application of a seed layer or electroless deposition of a material over which electroplating of a final structural material capping element may be formed.

In some embodiments, the opening or openings (access region or regions) through which intermediate etching may occur may be made narrower than the width of the passage so that closing of the openings may be easier while still providing an adequate gap for sacrificial material removal. In some embodiments, the width of the openings may not be less than the width of the passage but their length decreased and a plurality of such opening used.

In some embodiments, backfilling is not an intended part of the process though some backfilling may still occur. In such embodiments it is intended that the passage remain at least partially free of solidified material (i.e. open), if not substantially open or even completely open along a substantial length of the passage so that only a relatively small amount of etching is required prior to at least partially opening that passage along its entire length which may then lead to a widening of the passageway as additional sacrificial material is removed from the inside bounding walls of the passage. Such embodiments may make use of a narrowed or reduced length opening or openings (i.e. access regions) in combination with electroplating of sacrificial material that spreads laterally a sufficient distance to "pinch off" the opening (e.g. bridge or extend laterally to seal the opening) prior to complete refilling of the previously cleared passage with re-deposited sacrificial material. Such sacrificial material may then be planarized along with a portion of the previously deposited structural material to define a completed layer that includes part of the passage (e.g. a penultimate layer of the passage) after which a capping layer of structural material may be used to close the openings. In other embodiments, the opening or openings may be filled by deposition of a structural material that pinches off the openings and leaves behind a cleared passageway that has desired radial and axial dimensions (e.g. after removal of any end caps of sacrificial or structural material) that may have reached their final dimensions as a result of some amount of inter-cavity deposition of structural material as capping off was occurring. Deposition of structural material over sacrificial material on the ends of the passage (which are intended to be open) may be reduced by making the inside ends positioned at some distance from the access region openings relative to the distance between the access regions and other inter-passage regions.

An exemplary passage is shown in FIG. 5 and FIG. 6A-1 to FIG. 6G-4. FIG. 5 provides a perspective view of a J-shaped structure 100, including a hollow passage, formed from seven substantially planar layers 101-107 stacked along a vertical or Z-axis wherein the bottom layer 101 provides a floor with a bottom surface and a top surface, top layer 107 provides a roof or ceiling with a bottom surface and a top surface, while intermediate layers 102-106 provide passage side walls. During normal multi-layer, multi-material fabrication, the structure 100 is surrounded by sacrificial material and filled with sacrificial material which must be removed if the formed structure is to have the desired physical and functional properties. The structure has a passage length PL which is the summed of lengths PL1, PL2, and PL3, a passage height PH, and a passage width PW. The structure or device 100 of FIG. 5 provides an example of a device that includes an elongated passage having some complexity for which removal of internal sacrificial material may be difficult particularly if the length is long or tortuous and the height too short and/or the width too narrow.

FIGS. 6A-1-6G3 provide perspective views of the structural features of the device of FIG. 5 as if it was formed as a single device (as opposed to in batch as is generally the case with multi-layer, multi-material electrochemical fabrication methods) along with perspective views showing the buildup of individual layers as they are formed from a combination of structural and sacrificial materials.

Figures 1, 6C:
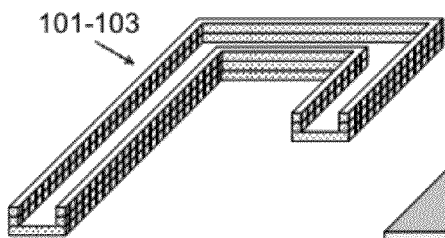
Figures 2, 6C:
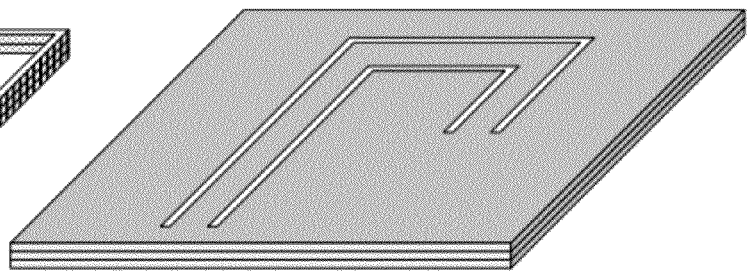
Figures 1, 6D:
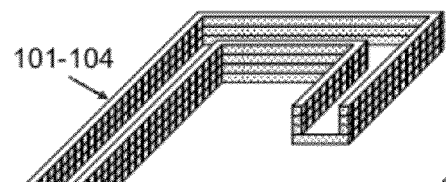
Figures 2, 6D:
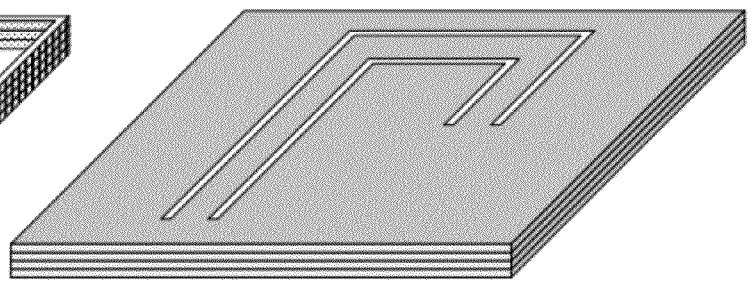
Figures 1, 6E:
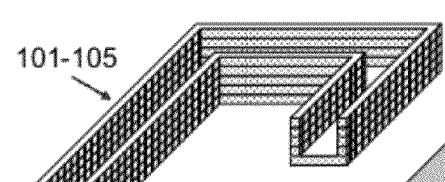
Figures 2, 6E:
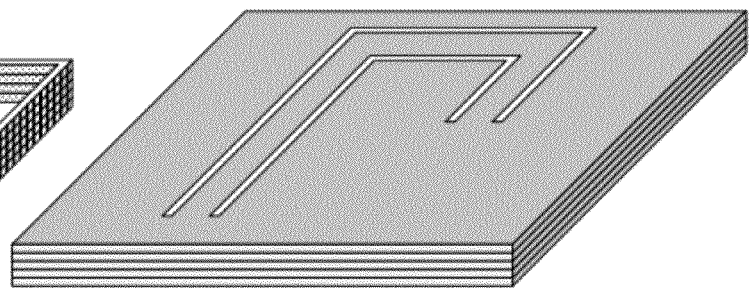
Figures 1, 6F:
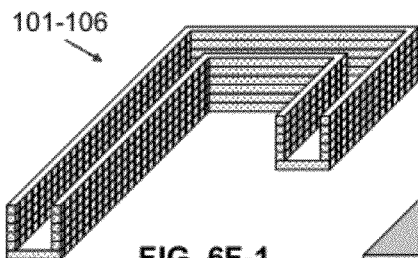
Figures 2, 6F:
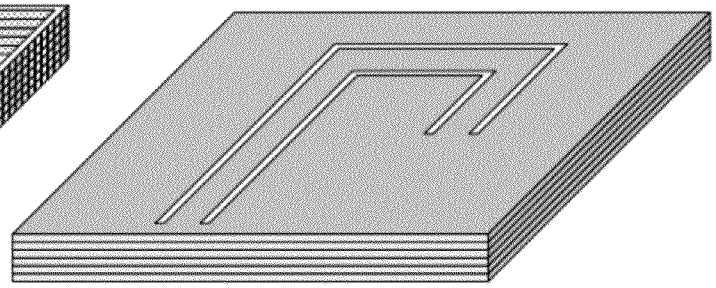

FIGS. 6A-1 provides a perspective view of the structural material associated with a first layer of a single device to be formed (in actually practice, such devices would be formed with hundreds or thousands on a single wafer) while FIGS. 6A-2 shows the structural material of FIGS. 6A-1 surround by sacrificial material. This first layer is formed directly on a substrate which may or may not have a layer or coating of a release material located thereon so that the devices may be readily separated from the substrate after formation. In this example, this first cross-section of the three-dimensional structure provides a base for the passage though in other embodiments, the first layer may provide other structural features as well as the passage base or it may simply provide other features while the base of the passage may not exist until formation of a higher layer.

FIGS. 6B-1 to 6F-2 provide structural material and combined structural material and sacrificial material views of the second through sixth layers of the device of FIG. 5 where passage sidewalls are formed and grow taller with the formation of each layer.

Figures 1, 6G:
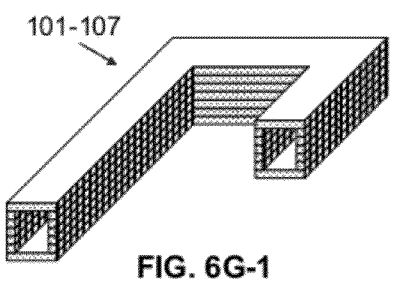
Figures 2, 6G:
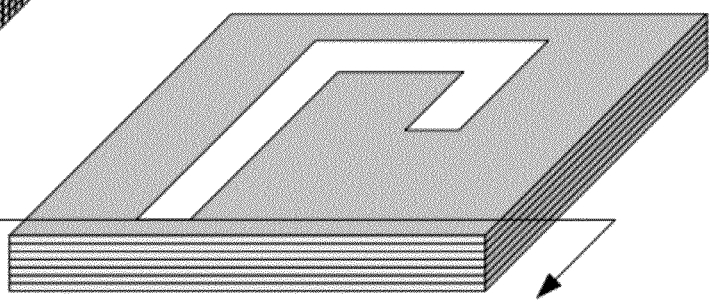
Figures 3, 6G:
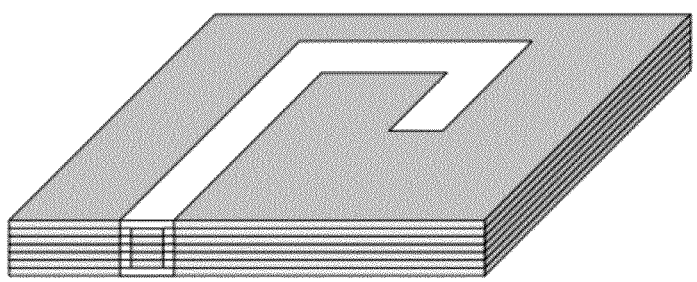
Figures 4, 6G:
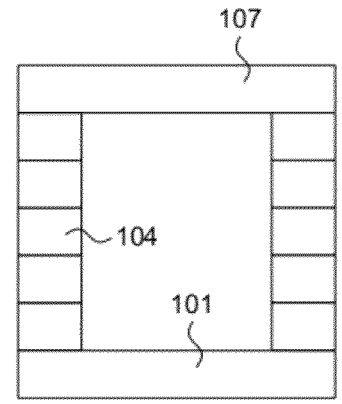

FIG. 6G-1 provides a view of the completed seven layer structure while FIG. 6G2 provides a view of the structure while still laterally encased and filled with sacrificial material. FIG. 6G3 shows the layers of FIG. 6G2 in cross-section viewed from direction 6G3-6G3 so that the sacrificial material filled end of the passage can be seen. In this example, this seventh layer of the structure provides a capping layer or element that closes off the top portion of the passage. FIGS. 6G-4 provides a close up end view of the structural material that forms an end of the passage.

After completion of layer formation, the next step is to remove the sacrificial material from around the structure and from inside the passage. The complete removal of material from the inside of the passage may be time consuming, difficult or even impossible, using standard post layer formation etching practices. The removal of sacrificial material (e.g. copper) can generally be readily removed by application of an appropriate etchant. An appropriate etchant is one that readily removes the sacrificial material without causing damage to the structural material or materials. As noted, the difficulty is in the removal of sacrificial material from within the passage and particularly from successively deeper regions as etchant cuts deeper into the surrounded sacrificial material. The etchant in the passage can become saturated with dissolved sacrificial material and the removal of saturated etchant and replenishment of the partially cleared passage with fresh etchant can become more and more challenging. These difficulties are addressed by various embodiments of the present invention.

In each of the embodiments of the present invention, etching of sacrificial material occurs selectively before completion of the passage so that enhanced access area and proximity to material to be etched may be advantageously used. In some embodiments, such etching may occur prior to formation of a capping layer (e.g. before the formation of layer 7 of the structure of FIG. 5) while in other embodiments, a structural modification may occur to the device itself to provide an access region for etching with enhanced ability to access and remove sacrificial material while providing a region that can be readily sealed.

Figure 7A:
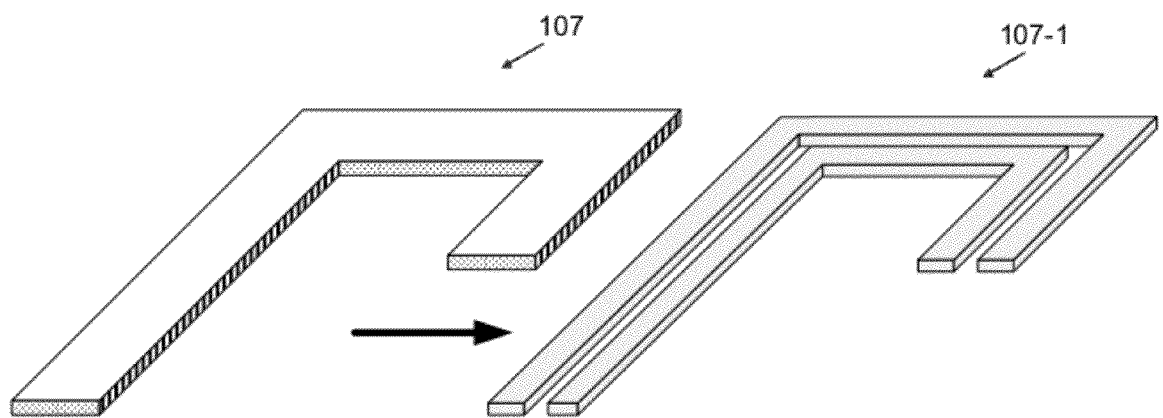
FIGS. 7A-8C provide examples of modified capping layers that may be advantageously used in various embodiments of the invention.

FIGS. 7A-8C provide examples of modified capping layers that may be advantageously used in various embodiments of the invention. The right side of FIG. 7A provides a replacement structural material configuration 107' for the top layer of the passage of the structure of FIG. 5 which provides a narrowed access region for etching sacrificial material from the partially completed passage. The left side of FIG. 7A provides the original structural material configuration 107 for the capping layer of FIGS. 5 and 6G3 which is replaced. FIG. 7B provides a view of the layers of structural and sacrificial material as they would look when the replacement structure 107' is formed. After formation of this layer, a masking material may be applied and patterned to have an opening over most or all portions of the access region to allow selective etching. In some variations of this embodiment, the regions above the ends of passage may be covered with masking material, e.g. to a length that approximates the depth or width of the passage (or somewhat longer) such that etching of the sacrificial material from the passage does not cause etching of the sacrificial material from the ends of the passage which may cause refilling problems. In other variations, the ends of the passage may be capped with structural material that may be removed via dicing, laser ablation, laser cutting, or the like before or after layer formation is complete and before or after removal of sacrificial material.

Figure 7B:
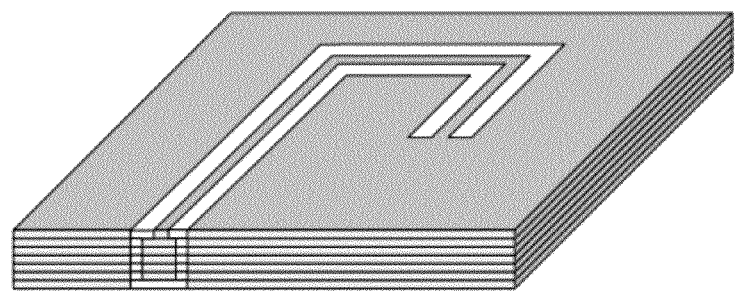
Figure 8A:
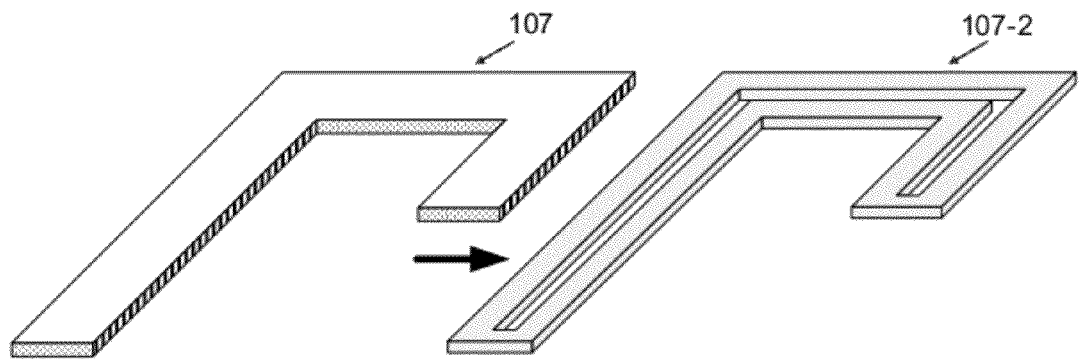
Figure 8B:
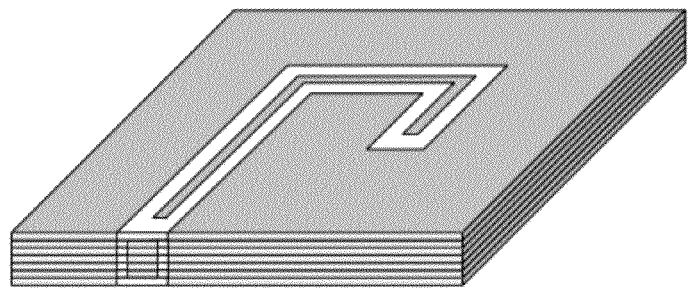
Figure 8C:
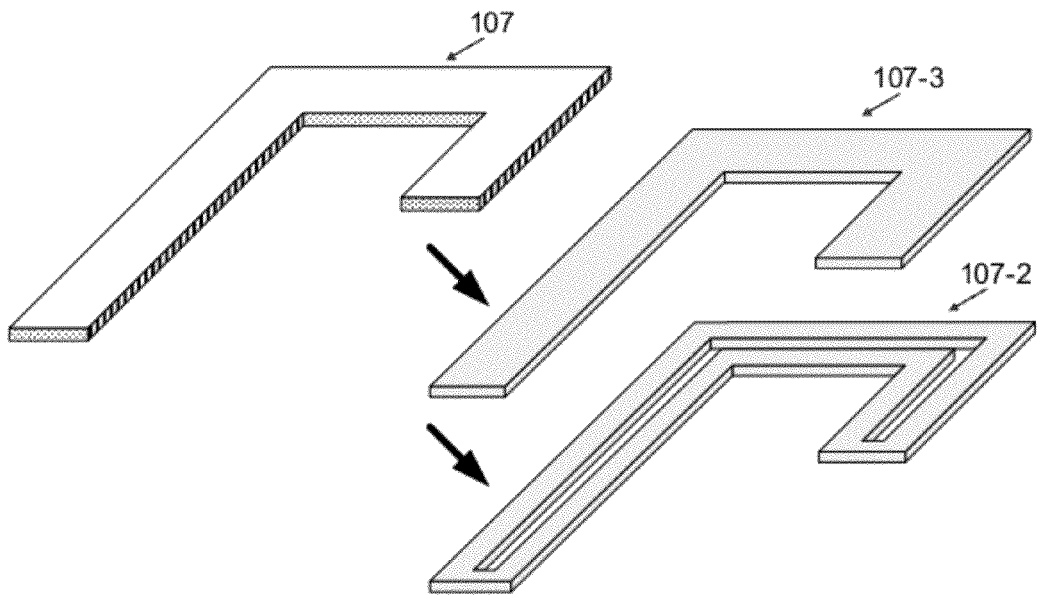

FIGS. 8A and 8B are analogous to FIGS. 7A and 7B with the exception that a replacement structural material configuration 107" for the seventh layer includes structural material ends which provide etching shields as well as capping material. Depending on how access region filling occurs, the opening in the access region may be filed with structural material or sacrificial material and thus there may be need, or no need, for additional structural material capping of the channel. FIG. 8C provides an example of a two layer structural material replacement for the structural material that formed layer 7 of the example of FIG. 5 wherein the original capping layer 107 is divided into an access region layer 107-1 and a capping layer 107-2.

Figure 9A:
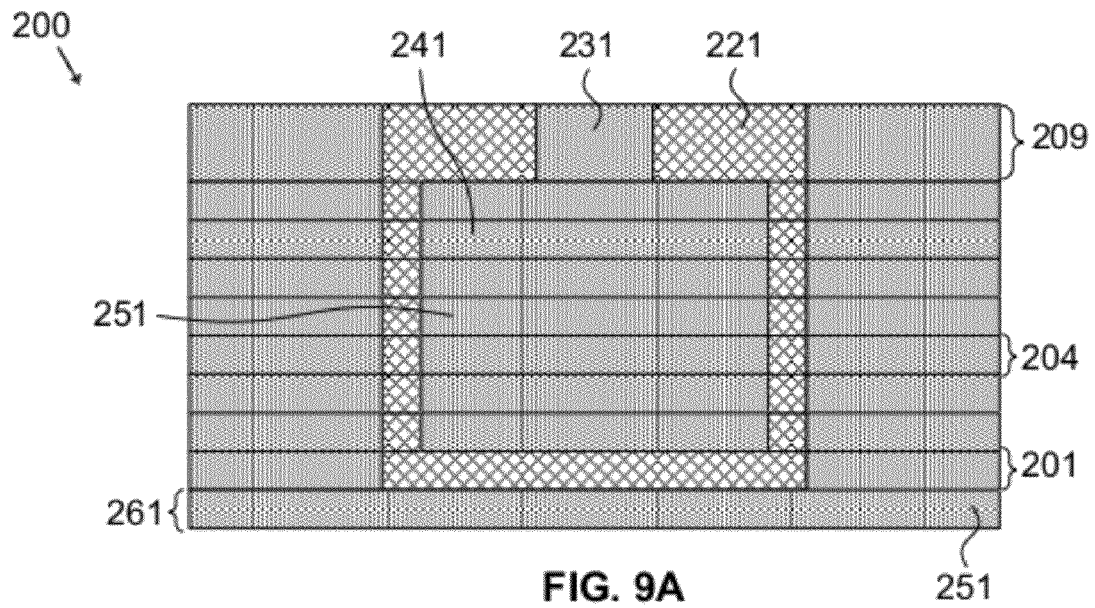
Figure 9B:
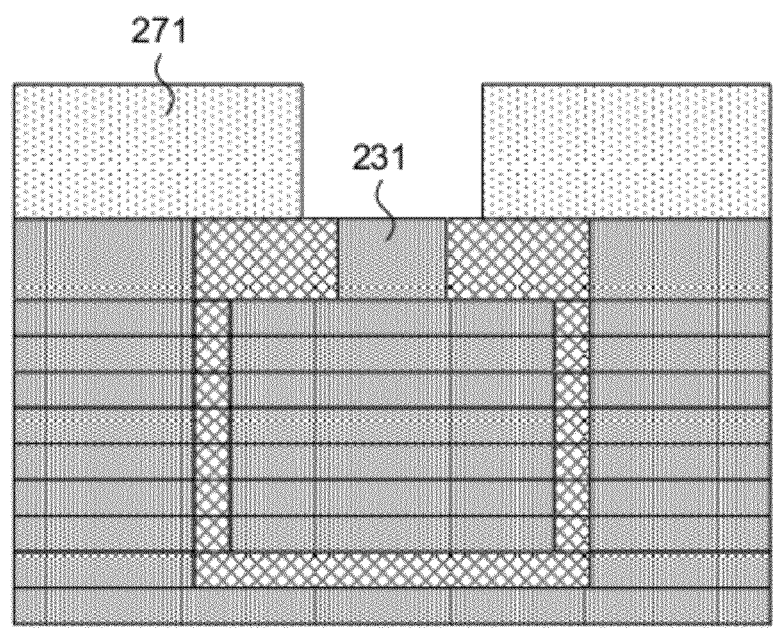
Figure 9C:
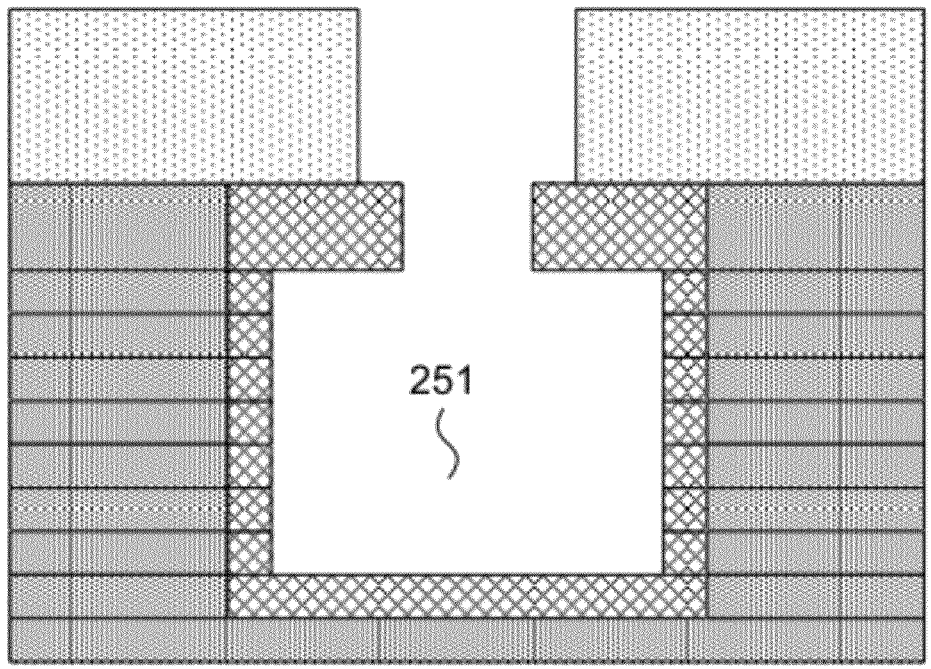
Figures 1, 9D:
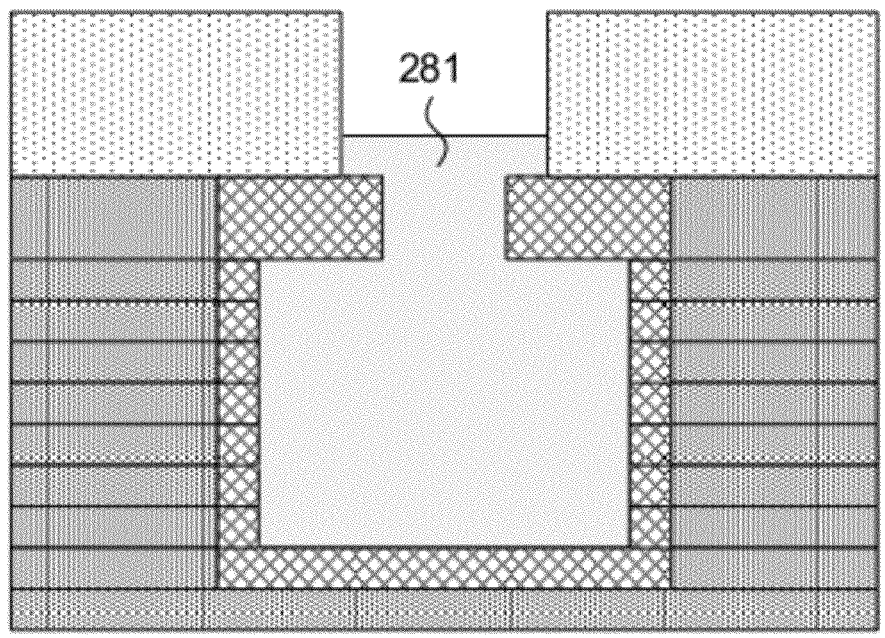
Figures 2, 9D:
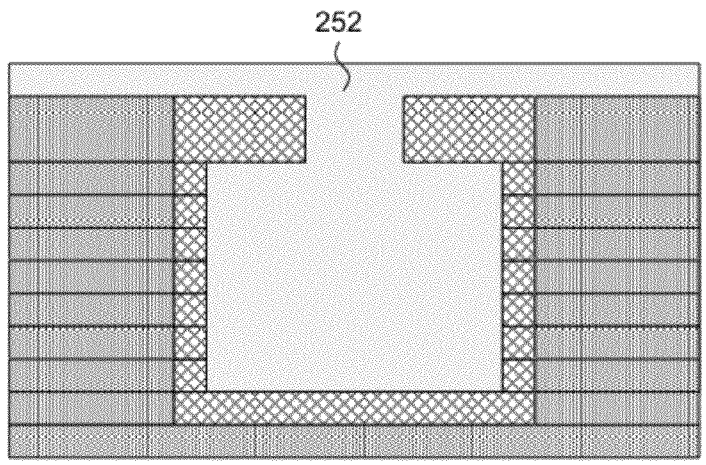
Figure 9G:
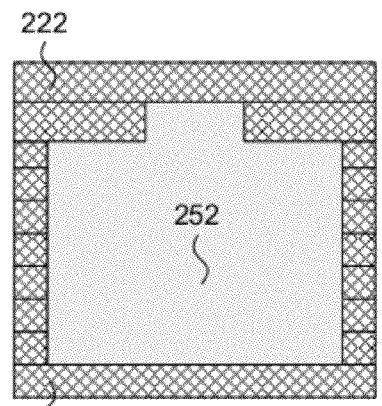
Figure 9E:
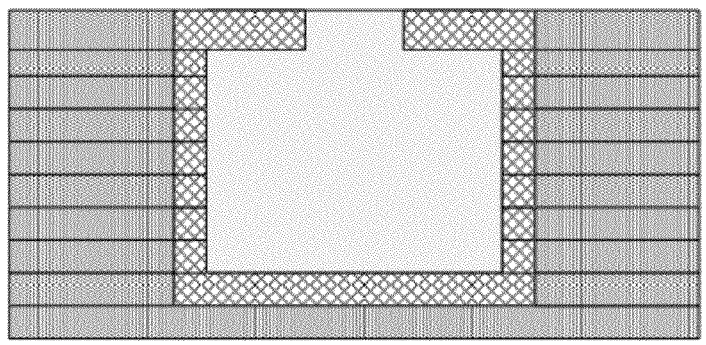
Figure 9H:
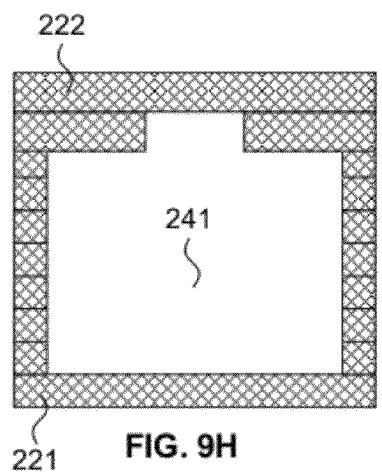
Figure 9F:
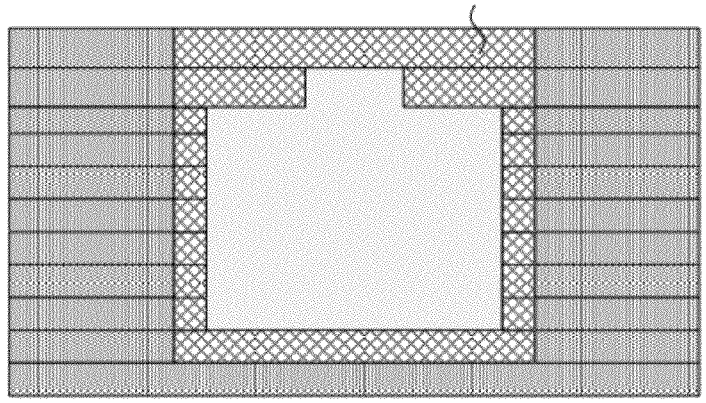

FIGS. 9A-9H illustrate various steps in a process of a first exemplary embodiment of the invention wherein original sacrificial material is removed from the interior of the passage prior to completion of formation of the passage and then a secondary and more easily removed sacrificial material is made to fill the passage, and thereafter passage capping and layer formation continues as appropriate. In this embodiment, the secondary sacrificial material may be, for example, a wax, or other meltable material and additional material may be applied to the secondary sacrificial material after planarization via mushrooming, application of a seed layer, or the like. FIG. 9A provides an end view of a partially formed structure 200 including a passage 221 filed with sacrificial material 251 surrounded by layers 201-209 of a structural material 221, and including an access region 231. The figure illustrates the state of the process after formation of nine layers 201-209 on a release layer 261 that would be located on a substrate (not shown) and prior to completion of formation of the passage (i.e. an access region remains but is filled with sacrificial material). FIG. 9B depicts the state of the process after a mask 271 (e.g. photoresist mask) is formed to allow selective etching of sacrificial material from the passage via selected portions of the opening or openings provided by the access region or regions. FIG. 9C depicts the state of the process after the sacrificial material has been etched away to clear part or all of the passage 251. FIGS. 9D-1 and 9D-2 depict the filling of the passage with a secondary sacrificial material 252 either selectively (FIG. 9D-1) or in a blanket manner (FIG. 9D-2). FIG. 9E depicts the state of the process after planarization of the secondary sacrificial material and the structural material and probably the original sacrificial material that remains external to the passage. In some alternative embodiments, the original sacrificial material need not be planarized and if the secondary sacrificial material was underfilled into the passage or removed from the access region (e.g. by squeegee or other means), it also may not undergo planarization. FIG. 9F shows the state of the process after formation of a next layer which includes capping structural material 222 as well as surrounding sacrificial material. FIG. 9G shows the state of the process after removal of the surrounding sacrificial material 251 while FIG. 9H shows the state of the process after removal of the secondary sacrificial material 252 as well thus leaving passage 241 hollow.

Figure 10A:
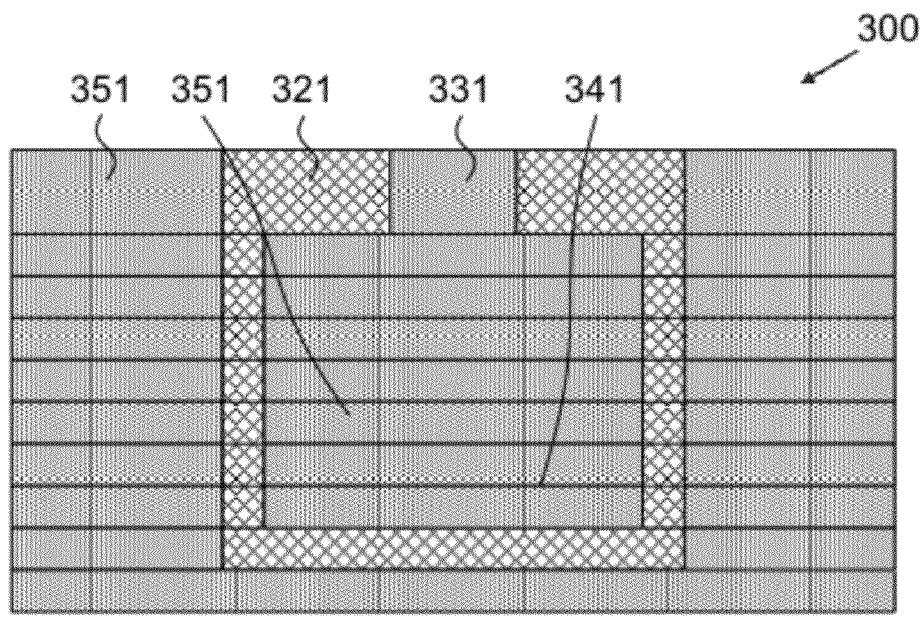
Figure 10B:
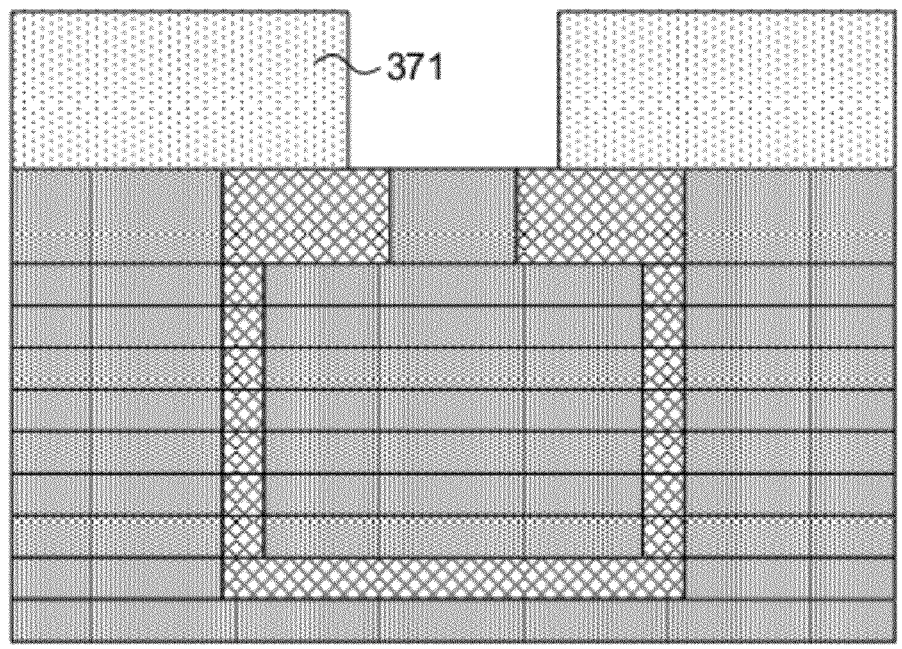
Figure 10C:
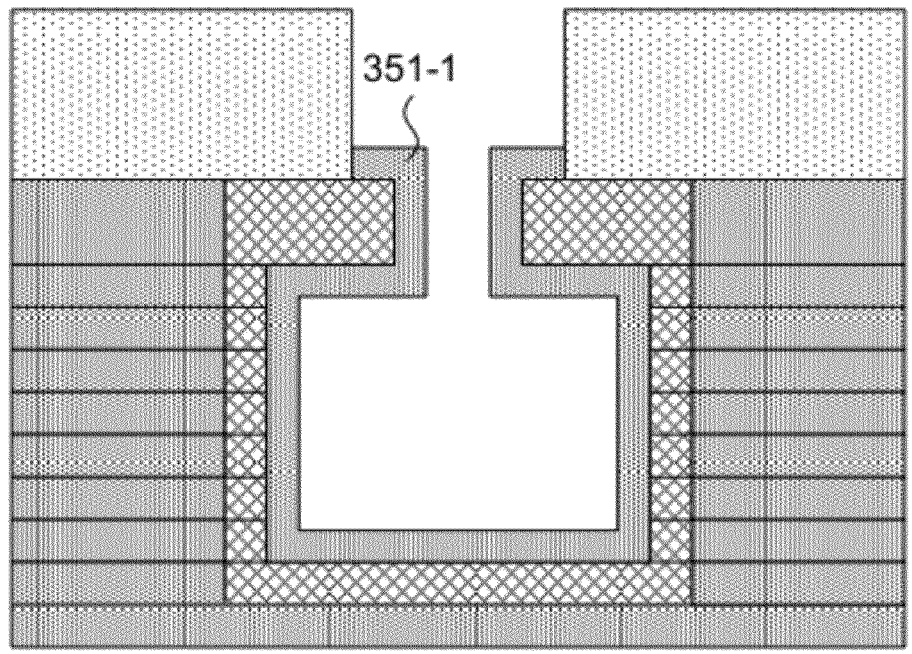
Figures 1, 10D:
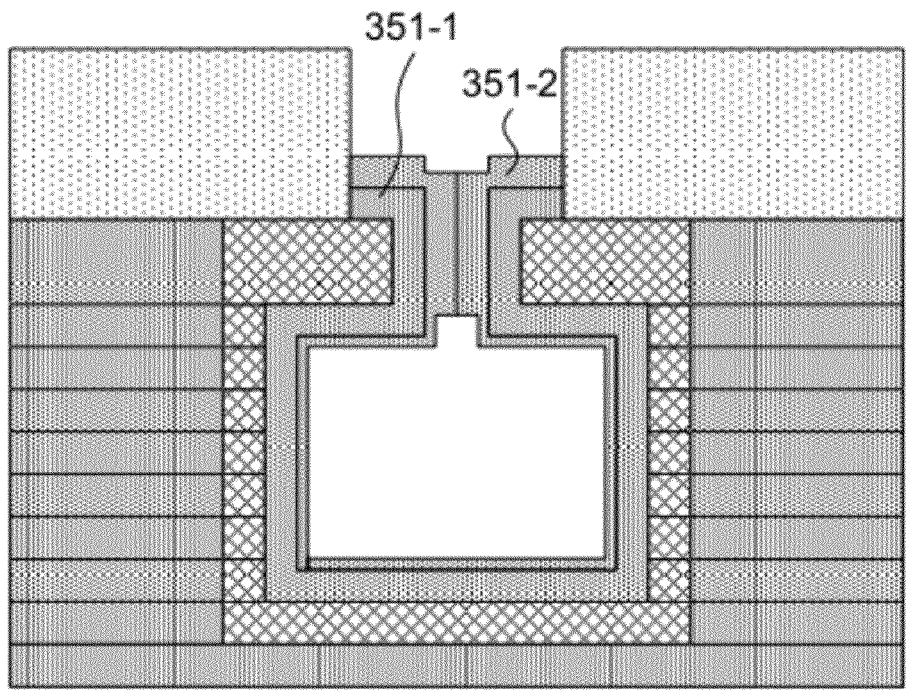
Figures 2, 10D:
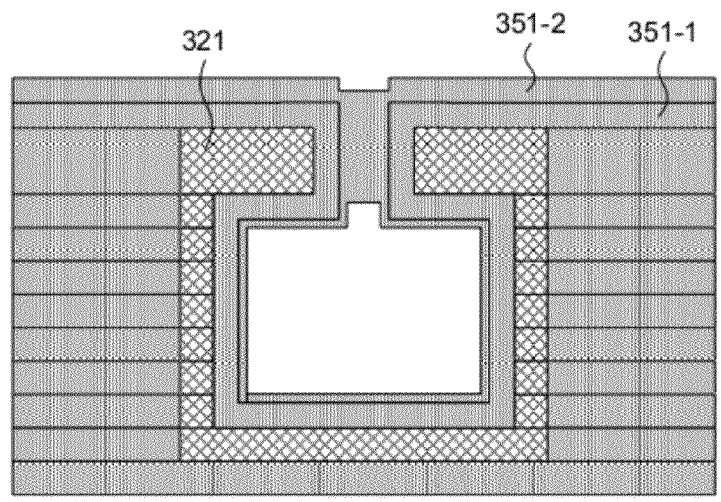
Figure 10E:
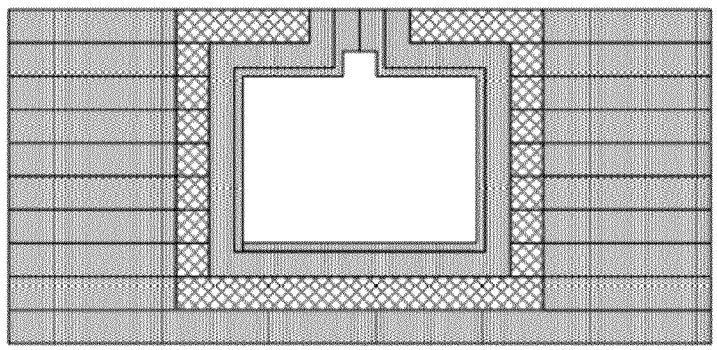
Figure 10G:
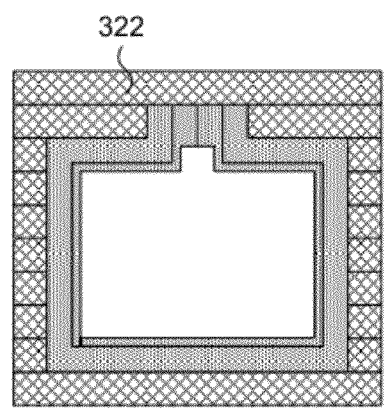
Figure 10F:
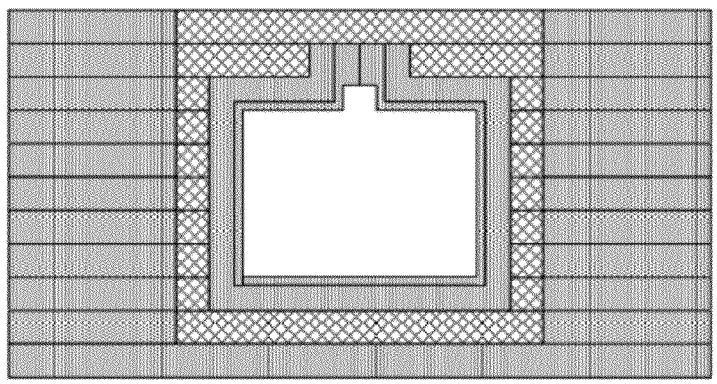
Figure 10H:
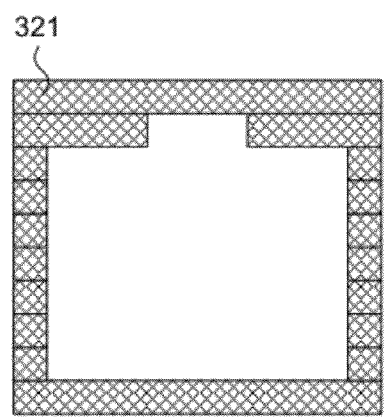

FIGS. 10A-10H illustrate various steps in a process of a second exemplary embodiment of the invention wherein original sacrificial material is removed from the interior of the passage prior to completion of formation of the passage and then the passage is closed by pinch off (or lateral bridging) of sacrificial material with only partial refilling of the passage with solidified secondary material and thereafter passage capping and layer formation continues as appropriate. FIG. 10A provides and end view of a partially formed structure 300 including a passage 341 filled with sacrificial material 351 surrounded by structural material 321 with an access region 331, The figure illustrates the state of the process after formation of nine layers and prior to completion of formation of the passage (i.e. an access region remains but is filled with sacrificial material). FIG. 10B depicts the state of the process after a mask 371 (e.g. photoresist mask) is formed to allow selective etching of sacrificial material from the passage via selected portions of the opening or openings in the access region or regions 331. FIG. 10C depicts the state of the process after the sacrificial material has been etched away to clear part or all of the passage 341 and after a part of a "pinch off" deposition or series of depositions has occurred 351-1. FIGS. 10D-1 and 10D-2 depict additional deposition 351-2 associated with pinch off such that the access region becomes closed without the complete refilling of the passage with sacrificial material. In FIGS. 10C and 10D-1 pinch off depositions occur in a selective manner while in FIG. 10D-2 the deposition or depositions occur in a blanket manner. As shown in FIG. 10E planarization of the structural material and of the pinch off material has occurred to leave the partially formed structure in condition for formation of additional layers. FIG. 10F shows the state of the process after formation of a next layer which includes capping structural material as well as surrounding sacrificial material. FIG. 10G shows the state of the process after removal of the surrounding sacrificial material while FIG. 10H shows the state of the process after removal of the sacrificial material that was coating part of the interior walls of the passage.

A process according to a variation of the second embodiment may include the following steps: (a) form the structure normally up through the penultimate capping layer with the exception that the penultimate capping layer may be initially planarized at a boundary level which is above a desired boundary level of the penultimate capping layer; (b) locate a mask on the penultimate layer with openings located over at least a portion of the etching openings (access region openings); (b) etch the sacrificial material from the etching openings and from at least a portion of passageway along a substantial length of the passage and to a depth that is greater (e.g. substantially greater) than a width of the etching openings; (c) with the mask still in place or a new patterned mask located in place or without a mask, deposit sacrificial material to fill the etching opening with it being understood that some plating into the released passage will occur but where the passage remains at least partially unfilled as a result of pinch off or bridging that occurs around the narrowed access region; (d) planarize the sacrificial material covered penultimate capping layer to a desired height for the penultimate capping layer; (e) form the upper capping layer and any additional layers according to normal processing; (f) etch away the sacrificial material wherein the sacrificial material inside the passage is more easily removed by the initial presence of a void resulting from the pinch off.

Figure 11A:
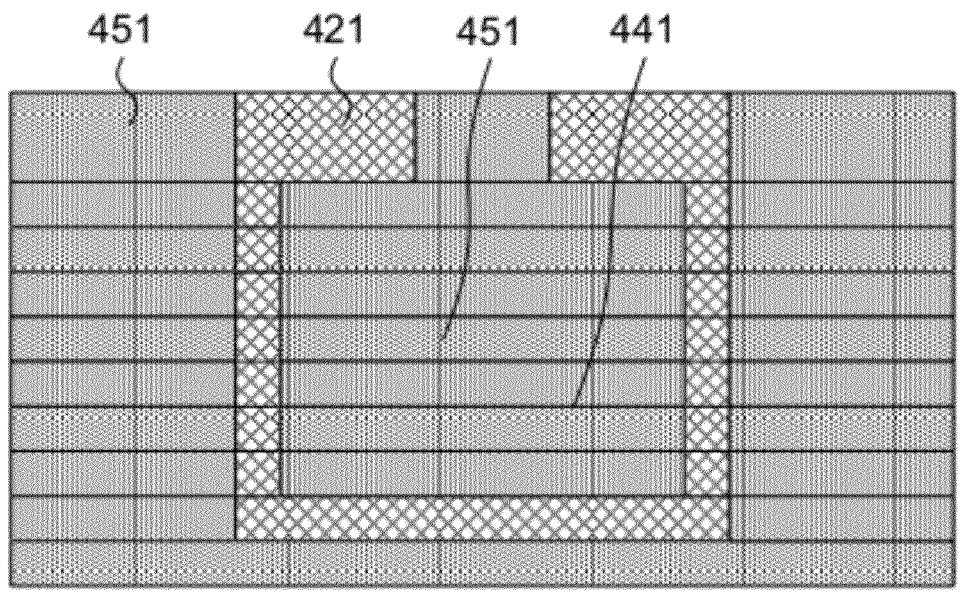
Figure 11B:
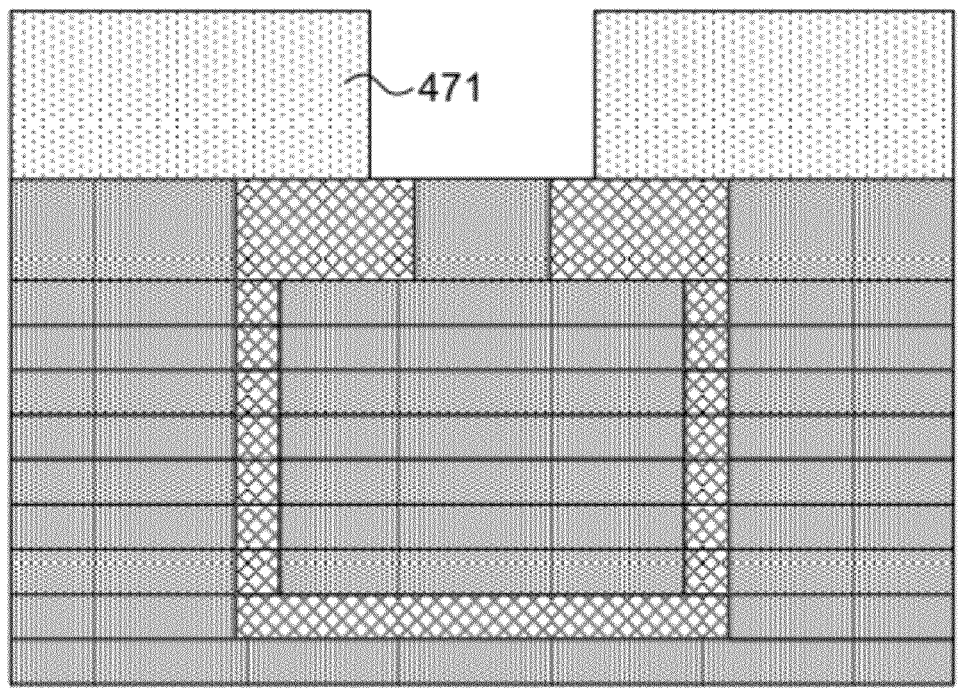
Figure 11C:
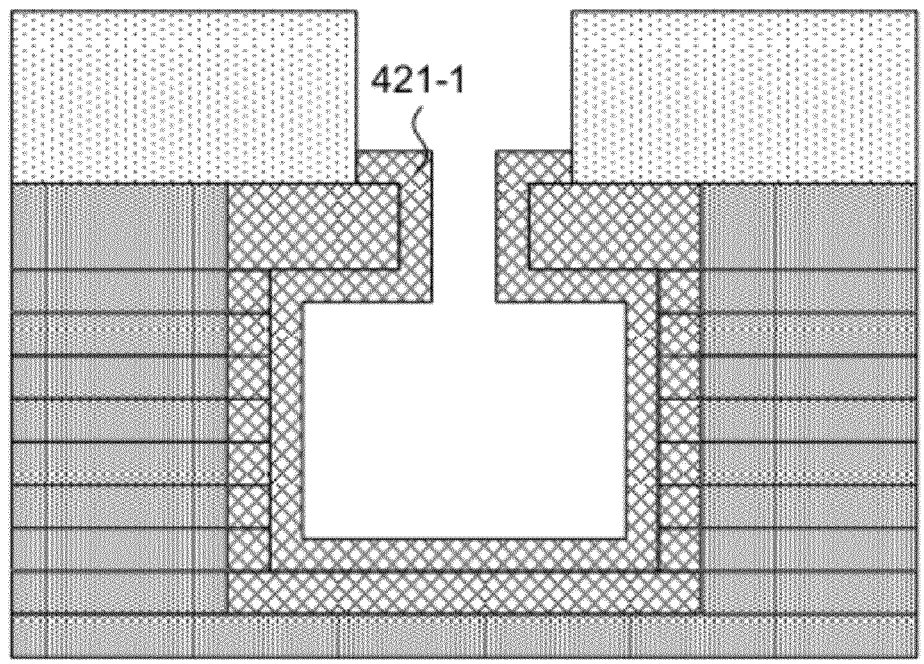
Figures 1, 11D:
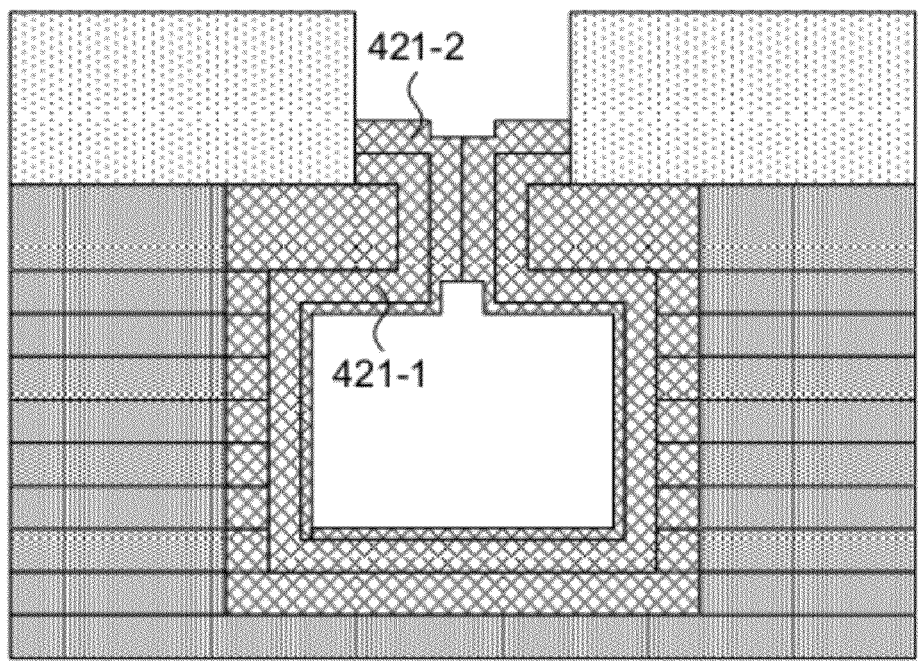
Figures 2, 11D:
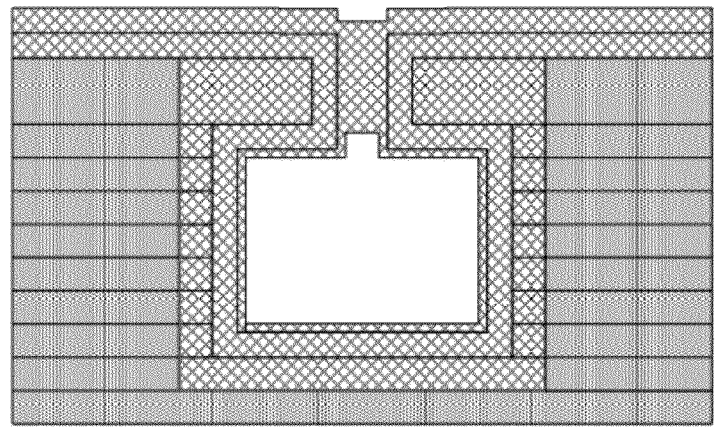
Figure 11E:
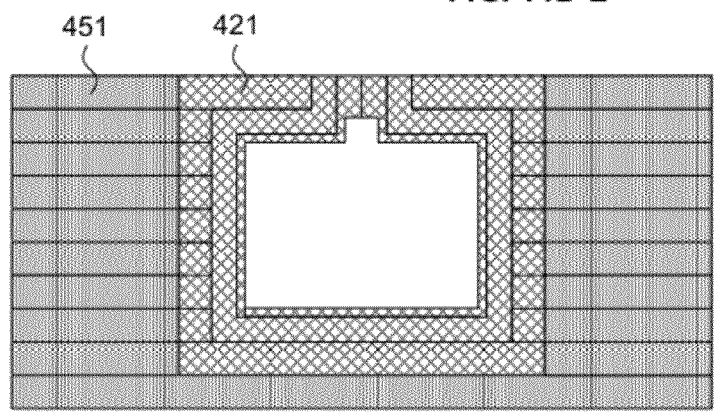
Figures 1, 11F:
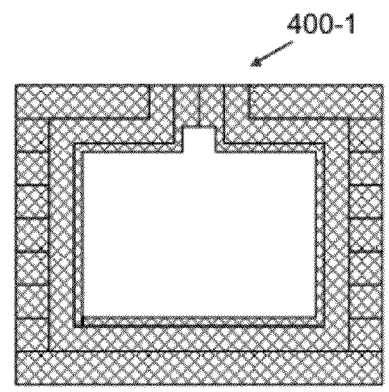
Figures 2, 11F:
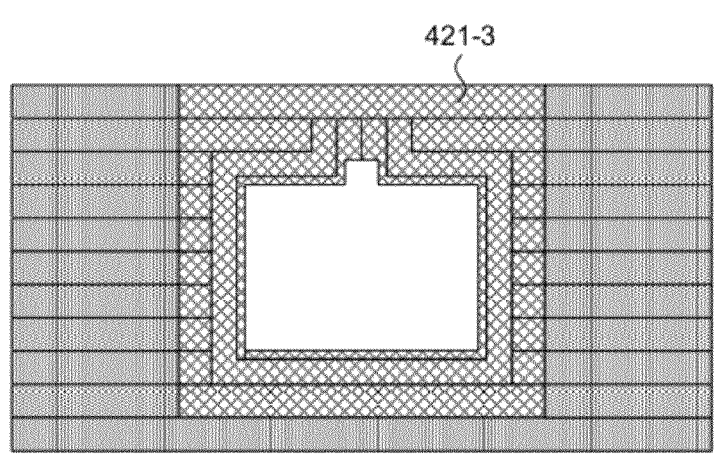
Figure 11G:
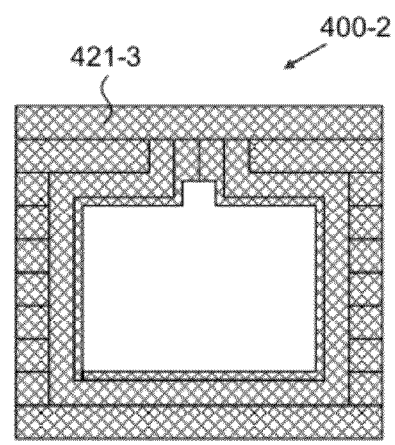

FIGS. 11A-11G illustrate various steps in a process of a third exemplary embodiment of the invention wherein original sacrificial material is removed from the interior of the passage prior to completion of formation of the passage and then the passage is closed by pinch off of structural material with only partial refilling of the passage with solidified material. After formation of the pinch off layer, additional layer formation can continue as appropriate and use of a separate layer for additional capping structural material may not be necessary as the access region was filled with structural material during the pinch off deposition or depositions. FIG. 11A provides and end view of a partially formed structure 400 including a passage 441 filled with sacrificial material 451, surrounded by structural material 421 which in turn is surrounded by sacrificial material 451. The figure illustrates the state of the process after formation of nine layers and prior to completion of formation of the passage (i.e. an access region remains but is filled with sacrificial material). FIG. 11A also show the presence of narrowed access region 431 (as compared to the width of the body of the passage. FIG. 11B depicts the state of the process after a mask 471 (e.g. photoresist mask) is formed to allow selective etching of sacrificial material from the passage via selected portions of the opening or openings in the access region or regions 431. FIG. 11C depicts the state of the process after the sacrificial material has been etched away to clear part or all of the passage and after a part of a "pinch off" deposition or series of depositions of structural 421-1 has occurred and some structural material has been deposited into the cleared passage and the opening in the access region has narrowed. FIGS. 11D-1 and 11D-2 depict additional deposition of structural material 421-2 associated with pinch off such that the access region becomes closed without the complete filling of the cleared passage with structural material. In FIGS. 11C and 11D-1 pinch off depositions occur in a selective manner while in FIG. 11D-2 the deposition or depositions occur in a blanket manner. As shown in FIG. 11E planarization of the structural material and the pinch off structural material has occurred to leave the partially formed structure in condition for formation of additional layers. FIG. 11F-1 shows the state of a variation of the process after etching away sacrificial material to release the structure 400-1. FIG. 11F-2 shows an alternative state of the process where an additional layer is deposited and planarized to provide further capping of the access region with structural material 421-3. FIG. 11G shows the state of the process after removal of the surrounding sacrificial material following FIG. 11F-2 results in the release of the alternative structure 400-2.

A process according to a variation of the third embodiment may include the following steps: (a) locate one or more etching openings in a passage capping layer that might otherwise be solid to provide an elongated access region; (b) form the structure normally up through the capping layer with the exception that the capping layer may be initially planarized at a boundary level which is above a desired boundary level of the capping layer; (c) locate a mask on the capping layer with openings located over at least a portion of the etching openings; (d) etch the sacrificial material from the etching openings and from at least a portion of passage along a substantial length of the passage and to a depth that is greater (e.g. substantially greater) than a width of the etching openings; (e) with the mask still in place or a new patterned mask located in place or with no mask in place, deposit structural material to fill the etching opening with it being understood that some plating into the cleared passage will occur but where the passage remains at least partially unfilled as a result of pinch off; (f) planarize the capping layer to a desired final height for the capping layer; (g) form any additional layers according to normal processing; and (h) etch away the sacrificial material.

Additional embodiments, e.g. fourth and fifth embodiments might be similar to those of the second and third embodiments but where no mask is used during etching to clear the passage as a sacrificial deposit of structural material is located over the penultimate capping layer or capping layer with openings over the etch holes and after etching, planarization is used to remove this structural material shield. Examples of similar procedures are described in U.S. Pat. No. 7,384,530.

Another group of alternative embodiments might, in part, use the opening and sealing techniques as taught in U.S. Pat. No. 7,160,429 to allow etchings through the access regions and sealing thereafter.

Additional features and variations of the various embodiments and their alternatives will be understood from the illustrations of FIGS. 12A-19.

Figure 12A:
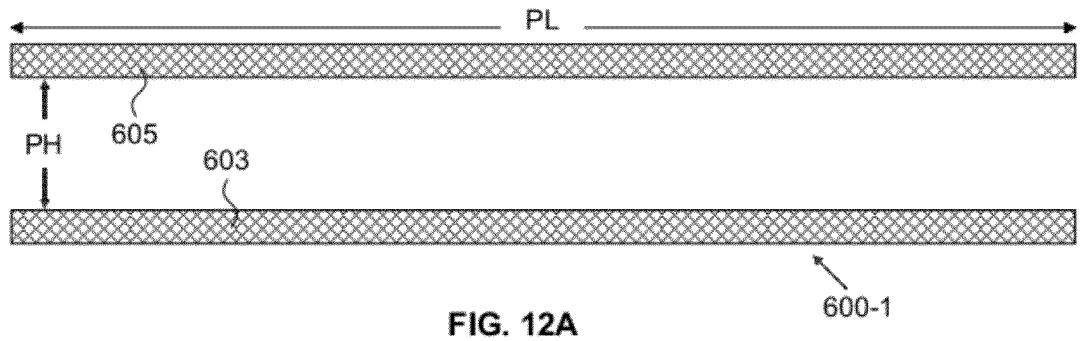
FIG. 12A depicts a side cut view of a passage according to some embodiments of the invention where the bottom surface or floor of the passage is separated from a top surface of ceiling by a substantially uniform spacing along the length of the passage.

FIG. 12A depicts a side cut view of a passage 600-1 according to some embodiments of the invention where the bottom surface or floor 603 of the passage is separated from a top surface of ceiling 605 by a substantially uniform spacing PH along the length of the passage PL.

Figures 1, 12B:
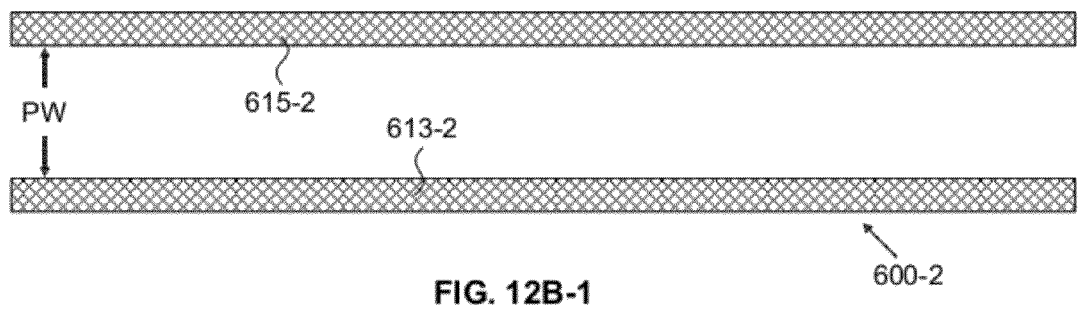
Figures 2, 12B:
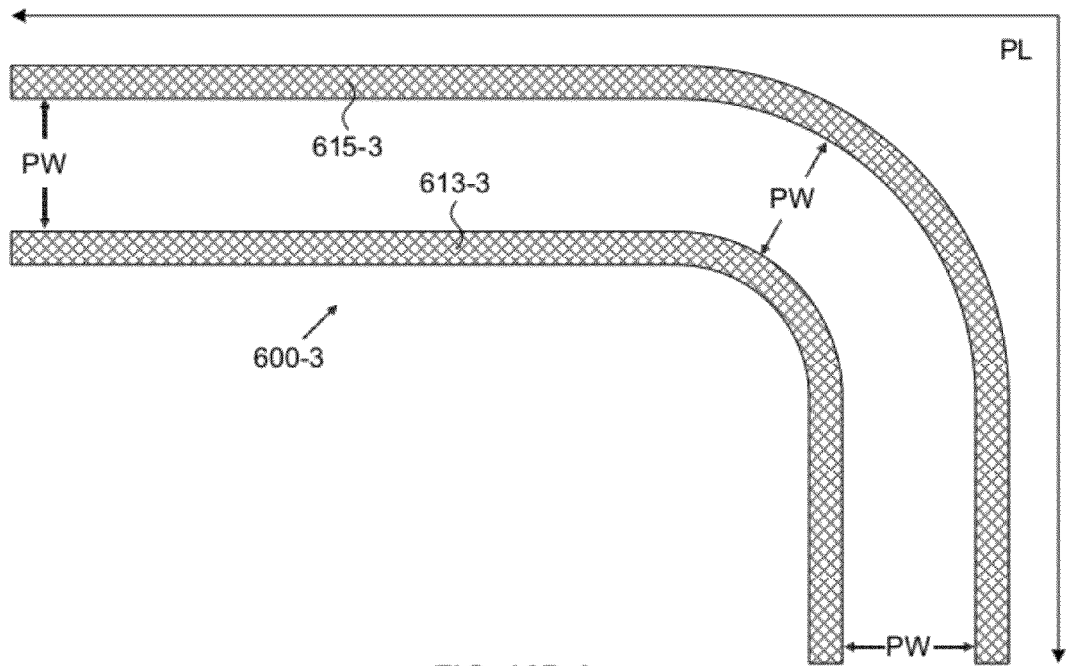

FIGS. 12B-1 and 12B-2 depict top views of a passage 600-2 and 600-3, respectively, according to some embodiments of the invention where a first side 613-2 & 613-3 of the passage is separated from a second 615-2 & 615-3 by a substantially uniform spacing PW along the length of the passage PL wherein FIGS. 12B-01 depicts a straight passage while FIG. 12-B depicts a passage with a curve or bend.

Figure 13A:
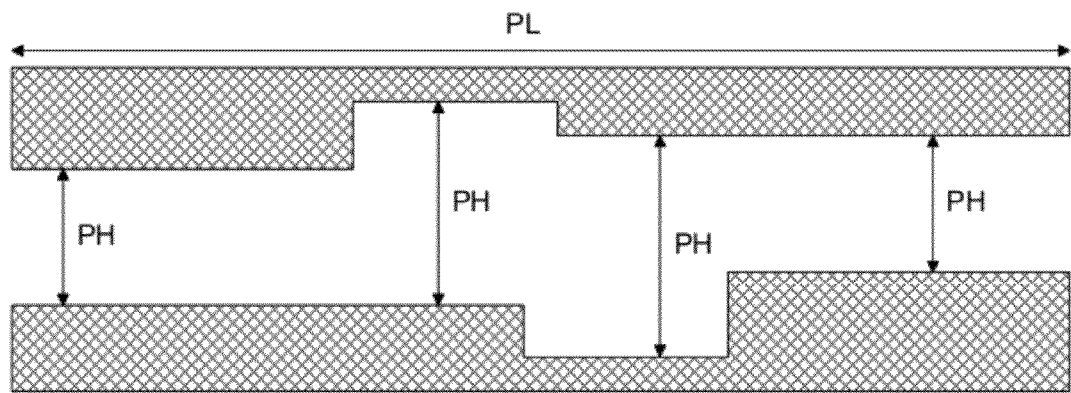
FIGS. 13A and 13B respectively depict a side view and a top view of a passage that illustrates that the height need not be constant along the length of passage and the width need not be constant along the length of passage in some embodiments.
Figure 13B:
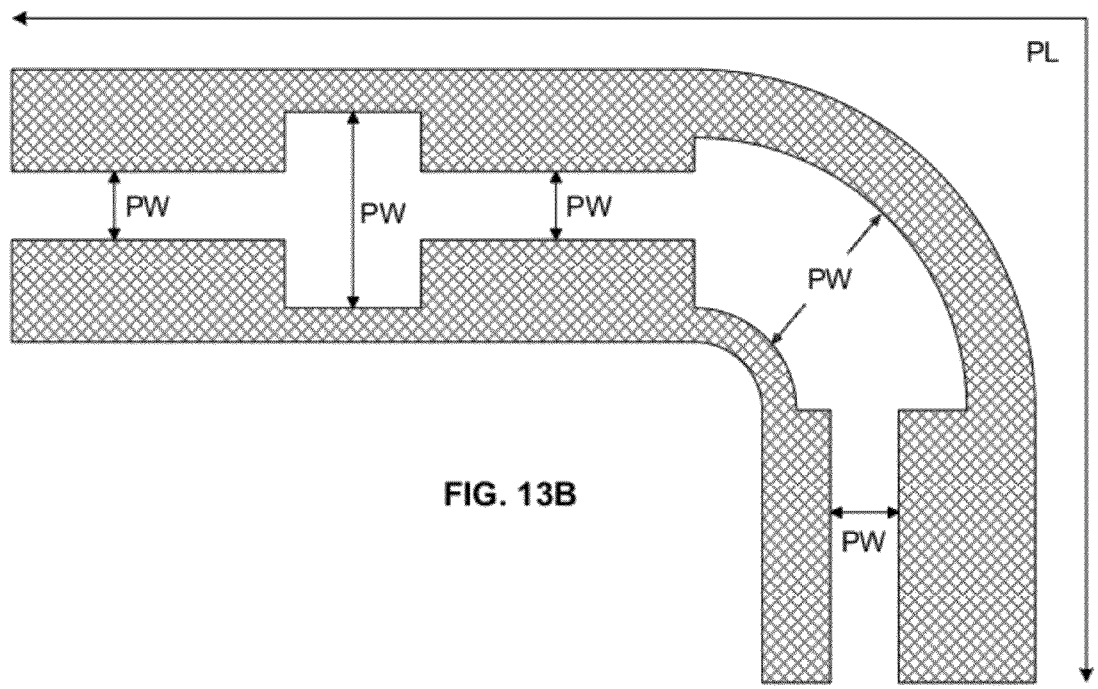

FIGS. 13A and 13B respectively depict a side view and a top view of a passage 300-1 and 300-2 wherein the height PH is not constant along the length of passage 300-1 and the width PW is not constant along the length of passage 300-2.

Figure 14A:
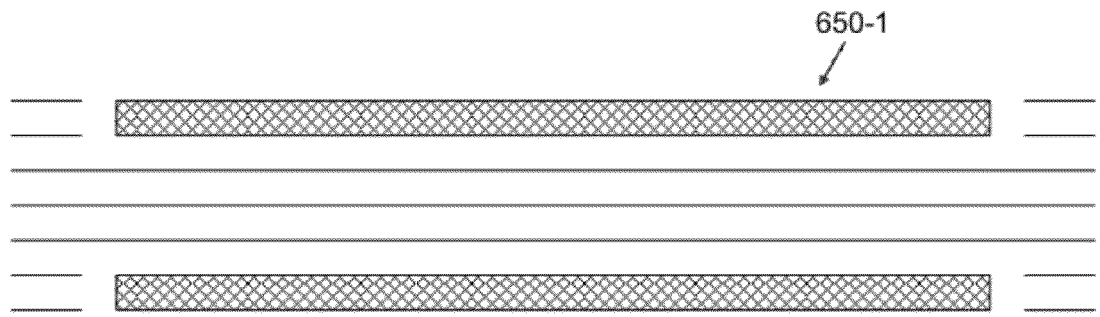
Figures 1, 14B:
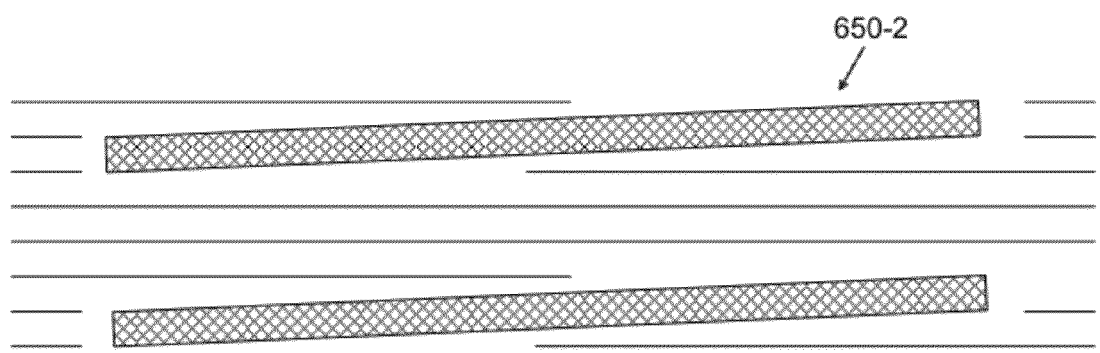
Figures 2, 14B:
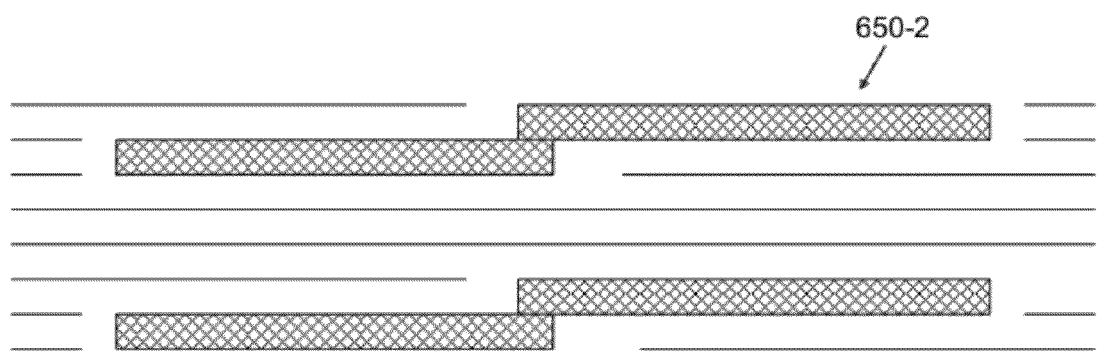

FIGS. 14A, 14B-1, and 14B-2 provide side view of example passages 650-1, 650-2, and 650-2' respectively along with a series of lines that define layer boundary levels as the passages may be fabricated according to some embodiments of the invention. In FIG. 14A the passage is formed so that its axial direction or length runs parallel to the planes of the layers, while in FIG. 14B-1 the passage is shown to have a axial direction or length that is at an angle to the plane of the layers. FIG. 14B-2 depicts the passage of FIG. 14B-1 as it might be formed from a plurality of adhered layers.

FIGS. 15A-15D depict top cut views of a number of passages having different lengths and shapes which might be formed using the various embodiments of the invention wherein the different passage have different level of complexity. FIG. 15A depicts a passage that includes a 90 degree bend. FIG. 15B depicts a passage having two 90 degree bends but which turn in opposite directions (total bend=180 degrees). FIG. 15C depicts a passage that includes two 90 degree bends that turn in the same direction (total bend=180 degrees). FIG. 15D depicts a passage that includes three 90 degree bends that turn in the same direction (total bend=270 degrees). The more complex a passage, typically the more difficult it is to remove sacrificial material and thus the increasing advantage that the various embodiments of the present invention can offer.

Figure 16A:
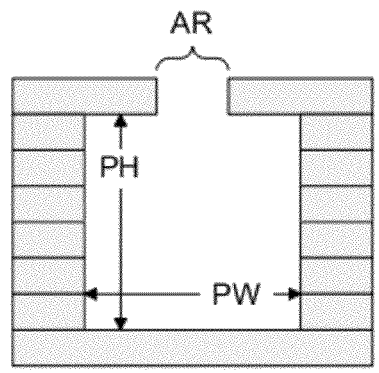
FIGS. 16A-16E depict end views of example passages having a number of different cross-sectional configurations to which some embodiments of the present invention can apply.
Figure 16B:
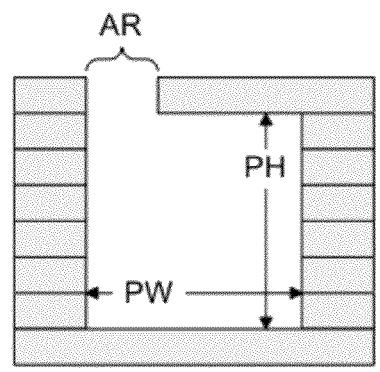
Figure 16C:
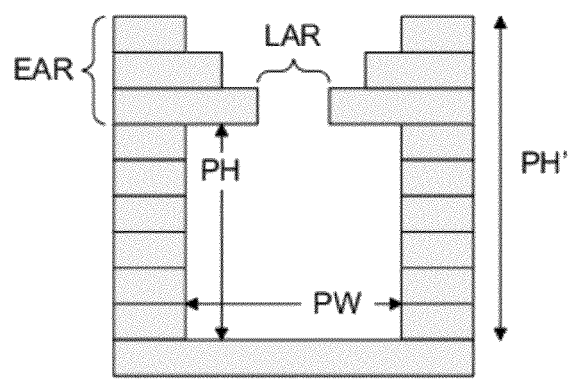
Figure 16D:
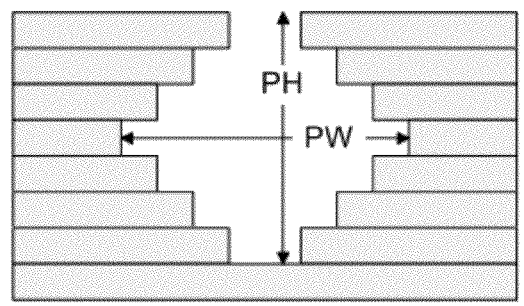
Figure 16E:
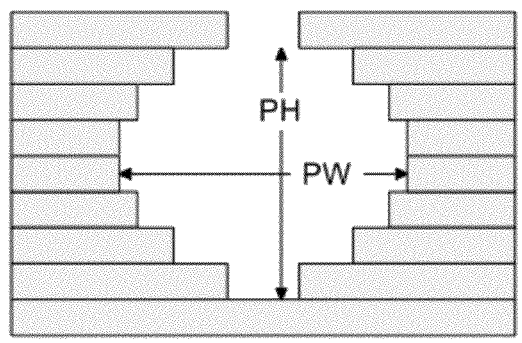

FIGS. 16A-16E depict end views of passages having a number of different configurations. FIG. 16A has a centered access region AR, rectangular configuration with a height PH and a width PW. FIG. 16B has an off-center access region AR, rectangular configuration with a height PH and a width PW. FIG. 16C has rectangular configuration with a center access region AR, which has an extended height EAR, a width limiting feature LAR and wherein the passage has an effective height of PH and width of PW even though at the time of selective etching the height may have been PH' as the capping will occur in the LAR region, the effective height is reduced. FIG. 16D has a centered access region AR, stepped diamond configuration and a maximum height PH and a maximum width PW. FIG. 16E has a centered access region AR, stepped circular configuration and a maximum height PH and a maximum width PW. Depending on the purpose of the passage, each of these configurations and numerous others might be desirable for a given application and whose formation may benefit from the various embodiments of the invention.

Figure 17A:
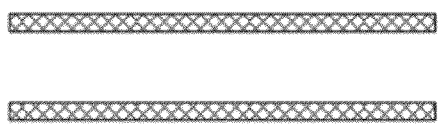
FIGS. 17A-17D provide cut side views of various passages with different end configurations while FIG. 17E provides a cut top view of a passage with a different configuration and ends.
Figure 17B:
Figure 17C:
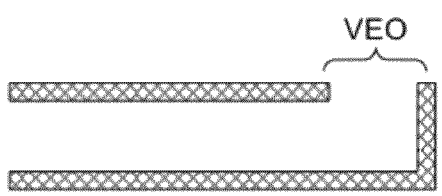
Figure 17D:
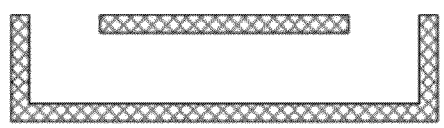
Figure 17E:
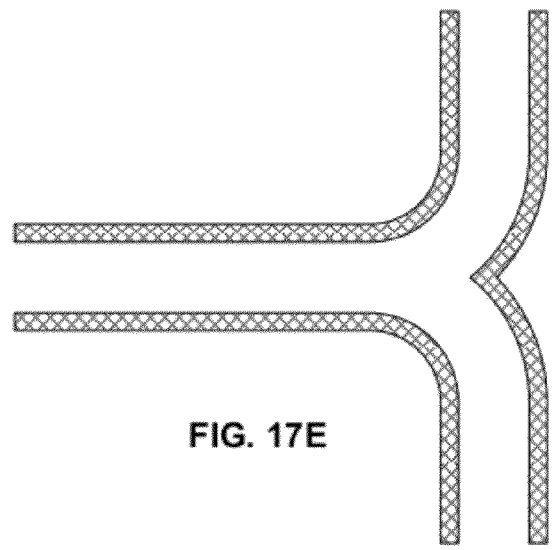

FIGS. 17A-17D provide cut side views of various passages with different end configurations while FIG. 17E provides a cut top view of a passage with a different configuration and ends. FIG. 17A provides an illustration of a simple passage with two ends which remain open during formation or which are opened by removal of an end cap material. FIG. 17B provides an illustration of another simple passage but this time with a single open end. FIG. 17C provides an illustration of another simple passage but this time with a horizontally or laterally facing open end and with a vertical facing open end. During formation the vertical open end VEO, in some embodiments, would be filled with sacrificial material and would remain filled with it until release occurs or it may connect to another passage that is formed as part of a number of subsequent layers. FIG. 17D provides an illustration of another simple passage but with two vertical facing ends. FIG. 17E provides an illustration of a bifurcated passage which has one end split into two separate ends.

Figure 18A:
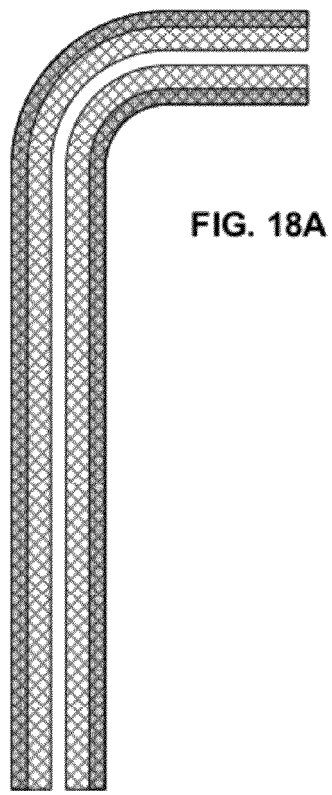
FIGS. 18A-18E provide top view illustrations of examples of different types of access regions that may be used in conjunction with some embodiments of the invention FIG. 19 provides an illustration of a manifold which is formed along with a plurality of structures to aid in the removal of remaining sacrificial material from passages by allowing directed flow of an etchant to occur.
Figure 18B:
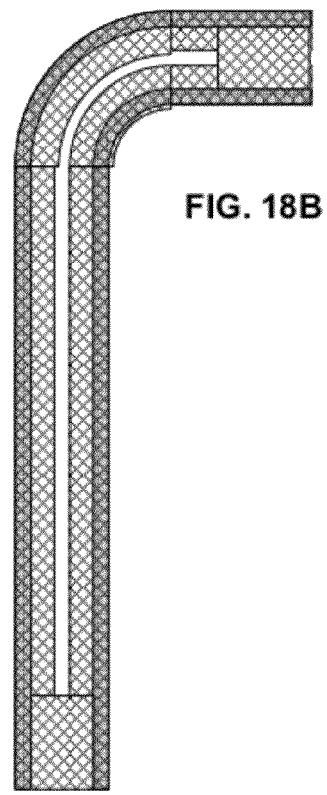
Figure 18C:
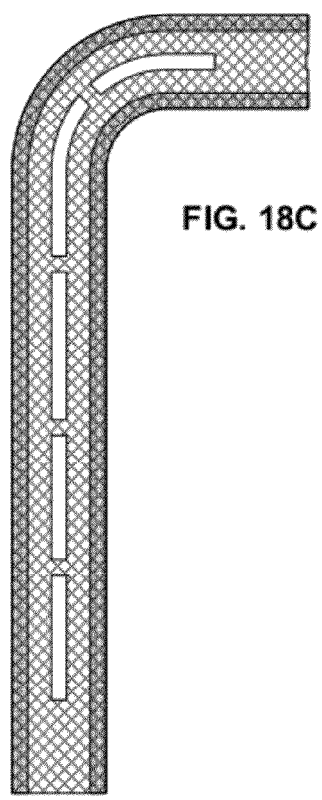
Figure 18D:
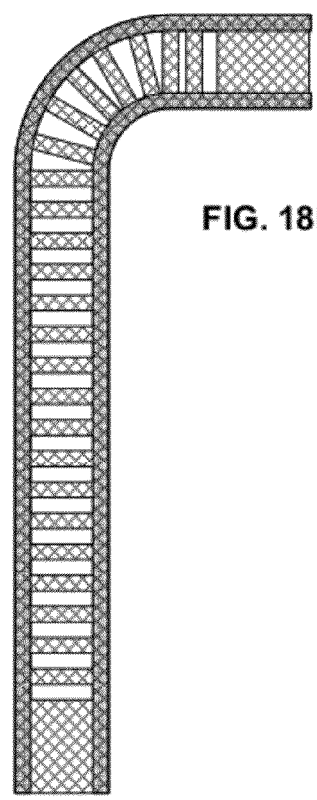
Figures 18E, 19:
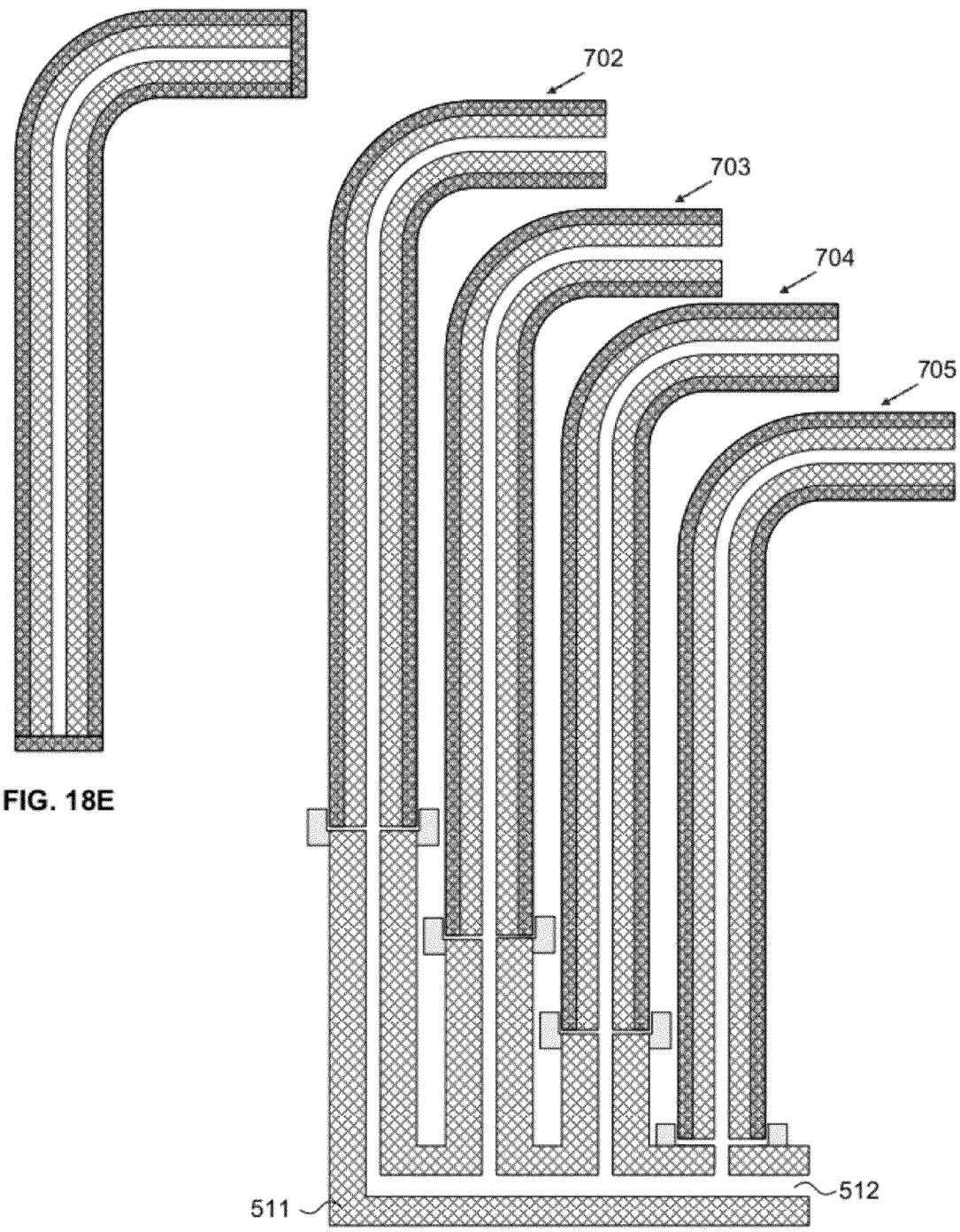

FIGS. 18A-18E provide illustrations of examples of different types of access regions. FIG. 18A illustrates an access region that has a length equivalent to that of the passage itself. During selective etching using the access region of FIG. 18A, the ends may be covered with a masking material to ensure that unintended etching outside the passage does not occur. When such a masked access region is used. pinch off may be performed with either structural or sacrificial material but as the end will need capping, a capping layer including structural material ends may be desirable or required. FIG. 18B provides an access region like that of FIGS. 8A-8C where the access region length is short of the passage length due to the presence of structural material caps. FIG. 18C provides an access region that is divided into a plurality of shorter access regions separated by structural material bridges. FIG. 18D provides an access region that has an elongated length which is formed from a plurality of short access regions which have widths that are wider than their lengths wherein the widths may be the same as the width of the passage (or less) and wherein the lengths of the individual access region elements allow for pinch off. FIG. 18E provides a passage and access region that is formed with end caps of structural material which are removed after layer formation either before or after release via laser cutting, dicing, or the like.

FIG. 19 provides an illustration of a manifold 711 which is formed along with a plurality of structures 702-705. The manifold has first ends which are in close proximity to ends of the structure and an opposite end 712. The manifold is formed with an access path which can be sealed like those of the structures 702-705 so that it may be formed with a passageway and then the an etching fluid flowed and directed from the end 712 into structures 702-705 to help remove sacrificial material from the passage in 702-705. In some alternatives, if the passages are at least partially open the manifold may be used draw material into end 702-705 instead of pushing it out. The manifold may be formed with a simpler configuration than what is required in the structures themselves (e.g. with fewer turns, larger passages, etc.) and such manifolds may be used to connected any desired number of structures with passages. In some variations, manifolds may operate on structures in a parallel manner as illustrated herein while in other embodiments some structures may be connected serially so that etchant flowing through one structure ends up moving through one or more other structures. In some embodiments, manifolds may be formed in the same layers as those containing the structures or they may be formed in higher or low layers or may be formed by other processes and then moved into place when passage clean up is to occur.

Numerous variations of the above noted embodiments are possible including combination of the various embodiments used on different layers of single fabrication process or even within a single layer in such a process. In some variations the access region is separated from each end by a distance which is greater than the greater than the passage width or the passage depth. In some variations the access region is separated from each end by a distance which is greater than the sum of the passage width and the passage depth. In some variations, the access region is an elongated slot. In some variations, the access region is a plurality of separated openings, together defining an elongated slot. In some embodiments the access region extends a substantial portion of the passage width, e.g. more than 50%, preferably more than 75%, and even more preferably more than 90%. In some variations the access region extends a substantial portion of the passage length, e.g. more than 50%, preferably more than 75%, and even more preferably more than 90%. In some variations the passage has a length to width ratio which is greater then 10, 50, 100, or even 200. In some variations the passage has length to height ratio that is greater than 10, 50, 100, or even 200. In some variations, the access region has width compared to the height and width of the passage that is capable of being closed by pinch off deposited material (e.g. electrodeposited material) without filling the underlying etched portion of the passage by more than more than 50%, 20%, or even 10%. In some variations, the width of the access region is defined by a single layer of structural material. In some variations, the access region exists on a layer having the narrowest width and on one or more overlying layers having larger widths. In some variations the lengths and widths of individual access regions (when multiple access regions are present) may be differently orientated than the width and the length of the other individual access regions. In some variations the access region may have a uniform width while in others it may not. In some variations, the passage may have a uniform width and height along its length. In some variations, the passage is defined along its length by a narrower bottom width, a wider middle width, and a narrower top width. In some variations the passage height is formed from multiple layers. In some variations the passage height is formed from a single layer. In some variations, the passage is complex has a complex configuration in that traversal of the length of the passage involves a summed change of direction no less than 180 degrees, 270 degrees, or even 360 degrees.

In some variations, the passage includes a plurality of elongated passages each having a passage width wherein the individual passages are separated by chambers of substantially greater width (2 times, 5 times, or even 10 times that of the passage widths. In some variations, etchant flow manifolds direct etchant through a plurality of structures during release etching and are separated from the structure by sufficient etching that removes a thin region of sacrificial material from non contacting structural material that forms the structure and the manifold. In some variations, structure formation includes formation of an etchant flow manifold that directs etchant flow through a plurality of structures during release etching and is separated from the structure by removal of a secondary or tertiary region of sacrificial material from non contacting structural material that forms the structure and the manifold (separation is by, for example, melting, burn out, laser cutting). In some variations, selective etching may occur on more than one level, the etching on different levels be independent or may result in connected flow paths. In some variations, the sealing of access regions may be by a combination of sacrificial material and structural material and selected regions of sacrificial material may be particularly useful when a passage that is etched is going to be connected to a passage to be formed on higher layers. The different embodiments and these numerous variations can be combined in numerous ways to produce embodiments with a variety of attributes and functionalities. Such combinations will be understood by those of skill in the art.

FURTHER COMMENTS AND CONCLUSIONS

Structural or sacrificial dielectric materials may be incorporated into embodiments of the present invention in a variety of different ways. Such materials may form a third material or higher deposited on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003. The first of these filings is U.S. Patent Application No. 60/534,184 which is entitled "Electrochemical Fabrication Methods Incorporating Dielectric Materials and/or Using Dielectric Substrates". The second of these filings is U.S. Patent Application No. 60/533,932, which is entitled "Electrochemical Fabrication Methods Using Dielectric Substrates". The third of these filings is U.S. Patent Application No. 60/534,157, which is entitled "Electrochemical Fabrication Methods Incorporating Dielectric Materials". The fourth of these filings is U.S. Patent Application No. 60/533,891, which is entitled "Methods for Electrochemically Fabricating Structures Incorporating Dielectric Sheets and/or Seed layers That Are Partially Removed Via Planarization". A fifth such filing is U.S. Patent Application No. 60/533,895, which is entitled "Electrochemical Fabrication Method for Producing Multi-layer Three-Dimensional Structures on a Porous Dielectric". Additional patent filings that provide teachings concerning incorporation of dielectrics into the EFAB process include U.S. patent application Ser. No. 11/139,262, filed May 26, 2005 by Lockard, et al., and which is entitled "Methods for Electrochemically Fabricating Structures Using Adhered Masks, Incorporating Dielectric Sheets, and/or Seed Layers that are Partially Removed Via Planarization"; and U.S. patent application Ser. No. 11/029,216, filed Jan. 3, 2005 by Cohen, et al., now abandoned, and which is entitled "Electrochemical Fabrication Methods Incorporating Dielectric Materials and/or Using Dielectric Substrates". These patent filings are each hereby incorporated herein by reference as if set forth in full herein.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full. This application is hereby incorporated herein by reference as if set forth in full.

Some embodiments may incorporate elements taught in conjunction with other medical devices as set forth in various U.S. patent applications filed by the owner of the present application and/or may benefit from combined use with these other medical devices: Some of these alternative devices have been described in the following previously filed patent applications: (1) U.S. patent application Ser. No. 11/478,934, by Cohen et al., and entitled "Electrochemical Fabrication Processes Incorporating Non-Platable Materials and/or Metals that are Difficult to Plate On"; (2) U.S. patent application Ser. No. 11/582,049, by Cohen, and entitled "Discrete or Continuous Tissue Capture Device and Method for Making"; (3) U.S. patent application Ser. No. 11/625,807, by Cohen, and entitled "Microdevices for Tissue Approximation and Retention, Methods for Using, and Methods for Making"; (4) U.S. patent application Ser. No. 11/696,722, by Cohen, and entitled "Biopsy Devices, Methods for Using, and Methods for Making"; (5) U.S. patent application Ser. No. 11/734,273, by Cohen, and entitled "Thrombectomy Devices and Methods for Making"; (6) U.S. Patent Application No. 60/942,200, by Cohen, and entitled "Micro-Umbrella Devices for Use in Medical Applications and Methods for Making Such Devices"; and (7) U.S. patent application Ser. No. 11/444,999, by Cohen, and entitled "Microtools and Methods for Fabricating Such Tools". Each of these applications is incorporated herein by reference as if set forth in full herein.

Though the embodiments explicitly set forth herein have considered multi-material layers to be formed one after another. In some embodiments, it is possible to form structures on a layer-by-layer basis but to deviate from a strict planar layer on planar layer build up process in favor of a process that interlaces material between the layers. Such alternative build processes are disclosed in U.S. application Ser. No. 10/434,519, filed on May 7, 2003, now U.S. Pat. No. 7,252,861, entitled Methods of and Apparatus for Electrochemically Fabricating Structures Via Interlaced Layers or Via Selective Etching and Filling of Voids. The techniques disclosed in this referenced application may be combined with the techniques and alternatives set forth explicitly herein to derive additional alternative embodiments. In particular, the structural features are still defined on a planar-layer-by-planar-layer basis but material associated with some layers are formed along with material for other layers such that interlacing of deposited material occurs. Such interlacing may lead to reduced structural distortion during formation or improved interlayer adhesion. This patent application is herein incorporated by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| U.S. patent application No., Filing Date U.S. application Pub No., Pub Date U.S. Pat. No., Pub Date | Inventor, Title |
|---|---|
| 09/493,496-Jan. 28, 2000 U.S. Pat. No. 6,790,377-Sep. 14, 2004 | Cohen, "Method For Electrochemical Fabrication" |
| 10/677,556-Oct. 1, 2003 2004-0134772-Jul. 15, 2004 | Cohen, "Monolithic Structures Including Alignment and/or Retention Fixtures for Accepting Components" |
| 10/830,262-Apr. 21, 2004 2004-0251142A-Dec. 16, 2004 U.S. Pat. No. 7,198,704-Apr. 3, 2007 | Cohen, "Methods of Reducing Interlayer Discontinuities in Electrochemically Fabricated Three-Dimensional Structures" |
| 10/271,574-Oct. 15, 2002 2003-0127336A-Jul. 10, 2003 U.S. Pat. No. 7,288,178-Oct. 30, 2007 | Cohen, "Methods of and Apparatus for Making High Aspect Ratio Microelectromechanical Structures" |
| 10/697,597-Dec. 20, 2002 2004-0146650A-Jul. 29, 2004 | Lockard, "EFAB Methods and Apparatus Including Spray Metal or Powder Coating Processes" |
| 10/677,498-Oct. 1, 2003 2004-0134788-Jul. 15, 2004 U.S. Pat. No. 7,235,166-Jun. 26, 2007 | Cohen, "Multi-cell Masks and Methods and Apparatus for Using Such Masks To Form Three-Dimensional Structures" |
| 10/724,513-Nov. 26, 2003 2004-0147124-Jul. 29, 2004 U.S. Pat. No. 7,368,044-May 6, 2008 | Cohen, "Non-Conformable Masks and Methods and Apparatus for Forming Three-Dimensional Structures" |
| 10/607,931-Jun. 27, 2003 2004-0140862-Jul. 22, 2004 U.S. Pat. No. 7,239,219-Jul. 3, 2007 | Brown, "Miniature RF and Microwave Components and Methods for Fabricating Such Components" |

-continued

| U.S. patent application No., Filing Date U.S. application Pub No., Pub Date U.S. Pat. No., Pub Date | Inventor, Title |
|---|---|
| 10/841,100-May 7, 2004 2005-0032362-Feb. 10, 2005 U.S. Pat. No. 7,109,118-Sep. 19, 2006 | Cohen, "Electrochemical Fabrication Methods Including Use of Surface Treatments to Reduce Overplating and/or Planarization During Formation of Multi-layer Three-Dimensional Structures" |
| 10/387,958-Mar. 13, 2003 2003-022168A-Dec. 4, 2003 | Cohen, "Electrochemical Fabrication Method and Application for Producing Three-Dimensional Structures Having Improved Surface Finish" |
| 10/434,494-May 7, 2003 2004-0000489A-Jan. 1, 2004 | Zhang, "Methods and Apparatus for Monitoring Deposition Quality During Conformable Contact Mask Plating Operations" |
| 10/434,289-May 7, 2003 20040065555A-Apr. 8, 2004 | Zhang, "Conformable Contact Masking Methods and Apparatus Utilizing In Situ Cathodic Activation of a Substrate" |
| 10/434,294-May 7, 2003 2004-0065550A-Apr. 8, 2004 | Zhang, "Electrochemical Fabrication Methods With Enhanced Post Deposition Processing" |
| 10/434,295-May 7, 2003 2004-0004001A-Jan. 8, 2004 | Cohen, "Method of and Apparatus for Forming Three-Dimensional Structures Integral With Semiconductor Based Circuitry" |
| 10/434,315-May 7, 2003 2003-0234179A-Dec. 25, 2003 U.S. Pat. No. 7,229,542-Jun. 12, 2007 | Bang, "Methods of and Apparatus for Molding Structures Using Sacrificial Metal Patterns" |
| 10/434,103-May 7, 2004 2004-0020782A-Feb. 5, 2004 U.S. Pat. No. 7,160,429-Jan. 9, 2007 | Cohen, "Electrochemically Fabricated Hermetically Sealed Microstructures and Methods of and Apparatus for Producing Such Structures" |
| 10/841,006-May 7, 2004 2005-0067292-May 31, 2005 | Thompson, "Electrochemically Fabricated Structures Having Dielectric or Active Bases and Methods of and Apparatus for Producing Such Structures" |
| 10/434,519-May 7, 2003 2004-0007470A-Jan. 15, 2004 U.S. Pat. No. 7,252,861-Aug. 7, 2007 | Smalley, "Methods of and Apparatus for Electrochemically Fabricating Structures Via Interlaced Layers or Via Selective Etching and Filling of Voids" |
| 10/724,515-Nov. 26, 2003 2004-0182716-Sep. 23, 2004 U.S. Pat. No. 7,291,254-Nov. 6, 2007 | Cohen, "Method for Electrochemically Forming Structures Including Non-Parallel Mating of Contact Masks and Substrates" |
| 10/841,347-May 7, 2004 2005-0072681-Apr. 7, 2005 | Cohen, "Multi-step Release Method for Electrochemically Fabricated Structures" |
| 60/533,947-Dec. 31, 2003 | Kumar, "Probe Arrays and Method for Making" |
| 60/534,183-Dec. 31, 2003 | Cohen, "Method and Apparatus for Maintaining Parallelism of Layers and/or Achieving Desired Thicknesses of Layers During the Electrochemical Fabrication of Structures" |
| 11/733,195-Apr. 9, 2007 2008-0050524-Feb. 28, 2008 | Kumar, "Methods of Forming Three-Dimensional Structures Having Reduced Stress and/or Curvature" |
| 11/506,586-Aug. 8, 2006 2007-0039828-Feb. 22, 2007 | Cohen, "Mesoscale and Microscale Device Fabrication Methods Using Split Structures and Alignment Elements" |
| 10/949,744-Sep. 24, 2004 2005-0126916-Jun. 16, 2005 U.S. Pat. No. 7,498,714-Mar. 3, 2009 | Lockard, "Three-Dimensional Structures Having Feature Sizes Smaller Than a Minimum Feature Size and Methods for Fabricating" |

Though various portions of this specification have been provided with headers, it is not intended that the headers be used to limit the application of teachings found in one portion of the specification from applying to other portions of the specification. For example, it should be understood that alternatives acknowledged in association with one embodiment, are intended to apply to all embodiments to the extent that the features of the different embodiments make such application functional and do not otherwise contradict or remove all benefits of the adopted embodiment. Various other embodiments of the present invention exist. Some of these embodiments may be based on a combination of the teachings herein with various teachings incorporated herein by reference.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

We claim:

1. In a method for fabricating a multi-layer three-dimensional structure, comprising: (a) forming a first layer on a substrate comprising deposition of at least one sacrificial material and deposition of at least one structural material wherein the deposited sacrificial material and the deposited structural material are planarized to have a common height to set a boundary level for the first layer; (b) forming additional layers adjacent to and adhered to previously formed layers, wherein the formation of each additional layer comprises deposition of at least one sacrificial material and deposition of at least one structural material and wherein the sacrificial material and the structural material for each additional layer are planarized to have a common height to set a boundary level for each additional layer; and (c) after formation of the additional layers, etching at least one sacrificial material from a plurality of layers to release the three-dimensional structure from the sacrificial material, the improvement comprising:

a. forming the structure to comprise an elongated passage having structural material forming a bottom, sidewalls and an elongated upper access region defined by at least one opening through the structural material, and then i. selectively removing a sacrificial material from of an interior of multiple layers of the elongated passage to form an at least partially cleared passage,
ii. depositing a secondary sacrificial material in the at least partially cleared passage,
iii. planarizing the secondary sacrificial material, and thereafter
b. during formation of at least one of additional layer depositing a structural material to seal the access region.

2. In a method for fabricating a multi-layer three-dimensional structure, comprising: (a) forming a first layer on a substrate comprising deposition of at least one sacrificial material and deposition of at least one structural material wherein the deposited sacrificial material and the deposited structural material are planarized to have a common height to set a boundary level for the first layer; (b) forming additional layers adjacent to and adhered to previously formed layers, wherein the formation of each additional layer comprises deposition of at least one sacrificial material and deposition of at least one structural material and wherein the sacrificial material and the structural material for each additional layer are planarized to have a common height to set a boundary level for each additional layer; and (c) after formation of the additional layers, etching at least one sacrificial material from a plurality of layers to release the three-dimensional structure from the sacrificial material, the improvement comprising:

during the process of step (b), forming the structure to have an elongated passage having a passage length, a passage height, and a passage width and being at least partially free of solidified material along a portion of the passage height and passage width along a portion of the passage length prior to the etching of step (c).

3. In a method for fabricating a multi-layer three-dimensional structure, comprising: (a) forming a first layer on a substrate comprising deposition of at least one sacrificial material and deposition of at least one structural material wherein the deposited sacrificial material and the deposited structural material are planarized to have a common height to set a boundary level for the first layer; (b) forming additional layers adjacent to and adhered to previously formed layers, wherein the formation of each additional layer comprises deposition of at least one sacrificial material and deposition of at least one structural material and wherein the sacrificial material and the structural material for each additional layer are planarized to have a common height to set a boundary level for each additional layer; and (c) after formation of the additional layers, etching at least one sacrificial material from a plurality of layers to release the three-dimensional structure from the sacrificial material, the improvement comprising:

partially forming the structure to comprise an elongated passage defined by structural material forming a bottom, sidewalls and an elongated upper access region defined by at least one opening through the structural material, wherein the at least one opening of the access region is defined by a width which relative to the access region as a whole, relative to a passage height, and relative to the passage width allows the at least one opening after, an etching step, to be closed by localized build up of deposited material without completely filling an at least partially cleared elongated passage with newly deposited solidified material, then i. selectively removing a sacrificial material from multiple layers from an interior of the elongated passage to form an at least partially cleared passage, ii. depositing sacrificial material to close the at least one opening of the access region while not completely refilling the at least partially cleared passage with solidified material
iii. planarizing structural material and the sacrificial material closing the at least one opening of the access region; and
iv. during formation of a subsequent layer, depositing a structural material to provide a structural material seal of the at least one closed opening of the access region.

4. The method of claim 3 wherein the passage has features selected from the group consisting of:
i. the passage width and height are substantially uniform along the length of the passage
ii. the passage width varies along at least a portion of the length of the passage;
iii. the passage height varies along at least a portion of the length of the passage;
iv. the passage height is formed from a single layer of deposited structural material;
v. the passage height is formed from multiple layers of deposited structural material;
vi. the passage length is formed from a plurality of shorter passage lengths joined by cavities of greater width than nominal widths of the shorter passage lengths;
vii. the passage length is formed from a plurality of shorter passage lengths joined by cavities of greater height than nominal heights of the shorter passage lengths;
viii. the passage length is oriented in a plane parallel to planes of a plurality of layers from which the passage is formed;
ix. the passage length is oriented in a plane that is not parallel to planes of a plurality of layers from which the passage is formed;
x. the passage length defines a path involving a summed change of direction no less than 90 degrees;
xi. the passage length defines a path involving a summed change of direction no less than 180 degrees;
xii. the passage length defines a path involving a summed change of direction no less than 270 degrees;
xiii. the passage length defines a path involving a summed change of direction no less than 360 degrees;
xiv. the passage length defines a path involving a summed change of direction no less than 720 degrees;
xv. a passage length to passage width ratio greater than 20;
xvi. a passage length to passage width ratio greater than 50;
xvii. a passage length to passage width ratio greater than 100;
xviii. a passage length to passage height ratio greater than 20;
xix. a passage length to passage height ratio greater than 50;
xx. a passage length to passage height ratio greater than 100;
xxi. the passage width is less than 200 microns and the passage height is less than 200 microns;
xxii. the passage width is less than 100 microns and the passage height is less than 100 microns;
xxiii. the passage width is less than 50 microns and the passage height is less than 50 microns;
xxiv. the passage length is greater than 5 millimeters;
xxv. the passage length is greater than 10 millimeters;
xxvi. the passage length is greater than 20 millimeters;
xxvii. a configuration that is rectangular in cross-section relative to a local longitudinal length of the passage;
xxviii. a configuration that is square in cross-section relative to a local longitudinal length of the passage;

xxix. a configuration that is substantially circular in cross-section relative to the local longitudinal length of the passage;
xxx. a configuration that is substantially an oval in cross-section relative to the local longitudinal length of the passage;
xxxi. a configuration that is a stair-stepped circle in cross-section relative to the local longitudinal length of the passage and wherein the passage width is the maximum lateral extent of the circle and wherein the passage height is the maximum vertical extent of the circle;
xxxii. a configuration that is substantially a diamond in cross-section relative to the local longitudinal length of the passage;
xxxiii. a configuration that is a stair-stepped diamond in cross-section relative to the local longitudinal length of the passage and wherein the passage width is the maximum lateral extent of the diamond and wherein the passage height is the maximum vertical extent of the diamond;
xxxiv. a configuration that is substantially a triangle in cross-section relative to the local longitudinal length of the passage;
xxxv. a configuration that is a stair-stepped triangle in cross-section relative to the local longitudinal length of the passage and wherein the passage width is the maximum lateral extent of the triangle and wherein the passage height is the maximum vertical extent of the triangle;
xxxvi. the passage length is bounded by at least one horizontal facing end;
xxxvii. the passage length is bounded by at least two horizontal facing end;
xxxviii. the passage length is bounded by at least one vertical facing end;
xxxix. the passage length is bounded by at least two vertical facing ends; and
xl. the passage length extends along a single path which branches into at least two paths for a portion of the passage length.

5. The process of claim 3 wherein the deposition of the at least one sacrificial material and the at least one structural material of at least a portion of the additional layers comprises a process selected from the group of processes consisting of:
   i. selectively electrodepositing a structural material followed by blanket electrodepositing a sacrificial material;
   ii. selectively electrodepositing a sacrificial material followed by blanket electrodepositing a structural material;
   iii. selectively electrodepositing a structural material and selectively electrodepositing a sacrificial material;
   iv. blanket depositing a sacrificial material, selectively etching into the sacrificial material to form at least at least one opening, and thereafter depositing a structural material;
   v. blanket depositing a structural material, selectively etching into the structural material to form at least one opening, and thereafter depositing a sacrificial material;
   vi. depositing a first structural material, depositing a second structural material, and thereafter depositing a first sacrificial material
   vii. depositing a first sacrificial material, depositing a second sacrificial material, and thereafter depositing a structural material
   viii. depositing a structural material and depositing a sacrificial material wherein at least one of materials is deposited by an electrodeposition process;
   ix. depositing a structural material and depositing a sacrificial material wherein the depositing of at least one of the materials comprises an electrodeposition process;
   x. depositing a structural material and depositing a sacrificial material wherein the depositing of at least one of the materials comprises an electroless deposition process;
   xi. depositing a structural material and depositing a sacrificial material wherein the depositing of at least one of the materials comprises a chemical vapor deposition process;
   xii. depositing a structural material and depositing a sacrificial material wherein the depositing of at least one of the materials comprises a physical vapor deposition process;
   xiii. depositing a structural material and depositing a sacrificial material wherein at least one of the materials comprises a dielectric;
   xiv. depositing a structural material and a sacrificial material wherein at least one of materials is deposited into openings made in a previously formed layer to simultaneously form part of a current layer and part of a previous layer.

6. The method of claim 5 wherein the selective removing of the sacrificial material from the elongated passage comprises removing a metal.

7. The method of claim 5 wherein the selective removing of the sacrificial material from the elongated passage comprising an etching of the sacrificial material.

8. The method of claim 5 wherein after partial formation of the layers, the passage comprises an upper access region.

9. The method of claim 8 wherein the upper access region possesses at least one property selected from the group consisting of:
   i. a width that is less than a local passage width;
   ii. a width that is less than a local passage width and located over the local center of the passage width along at least a portion of a passage length;
   iii. A width that is less than a local passage width and located away from the local center of the passage width along at least a portion of a passage length;
   iv. a width that is less than a local passage height as measured from the bottom of a local floor of the passage to a bottom of a layer than defines the width of the access region;
   v. a width that is less than a passage height and located over the local center of a passage width along at least a portion of a passage length;
   vi. a width that is less than a passage height and located away from a local center of a passage width along at least a portion of a passage length;
   vii. a width that is less than a local passage width and a local passage height as measured from the bottom of a local floor of the passage to a bottom of a layer than defines the width of the access region;
   viii. a width that is less than a passage width and a passage height and located over the local center of a passage width along at least a portion of a passage length;
   ix. a width that is less than a passage width and a passage height and located away from a local center of a passage width along at least a portion of a passage length;
   x. a width less than 40 microns;
   xi. a width less than 30 microns;
   xii. a width less than 20 microns;
   xiii. a width that is less than $2/3$ a local passage width;
   xiv. a width that is less than $1/2$ a local passage width;
   xv. a width that is less than $1/3$ a local passage width;
   xvi. a width that is less than $2/3$ a local passage height;

xvii. a width that is less than ½ a local passage height;
xviii. a width that is less than ⅓ a local passage height;
xix. an end that is spaced from a passage end by greater than a passage width;
xx. an end that is spaced from a passage end by greater than twice a passage width;
xxi. an end that is spaced from a passage end by greater than a passage height;
xxii. an end that is spaced from a passage end by greater than twice a passage height;
xxiii. an end that is spaced from a passage end by greater than a sum of a passage width and a passage height;
xxiv. an end that is spaced from a passage end by greater than twice a sum of a passage width and a passage height;
xxv. each end being spaced from a passage end by greater than a passage width;
xxvi. each end being spaced from a passage end by greater than twice a passage width;
xxvii. each end being spaced from a passage end by greater than a passage height;
xxviii. each end being spaced from a passage end by greater than twice a passage height;
xxix. each end being from a passage end by greater than a sum of a passage width and a passage height;
xxx. an end that is spaced from a passage end by greater than twice a sum of a passage width and a passage height;
xxxi. an elongated slot extending more than 50% of a passage length
xxxii. an elongated slot extending more than 70% of a passage length
xxxiii. an elongated slot extending more than 70% of a passage length
xxxiv. a plurality of elongated slots extending in parallel
xxxv. a plurality of openings spaced from one another along a length of a passage length such that the plurality of openings are located over more than 50% of a passage length
xxxvi. a plurality of openings spaced from one another along a length of a passage length such that the plurality of openings are located over more than 70% of a passage length
xxxvii. a plurality of openings spaced from one another along a length of a passage length such that the plurality of openings are located over more than 70% of a passage length
xxxviii. a plurality of openings each having an opening width and an opening length wherein the length is less than a local passage width
xxxix. a plurality of openings each having an opening width and an opening length wherein the length is less than ⅔ a local passage width
xl. a plurality of openings each having an opening width and an opening length wherein the length is less than ½ a local passage width
xli. a plurality of openings each having an opening width and an opening length wherein the length is less than ⅓ a local passage width
xlii. an opening width that can be closed via pinch off of an electrodeposited material without completely filling a passage width and passage height;
xliii. an opening width that can be closed via pinch off of an electrodeposited material without filling more than ⅔ of a passage width and passage height;
xliv. an opening width that can be closed via pinch off of an electrodeposited material without filling more than ½ of a passage width and passage height;
xlv. an opening width that can be closed via pinch off of an electrodeposited material without filling more than ⅓ of a passage width and passage height;
xlvi. an opening width that can be closed via pinch off of an electrodeposited material without filling more than ⅕ of a passage width and passage height;
xlvii. an opening width that can be closed via pinch off of an electrodeposited material without filling more than 1/10 of a passage width and passage height;
xlviii. an opening width that can be closed via pinch off of an electrodeposited material without filling the underlying etched portion of the passage by more than more than 75%;
xlix. an opening width that can be closed via pinch off of an electrodeposited material without filling the underlying etched portion of the passage by more than more than 50%;
l. an opening width that can be closed via pinch off of an electrodeposited material without filling the underlying etched portion of the passage by more than more than 25%;
li. an opening width that can be closed via pinch off of an electrodeposited material without filling the underlying etched portion of the passage by more than more than 10%;
lii. an opening width that is oriented in a direction that is not parallel to a local passage width;
liii. a plurality of separated openings, together defining an elongated slot;
liv. an opening length that can be closed via pinch off of an electrodeposited material without completely filling a passage width and passage height;
lv. an opening length that can be closed via pinch off of an electrodeposited material without filling more than ⅔ of a passage width and passage height;
lvi. an opening length that can be closed via pinch off of an electrodeposited material without filling more than ½ of a passage width and passage height;
lvii. an opening length that can be closed via pinch off of an electrodeposited material without filling more than ⅓ of a passage width and passage height;
lviii. an opening length that can be closed via pinch off of an electrodeposited material without filling more than ⅕ of a passage width and passage height;
lix. an opening length that can be closed via pinch off of an electrodeposited material without filling more than 1/10 of a passage width and passage height;
lx. an opening length that can be closed via pinch off of an electrodeposited material without filling the underlying etched portion of the passage by more than more than 75%;
lxi. an opening length that can be closed via pinch off of an electrodeposited material without filling the underlying etched portion of the passage by more than more than 50%;
lxii. an opening length that can be closed via pinch off of an electrodeposited material without filling the underlying etched portion of the passage by more than more than 25%;
lxiii. an opening length that can be closed via pinch off of an electrodeposited material without filling the underlying etched portion of the passage by more than more than 10%;

lxiv. a width that is defined by a single layer of structural material.

lxv. a lowest layer having a width and at least one more higher layers providing wider widths.

lxvi. the access region is divided into a plurality of access regions located on different layers wherein selective etching and sealing occurs a plurality of times during the layer-by-layer fabrication of the structure;

lxvii. the access region is divided into a plurality of access regions located on different layers and wherein selective etching and sealing occurs a plurality of times during the layer-by-layer fabrication of the structure and wherein the selective etching of at least two of the plurality of times provides a multi-level connected passage.

10. The method of claim 5 wherein at least one end of the passage is sealed with structural material that is removed from the passage using a process selected from the group consisting of: (1) dicing prior to release; (2) dicing after external passage release; (3) laser ablation prior to release; and (4) laser ablation prior to external passage release.

11. The method of claim 5 wherein the structure comprises a plurality of structures and wherein the process provides a manifold formed from a structural material for connecting a plurality of passages of the plurality of structures and is used during release to help remove remaining sacrificial material from the passages and is then separated from the structures by a process selected from the group consisting of: (a) dicing, (b) laser cutting; and (c) etching that removes a thin region of a sacrificial material from non contacting structural material that forms the structures and the manifold.

12. The method of claim 5 wherein the selectively removing of sacrificial material occurs via a mask that not only inhibits etching from regions outside the access region but also from at least one selective region within the access region.

13. In a method for fabricating a multi-layer three-dimensional structure, comprising: (a) forming a first layer on a substrate comprising deposition of at least one sacrificial material and deposition of at least one structural material wherein the deposited sacrificial material and the deposited structural material are planarized to have a common height to set a boundary level for the first layer; (b) forming additional layers adjacent to and adhered to previously formed layers, wherein the formation of each additional layer comprises deposition of at least one sacrificial material and deposition of at least one structural material and wherein the sacrificial material and the structural material for each additional layer are planarized to have a common height to set a boundary level for each additional layer; and (c) after formation of the additional layers, etching at least one sacrificial material from a plurality of layers to release the three-dimensional structure from the sacrificial material, the improvement comprising:

partially forming the structure to comprise an elongated passage defined by structural material forming a bottom, sidewalls and an elongated upper access region defined by at least one opening through the structural material, wherein the at least one opening of the access region is defined by a width which relative to the access region as a whole, relative to a passage height, and relative to a passage width allows the at least one opening, after an etching step, to be closed by localized build up of deposited material without completely filling an at least partially cleared elongated passage, and then i. selectively removing a sacrificial material from multiple layers from an interior of the elongated passage to form an at least partially cleared passage;

ii. depositing structural material to close the at least one opening of the access region while not completely refilling the at least partially cleared passage with solidified material; and iii. planarizing the structural material deposited to close the at least one opening of access region.

14. The method of claim 13 wherein the passage has features selected from the group consisting of:

i. the passage width and height are substantially uniform along the length of the passage ii. the passage width varies along at least a portion of the length of the passage;

iii. the passage height varies along at least a portion of the length of the passage;

iv. the passage height is formed from a single layer of deposited structural material;

v. the passage height is formed from multiple layers of deposited structural material;

vi. the passage length is formed from a plurality of shorter passage lengths joined by cavities of greater width than nominal widths of the shorter passage lengths;

vii. the passage length is formed from a plurality of shorter passage lengths joined by cavities of greater height than nominal heights of the shorter passage lengths;

viii. the passage length is oriented in a plane parallel to planes of a plurality of layers from which the passage is formed;

ix. the passage length is oriented in a plane that is not parallel to planes of a plurality of layers from which the passage is formed;

x. the passage length defines a path involving a summed change of direction no less than 90 degrees;

xi. the passage length defines a path involving a summed change of direction no less than 180 degrees;

xii. the passage length defines a path involving a summed change of direction no less than 270 degrees;

xiii. the passage length defines a path involving a summed change of direction no less than 360 degrees;

xiv. the passage length defines a path involving a summed change of direction no less than 720 degrees;

xv. a passage length to passage width ratio greater than 20;

xvi. a passage length to passage width ratio greater than 50;

xvii. a passage length to passage width ratio greater than 100;

xviii. a passage length to passage height ratio greater than 20;

xix. a passage length to passage height ratio greater than 50;

xx. a passage length to passage height ratio greater than 100;

xxi. the passage width is less than 200 microns and the passage height is less than 200 microns;

xxii. the passage width is less than 100 microns and the passage height is less than 100 microns;

xxiii. the passage width is less than 50 microns and the passage height is less than 50 microns;

xxiv. the passage length is greater than 5 millimeters;

xxv. the passage length is greater than 10 millimeters;

xxvi. the passage length is greater than 20 millimeters;

xxvii. a configuration that is rectangular in cross-section relative to a local longitudinal length of the passage;

xxviii. a configuration that is square in cross-section relative to a local longitudinal length of the passage;

xxix. a configuration that is substantially circular in cross-section relative to the local longitudinal length of the passage;

xxx. a configuration that is substantially an oval in cross-section relative to the local longitudinal length of the passage;

xxxi. a configuration that is a stair-stepped circle in cross-section relative to the local longitudinal length of the passage and wherein the passage width is the maximum lateral extent of the circle and wherein the passage height is the maximum vertical extent of the circle;

xxxii. a configuration that is substantially a diamond in cross-section relative to the local longitudinal length of the passage;

xxxiii. a configuration that is a stair-stepped diamond in cross-section relative to the local longitudinal length of the passage and wherein the passage width is the maximum lateral extent of the diamond and wherein the passage height is the maximum vertical extent of the diamond;

xxxiv. a configuration that is substantially a triangle in cross-section relative to the local longitudinal length of the passage;

xxxv. a configuration that is a stair-stepped triangle in cross-section relative to the local longitudinal length of the passage and wherein the passage width is the maximum lateral extent of the triangle and wherein the passage height is the maximum vertical extent of the triangle;

xxxvi. the passage length is bounded by at least one horizontal facing end;

xxxvii. the passage length is bounded by at least two horizontal facing end;

xxxviii. the passage length is bounded by at least one vertical facing end;

xxxix. the passage length is bounded by at least two vertical facing ends; and the passage length extends along a single path which branches into at least two paths for a portion of the passage length.

15. The method of claim 13 wherein the structure comprises a plurality of structures and wherein the process provides a manifold formed from a structural material for connecting a plurality of passages of the plurality of structures and is used during release to help remove remaining sacrificial material from the passages and is then separated from the structures by a process selected from the group consisting of: (a) dicing, (b) laser cutting; and (c) etching that removes a thin region of a sacrificial material from non contacting structural material that forms the structures and the manifold.

16. The method of claim 13 wherein the selectively removing of sacrificial material occurs via a mask that not only inhibits etching from regions outside the access region but also from at least one selected region within the access region and during formation of a subsequent layer, structural material is deposited over the at least one selected region to ensure the at least one selected region is sealed.

17. The process of claim 13 wherein the deposition of the at least one sacrificial material and the at least one structural material of at least a portion of the additional layers comprises a process selected from the group of processes consisting of:

i. selectively electrodepositing a structural material followed by blanket electrodepositing a sacrificial material;

ii. selectively electrodepositing a sacrificial material followed by blanket electrodepositing a structural material;

iii. selectively electrodepositing a structural material and selectively electrodepositing a sacrificial material;

iv. blanket depositing a sacrificial material, selectively etching into the sacrificial material to form at least at least one opening, and thereafter depositing a structural material;

v. blanket depositing a structural material, selectively etching into the structural material to form at least one opening, and thereafter depositing a sacrificial material;

vi. depositing a first structural material, depositing a second structural material, and thereafter depositing a first sacrificial material vii. depositing a first sacrificial material, depositing a second sacrificial material, and thereafter depositing a structural material viii. depositing a structural material and depositing a sacrificial material wherein at least one of materials is deposited by an electrodeposition process;

ix. depositing a structural material and depositing a sacrificial material wherein the depositing of at least one of the materials comprises an electrodeposition process;

x. depositing a structural material and depositing a sacrificial material wherein the depositing of at least one of the materials comprises an electroless deposition process;

xi. depositing a structural material and depositing a sacrificial material wherein the depositing of at least one of the materials comprises a chemical vapor deposition process;

xii. depositing a structural material and depositing a sacrificial material wherein the depositing of at least one of the materials comprises a physical vapor deposition process;

xiii. depositing a structural material and depositing a sacrificial material wherein at least one of the materials comprises a dielectric;

xiv. depositing a structural material and a sacrificial material wherein at least one of materials is deposited into openings made in a previously formed layer to simultaneously form part of a current layer and part of a previous layer.

18. The method of claim 17 wherein the selective removing of the sacrificial material from the elongated passage comprises removing a metal.

19. The method of claim 17 wherein the selective removing of the sacrificial material from the elongated passage comprising an etching of the sacrificial material.

20. The method of claim 17 wherein after partial formation of the layers, the passage comprises an upper access region.

21. The method of claim 20 wherein the upper access region possesses at least one property selected from the group consisting of:

i. a width that is less than a local passage width;

ii. a width that is less than a local passage width and located over the local center of the passage width along at least a portion of a passage length;

iii. A width that is less than a local passage width and located away from the local center of the passage width along at least a portion of a passage length;

iv. a width that is less than a local passage height as measured from the bottom of a local floor of the passage to a bottom of a layer than defines the width of the access region;

v. a width that is less than a passage height and located over the local center of a passage width along at least a portion of a passage length;

vi. a width that is less than a passage height and located away from a local center of a passage width along at least a portion of a passage length;

vii. a width that is less than a local passage width and a local passage height as measured from the bottom of a local floor of the passage to a bottom of a layer than defines the width of the access region;
viii. a width that is less than a passage width and a passage height and located over the local center of a passage width along at least a portion of a passage length;
ix. a width that is less than a passage width and a passage height and located away from a local center of a passage width along at least a portion of a passage length,
x. a width less than 40 microns;
xi. a width less than 30 microns;
xii. a width less than 20 microns;
xiii. a width that is less than ⅔ a local passage width;
xiv. a width that is less than ½ a local passage width;
xv. a width that is less than ⅓ a local passage width;
xvi. a width that is less than ⅔ a local passage height;
xvii. a width that is less than ½ a local passage height;
xviii. a width that is less than ⅓ a local passage height;
xix. an end that is spaced from a passage end by greater than a passage width;
xx. an end that is spaced from a passage end by greater than twice a passage width;
xxi. an end that is spaced from a passage end by greater than a passage height;
xxii. an end that is spaced from a passage end by greater than twice a passage height;
xxiii. an end that is spaced from a passage end by greater than a sum of a passage width and a passage height;
xxiv. an end that is spaced from a passage end by greater than twice a sum of a passage width and a passage height;
xxv. each end being spaced from a passage end by greater than a passage width;
xxvi. each end being spaced from a passage end by greater than twice a passage width;
xxvii. each end being spaced from a passage end by greater than a passage height;
xxviii. each end being spaced from a passage end by greater than twice a passage height;
xxix. each end being from a passage end by greater than a sum of a passage width and a passage height;
xxx. an end that is spaced from a passage end by greater than twice a sum of a passage width and a passage height;
xxxi. an elongated slot extending more than 50% of a passage length
xxxii. an elongated slot extending more than 70% of a passage length
xxxiii. an elongated slot extending more than 70% of a passage length
xxxiv. a plurality of elongated slots extending in parallel
xxxv. a plurality of openings spaced from one another along a length of a passage length such that the plurality of openings are located over more than 50% of a passage length
xxxvi. a plurality of openings spaced from one another along a length of a passage length such that the plurality of openings are located over more than 70% of a passage length
xxxvii. a plurality of openings spaced from one another along a length of a passage length such that the plurality of openings are located over more than 70% of a passage length
xxxviii. a plurality of openings each having an opening width and an opening length wherein the length is less than a local passage width
xxxix. a plurality of openings each having an opening width and an opening length wherein the length is less than ⅔ a local passage width
xl. a plurality of openings each having an opening width and an opening length wherein the length is less than ½ a local passage width
xli. a plurality of openings each having an opening width and an opening length wherein the length is less than ⅓ a local passage width
xlii. an opening width that can be closed via pinch off of an electrodeposited material without completely filling a passage width and passage height;
xliii. an opening width that can be closed via pinch off of an electrodeposited material without filling more than ⅔ of a passage width and passage height;
xliv. an opening width that can be closed via pinch off of an electrodeposited material without filling more than ½ of a passage width and passage height;
xlv. an opening width that can be closed via pinch off of an electrodeposited material without filling more than ⅓ of a passage width and passage height;
xlvi. an opening width that can be closed via pinch off of an electrodeposited material without filling more than ⅕ of a passage width and passage height;
xlvii. an opening width that can be closed via pinch off of an electrodeposited material without filling more than 1/10 of a passage width and passage height;
xlviii. an opening width that can be closed via pinch off of an electrodeposited material without filling the underlying etched portion of the passage by more than more than 75%;
xlix. an opening width that can be closed via pinch off of an electrodeposited material without filling the underlying etched portion of the passage by more than more than 50%;
l. an opening width that can be closed via pinch off of an electrodeposited material without filling the underlying etched portion of the passage by more than more than 25%;
li. an opening width that can be closed via pinch off of an electrodeposited material without filling the underlying etched portion of the passage by more than more than 10%;
lii. an opening width that is oriented in a direction that is not parallel to a local passage width;
liii. a plurality of separated openings, together defining an elongated slot;
liv. an opening length that can be closed via pinch off of an electrodeposited material without completely filling a passage width and passage height;
lv. an opening length that can be closed via pinch off of an electrodeposited material without filling more than ⅔ of a passage width and passage height;
lvi. an opening length that can be closed via pinch off of an electrodeposited material without filling more than ½ of a passage width and passage height;
lvii. an opening length that can be closed via pinch off of an electrodeposited material without filling more than ⅓ of a passage width and passage height;
lviii. an opening length that can be closed via pinch off of an electrodeposited material without filling more than ⅕ of a passage width and passage height;
lix. an opening length that can be closed via pinch off of an electrodeposited material without filling more than 1/10 of a passage width and passage height;

lx. an opening length that can be closed via pinch off of an electrodeposited material without filling the underlying etched portion of the passage by more than more than 75%;
lxi. an opening length that can be closed via pinch off of an electrodeposited material without filling the underlying etched portion of the passage by more than more than 50%;
lxii. an opening length that can be closed via pinch off of an electrodeposited material without filling the underlying etched portion of the passage by more than more than 25%;
lxiii. an opening length that can be closed via pinch off of an electrodeposited material without filling the underlying etched portion of the passage by more than more than 10%;
lxiv. a width that is defined by a single layer of structural material.
lxv. a lowest layer having a width and at least one more higher layers providing wider widths;
lxvi. divided into a plurality of access regions located on different layers wherein selective etching and sealing occurs a plurality of times during the layer-by-layer fabrication of the structure;
divided into a plurality of access regions located on different layers and wherein selective etching and sealing occurs a plurality of times during the layer-by-layer fabrication of the structure and wherein the selective etching of at least two of the plurality of times provides a multi-level connected passage.

22. The method of claim 17 wherein at least one end of the passage is sealed with structural material that is removed from the passage using a process selected from the group consisting of: (1) dicing prior to release; (2) dicing after external passage release; (3) laser ablation prior to release; and (4) laser ablation prior to external passage release.

* * * * *